(12) United States Patent
Fukami et al.

(10) Patent No.: US 11,287,709 B2
(45) Date of Patent: Mar. 29, 2022

(54) ACTIVE MATRIX SUBSTRATE AND LIQUID CRYSTAL DISPLAY DEVICE

(71) Applicant: Panasonic Liquid Crystal Display Co., Ltd., Himeji (JP)

(72) Inventors: Tetsuo Fukami, Hyogo (JP); Kenichirou Nishida, Hyogo (JP); Ryuuta Watanabe, Hyogo (JP); Masahiro Ishii, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

(21) Appl. No.: 16/783,848

(22) Filed: Feb. 6, 2020

(65) Prior Publication Data

US 2020/0278587 A1  Sep. 3, 2020

(30) Foreign Application Priority Data

Feb. 28, 2019 (JP) .............................. JP2019-036038
Mar. 28, 2019 (JP) .............................. JP2019-062863

(51) Int. Cl.
    *G02F 1/1362* (2006.01)
    *H01L 27/12* (2006.01)
    *G06F 3/041* (2006.01)

(52) U.S. Cl.
    CPC .................. *G02F 1/136286* (2013.01); *G02F 1/136227* (2013.01); *G02F 1/136277* (2013.01); *G06F 3/0412* (2013.01); *H01L 27/124* (2013.01); *G02F 1/13629* (2021.01)

(58) Field of Classification Search
    None
    See application file for complete search history.

(56) References Cited

U.S. PATENT DOCUMENTS

| 2019/0196638 A1 | 6/2019 | Tominaga et al. |
| 2019/0258105 A1 | 8/2019 | Hara et al. |

FOREIGN PATENT DOCUMENTS

| WO | 2017/213173 | 12/2017 |
| WO | 2017/213180 | 12/2017 |

*Primary Examiner* — Richard H Kim
(74) *Attorney, Agent, or Firm* — Hamre, Schumann, Mueller & Larson, P.C.

(57) ABSTRACT

An active matrix substrate includes: a signal line provided in an image display region; and a terminal provided in a frame region and electrically connected to the signal line. The terminal includes: a metal layer; a first contact layer located closer to one side in a lamination direction than the metal layer, and electrically connected to the metal layer, a first interlayer insulating layer located closer to the one side in the lamination direction than the first contact layer; and a second contact layer located closer to the one side in the lamination direction than the first interlayer insulating layer, and electrically connected to the first contact layer through a first through-hole formed in the first interlayer insulating layer. The first contact layer is made of a transparent metal oxide or a semiconductor material doped with impurities.

17 Claims, 33 Drawing Sheets

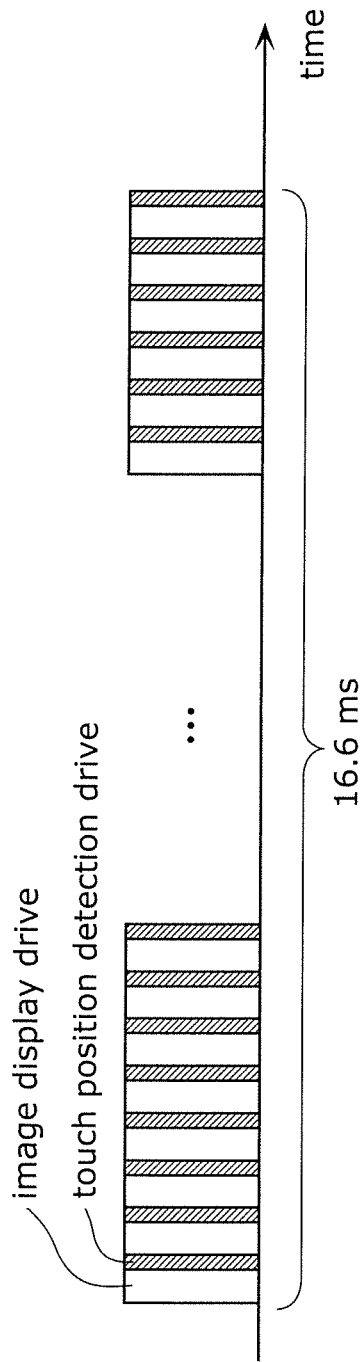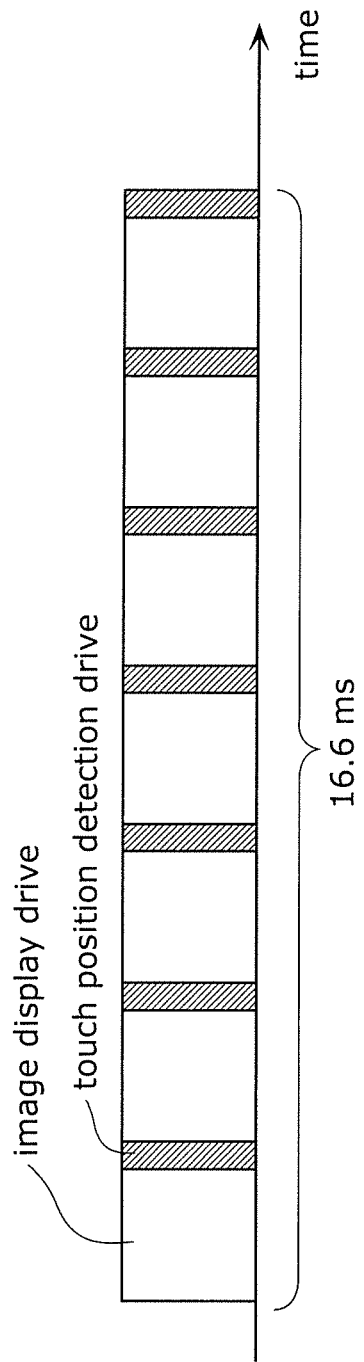

ACTIVE MATRIX SUBSTRATE AND LIQUID CRYSTAL DISPLAY DEVICE

CROSS-REFERENCE TO RELATED APPLICATION

This application claims priority from Japanese application JP 2019-036038, filed on Feb. 28, 2019 and Japanese application JP 2019-062863, filed on Mar. 28, 2019. These Japanese applications are incorporated herein by reference.

BACKGROUND

The present disclosure relates to an active matrix substrate, a liquid crystal display device, and an in-cell touch panel.

A display device such as a liquid crystal display device or an organic electro luminescence (EL) display device includes a thin film transistor substrate (hereinafter referred to as the "TFT substrate") provided with a thin film transistor (TFT).

In particular, in an active-matrix-drive display device, an active matrix substrate where a TFT is provided for each pixel in an image display region is used as the TFT substrate. For example, the active-matrix-drive liquid crystal display device is provided with a TFT substrate being an active matrix substrate, a counter substrate facing the TFT substrate, and a liquid crystal layer disposed between the TFT substrate and the counter substrate.

In the image display region of the TFT substrate, other than the TFT, a gate line and a data line are provided as signal lines. Further, a gate driver that supplies a gate signal to the gate line and a source driver that supplies a video signal to the data line are mounted on the TFT substrate.

Examples of a method for mounting the gate driver and the source driver include a chip on film (COF) method in which a tape carrier package (TCP) having the gate driver and source driver mounted on a flexible wiring board is connected to the frame region of the TFT substrate, and a chip on glass (COG) method in which the gate driver and the source driver are directly mounted on the TFT substrate. For this reason, the frame region of the TFT substrate is provided with a gate terminal electrically connected to the gate driver and a source terminal connected to the source driver. The gate terminal connected to the gate driver is electrically connected to a gate line provided in the image display region. Similarly, the source terminal connected to the source driver is electrically connected to a data line provided in the image display region.

In recent years, in-cell liquid crystal display devices (in-cell touch panels) having a touch function as well as a display function have been developed. In the image display region of the in-cell touch panel, a touch line for detecting a touch position is provided as a signal line in addition to the gate line and the data line. For this reason, a touch terminal electrically connected to the touch line is also provided in the terminal portion of the frame region in the TFT substrate of the in-cell touch panel.

The terminals provided in the terminal portion of the frame region each have a metal layer electrically connected to a signal line provided in the image display region. The metal layer is made of a metal material such as copper. Further, the terminals have exposed portions that are exposed to the outside so as to be electrically connected to the driver. In this case, when the metal layer is exposed, the metal layer deteriorates. Thus, for protecting the metal layer, there has been proposed a technique in which an indium tin oxide (ITO) film being the same layer as the pixel electrode is used and the metal layer is covered with the ITO film (e.g., International Publication No. 2017/213180).

SUMMARY

However, there is a problem with the above technique in that simply covering the metal layer of the terminal with the ITO film cannot sufficiently protect the metal layer, and the metal layer corrodes.

Also, there is a problem with the in-cell touch panel in that it is difficult to facilitate the connection of a plurality of touch lines to the terminal portion without expanding the frame region.

A first object of the present disclosure provides an active matrix substrate and a liquid crystal display device that can inhibit corrosion of a metal layer of a terminal electrically connected to a signal line in an image display region.

A second object of the present disclosure provides an in-cell touch panel that can easily connect a plurality of touch lines to a terminal portion without expanding a frame region.

To solve the first object of the present disclosure, an active matrix substrate according to a first present disclosure has an image display region made up of a plurality of pixels, and a frame region surrounding the image display region. The active matrix substrate includes: a pixel electrode provided in each of the plurality of pixels; a common electrode facing one or more of the pixel electrodes; a signal line provided in the image display region; and a terminal provided in the frame region and electrically connected to the signal line. The terminal includes a metal layer, a first contact layer located closer to one side in a lamination direction than the metal layer, and electrically connected to the metal layer, a first interlayer insulating layer located closer to the one side in the lamination direction than the first contact layer, and a second contact layer located closer to the one side in the lamination direction than the first interlayer insulating layer, and electrically connected to the first contact layer through a first through-hole formed in the first interlayer insulating layer. The first contact layer is made of a transparent metal oxide or a semiconductor material doped with impurities.

A liquid crystal display device according to a present disclosure includes the active matrix substrate according to the first present disclosure.

In the liquid crystal display device according to the present disclosure, an end of the first touch relay wiring and an end of the second touch relay wiring may be located below the terminal portion, the end of the first touch relay wiring and the first touch terminal electrode may be connected through a first contact hole, and the end of the second touch relay wiring and the second touch terminal electrode may be connected through a second contact hole.

In the liquid crystal display device according to the present disclosure, the number of the first contact holes and the number of the second contact holes may be more than one.

In the liquid crystal display device according to the present disclosure, the first touch terminal electrode and second touch terminal electrode may be formed in the same layer as the pixel electrodes.

In the liquid crystal display device according to the present disclosure, the end of the first touch relay wiring and the first touch terminal electrode may be connected via a first relay electrode formed in the first contact hole, the end of the second touch relay wiring and the second touch terminal electrode may be connected through a second relay electrode formed in the second contact hole, and the first relay electrode and the second relay electrode may be formed in the same layer as the common electrode in a layer below the pixel electrode.

In the liquid crystal display device according to the present disclosure, the terminal portion may further include a plurality of source terminal electrodes electrically connected to the plurality of data lines, each of the plurality of source terminal electrodes may be electrically connected to each of the plurality of data lines via source relay wiring, and the source relay wiring may be formed in a different layer from the data line.

To solve the second object of the present disclosure, an in-cell touch panel according to a second present disclosure has an image display region and a frame region, the image display region being made up of a plurality of pixels arranged in a first direction and a second direction orthogonal to the first direction, the frame region surrounding the image display region, the in-cell touch panel comprising: a transistor and a pixel electrode provided in each of the plurality of pixels; a plurality of common electrodes arranged in each of the first direction and the second direction, each facing one or more of the pixel electrodes, and provided separately from each other; a plurality of gate lines that extend along the first direction and each supply a gate signal to the transistor in each of the plurality of pixels; a plurality of data lines that extend along the second direction and each supply a data signal to the transistor in each of the plurality of pixels; a plurality of touch lines that extend along the second direction and are each connected to a corresponding common electrode; and a terminal portion provided in the frame region and including a plurality of touch terminal electrodes electrically connected to the plurality of touch lines, wherein the plurality of touch lines include a first touch line and a second touch line, the plurality of touch terminal electrodes include a first touch terminal electrode electrically connected to the first touch line via first touch relay wiring, and a second touch terminal electrode electrically connected to the second touch line via second touch relay wiring, the first touch relay wiring has a first relay wiring portion formed in a different layer from the first touch line and the first touch terminal electrode, and the second touch relay wiring includes a first relay wiring portion formed in a different layer from the second touch line and the second touch terminal electrode and formed in a different layer from the first relay wiring portion of the first touch relay wiring.

BRIEF DESCRIPTION OF THE DRAWINGS

FIG. 5A is a view illustrating an example of image display drive and touch position detection drive in an in-cell touch panel;

FIG. 5B is a view illustrating another example of the image display drive and the touch position detection drive in the in-cell touch panel;

DETAILED DESCRIPTION

Figure 1:
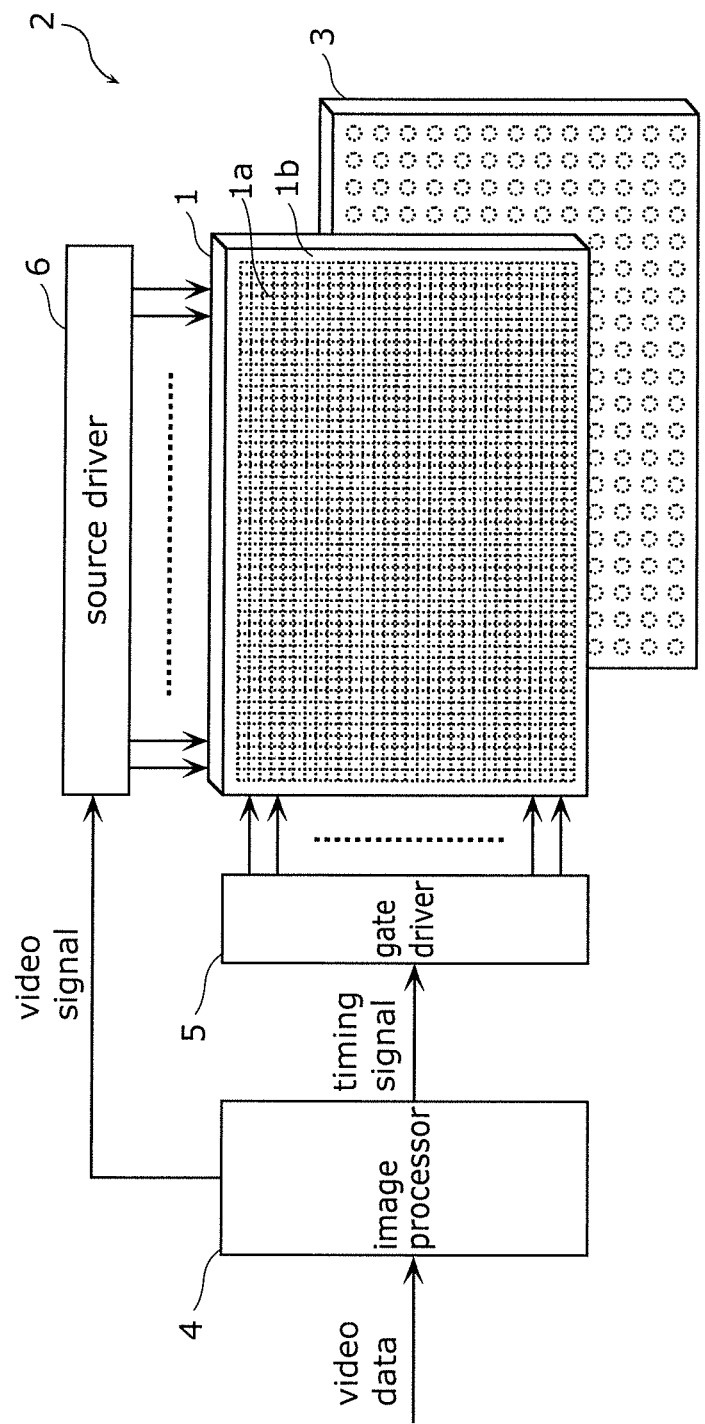
FIG. 1 is a view schematically illustrating a schematic configuration of an image display device according to a first exemplary embodiment.

Hereinafter, exemplary embodiments will be described with reference to the drawings. The following exemplary embodiments provide comprehensive or specific examples of the present disclosure. Numerical values, shapes, materials, components, disposition positions of the components, connection modes of the components, steps, and order of the steps that are illustrated in the following exemplary embodiments are examples, and therefore are not intended to limit the present disclosure. Among the components in the following exemplary embodiments, the components that are not recited in the independent claims indicating the broadest concept are described as an optional component.

The drawings are schematic diagrams, and not necessarily strictly illustrated. In the drawings, substantially the same configuration is designated by the same reference numerals, and overlapping description will be omitted or simplified.

[First Mode of the Present Disclosure]

First, first and second exemplary embodiments will be described as specific examples of a first mode of the present disclosure.

First Exemplary Embodiment

Figure 2:
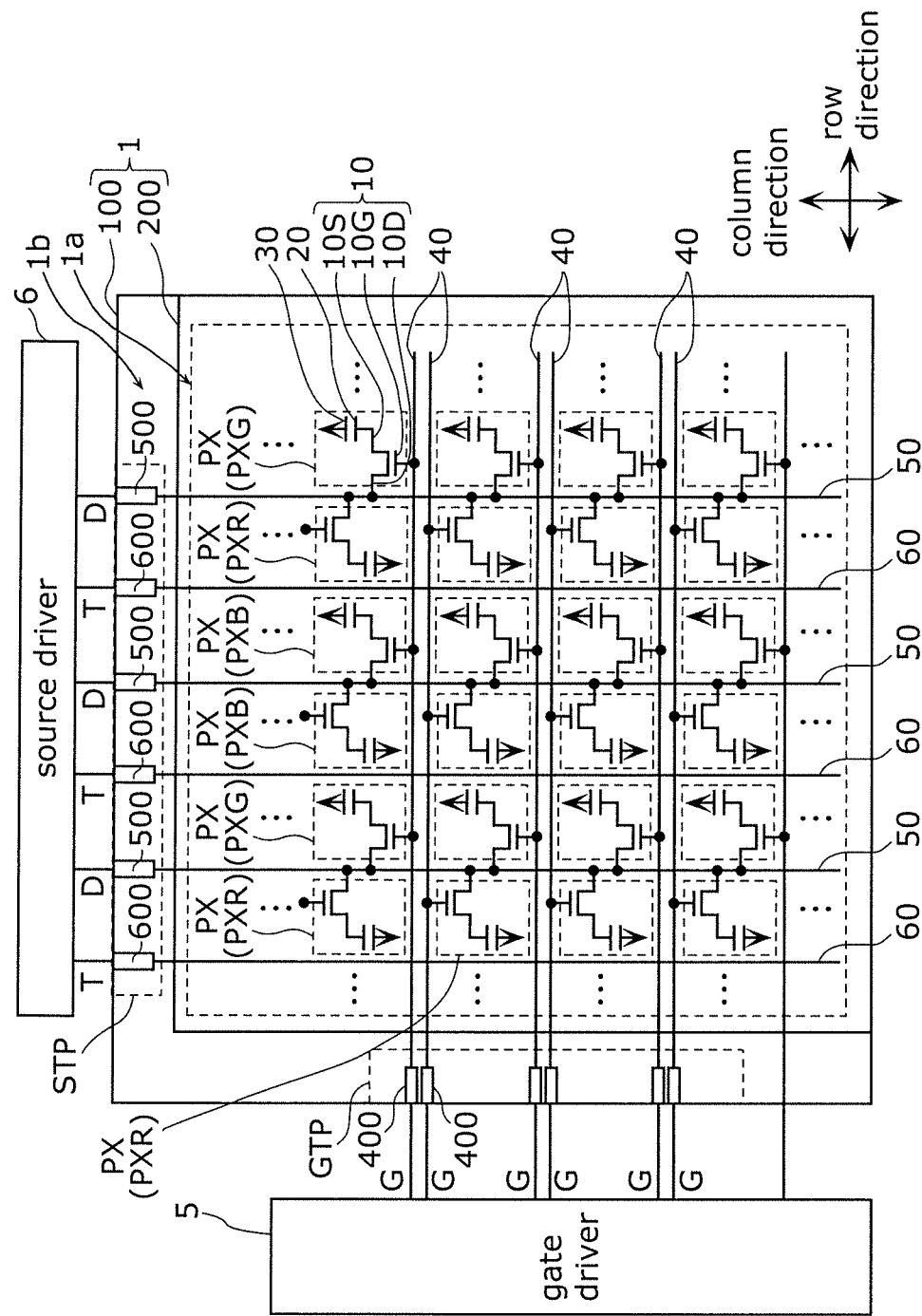
FIG. 2 is a view illustrating a pixel circuit of a liquid crystal display device included in the image display device according to the first exemplary embodiment.
Figure 3:
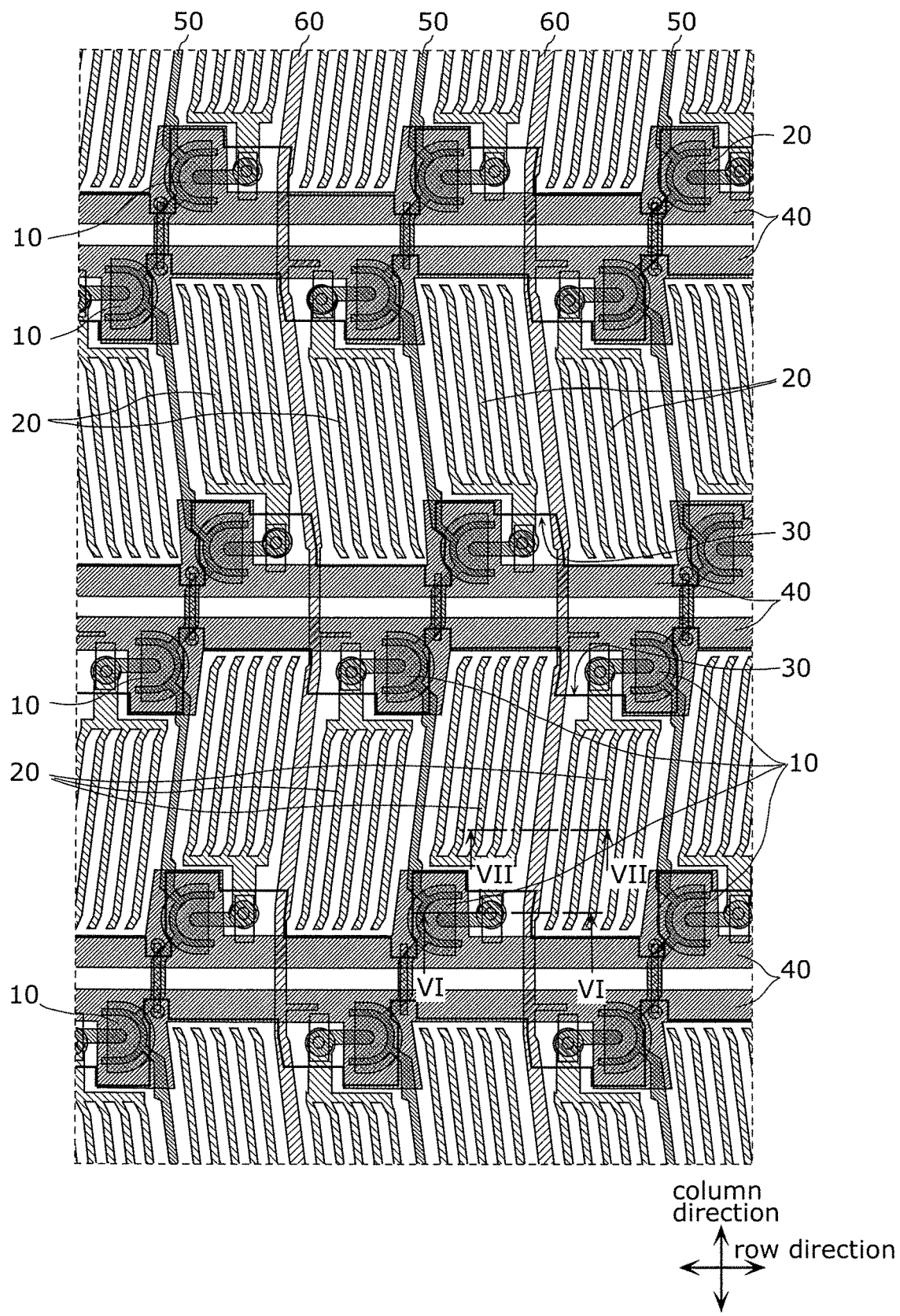
FIG. 3 is a plan view illustrating an example of a pixel configuration of the liquid crystal display device according to the first exemplary embodiment.
Figure 4:
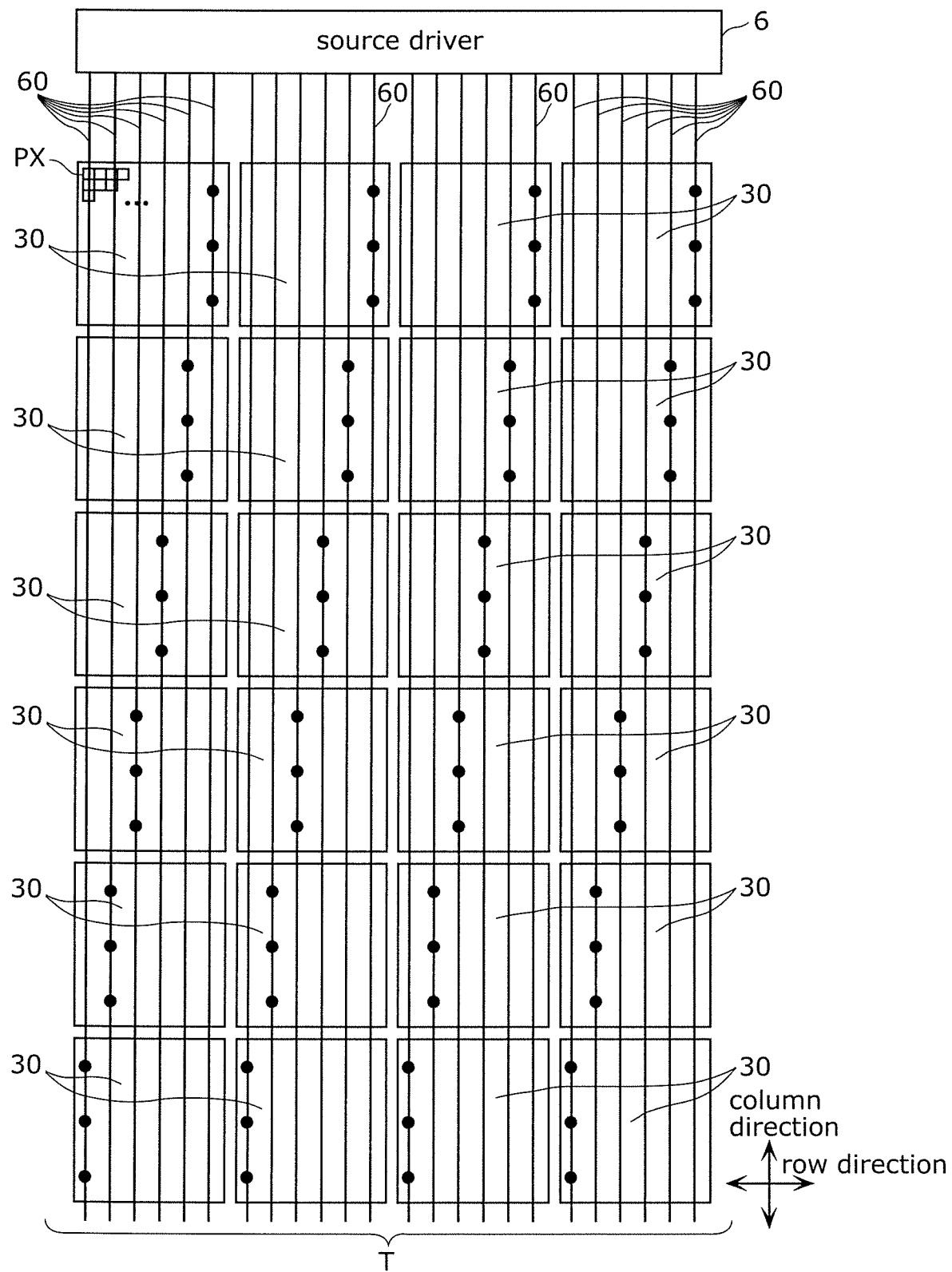
FIG. 4 is a view illustrating an example of the arrangement of common electrodes in the liquid crystal display device according to the first exemplary embodiment.

A schematic configuration of image display device 2 including liquid crystal display device 1 according to the first exemplary embodiment will be described with reference to FIGS. 1 to 4. FIG. 1 is a view schematically illustrating a schematic configuration of image display device 2 according to the first exemplary embodiment. FIG. 2 is a view illustrating a pixel circuit of liquid crystal display device 1 included in image display device 2 according to the first exemplary embodiment. FIG. 3 is a plan view illustrating an example of the configuration of pixel PX of liquid crystal display device 1 according to the first exemplary embodiment. FIG. 4 is a view illustrating an example of the arrangement of common electrodes 30 in liquid crystal display device 1 according to the first exemplary embodiment. In FIG. 2, "G" indicates gate line 40, "D" indicates data line 50, and "T" indicates touch line 60. In FIG. 4, black circles indicate contact portions between common electrodes 30 and touch lines 60.

Image display device 2 is an example of a display device that displays a still image or a moving image (video). As illustrated in FIG. 1, image display device 2 includes liquid crystal display device 1, backlight 3, and image processor 4.

Liquid crystal display device 1 is a liquid crystal display panel on which an image is displayed. Specifically, liquid crystal display device 1 is provided with a liquid crystal cell including first substrate 100, second substrate 200 that faces first substrate 100, and a liquid crystal layer (not illustrated) disposed between first substrate 100 and second substrate 200. Note that liquid crystal display device 1 includes a pair of polarizing plates (not illustrated). The pair of polarizing plates is bonded to the liquid crystal cell. For example, one of the pair of polarizing plates is formed on the outer surface of first substrate 100, and the other of the pair of polarizing plates is formed on the outer surface of second substrate 200. The pair of polarizing plates are arranged so that the polarization directions are orthogonal to each other. Further, a retardation plate may be bonded to the pair of polarizing plates.

Liquid crystal display device 1 is disposed on the light emission side of backlight 3. Hence light emitted from backlight 3 enters liquid crystal display device 1. In the present exemplary embodiment, first substrate 100 is located on backlight 3 side, and second substrate 200 is located on the observer's side.

The liquid crystal drive method for liquid crystal display device 1 is a horizontal electric field method such as an IPS (In-Plane Switching) and an FFS (Fringe Field Switching). In liquid crystal display device 1, for example, voltage control is performed by a normally black method, but the voltage control method is not limited to the normally black method.

As illustrated in FIGS. 1 and 2, liquid crystal display device 1 includes image display region 1a (active region) and frame region 1b surrounding image display region 1a. A color image or a monochrome image is displayed in image display region 1a.

Image display region 1a is a display region (effective region) where an image is displayed, and includes, for example, a plurality of pixels PX arranged in a first direction and a second direction intersecting the first direction. In the present exemplary embodiment, the first direction and the second direction are orthogonal to each other. Specifically, the first direction is a row direction, and the second direction is a column direction orthogonal to the row direction. Thus, image display region 1a is made up of the plurality of pixels PX arranged in the row direction and the column direction. That is, the plurality of pixels PX are arranged in a matrix.

Frame region 1b is a peripheral region of liquid crystal display device 1 and is located outside image display region 1a. Frame region 1b is a non-display region (ineffective region) where no image is displayed. In the present exemplary embodiment, a planar view shape of liquid crystal display device 1 is a rectangular shape. Therefore, a planar view shape of image display region 1a is a rectangular shape, and a planar view shape of frame region 1b is a rectangular frame shape.

The plurality of pixels PX are made up of a plurality of types of pixels arranged periodically and repeatedly along the row direction. Specifically, the plurality of pixels PX are made up of three types of pixels of red pixel PXR, green pixel PXG, and blue pixel PXB. In this case, in the present exemplary embodiment, the three pixels of red pixel PXR, green pixel PXG, and blue pixel PXB are arranged as a set in this order and are repeatedly arranged along the row direction. Further, the same kind of pixels PX are arranged in the column direction. Note that the arrangement order of red pixel PXR, green pixel PXG, and blue pixel PXB is not limited to this.

As illustrated in FIG. 2, liquid crystal display device 1 is provided with transistor 10, pixel electrode 20, and common electrode 30 facing the one or more pixel electrodes 20. Transistor 10, pixel electrode 20, and common electrode 30 are provided in each of the plurality of pixels PX.

Further, liquid crystal display device 1 is provided with a plurality of gate lines 40 (scanning lines) extending in the row direction which is the first direction, and a plurality of data line 50 (video signal line) extending in the column direction which is the second direction orthogonal to the first direction. Each pixel PX is a region surrounded by gate line 40 extending in the row direction and data line 50 extending in the column direction.

Liquid crystal display device 1 in the present exemplary embodiment is an in-cell liquid crystal display panel (in-cell touch panel) having a touch function as well as a display function. Thus, liquid crystal display device 1 further includes a plurality of touch lines 60 for detecting a touch position when a user touches liquid crystal display device 1. The plurality of touch lines 60 extend in the same direction as the plurality of data lines 50. Specifically, the plurality of touch lines 60 extend in the column direction.

Transistor 10 is a thin film transistor and includes gate electrode 10G, source electrode 10S, and drain electrode 10D as illustrated in FIG. 2. In the present specification, source electrode 10S and drain electrode 10D may be collectively referred to as a source-drain electrode, and the source-drain electrode means at least one of source electrode 10S and drain electrode 10D, either source electrode 10S or drain electrode 10D, or both source electrode 10S and drain electrode 10D.

Pixel electrode 20 is provided in each of the plurality of pixels PX. Pixel electrode 20 is provided, for example, at an intersection of gate line 40 and data line 50. In each of the plurality of pixels PX, pixel electrode 20 is connected to gate line 40 and data line 50 corresponding to the concerned pixel PX via transistor 10 corresponding to the concerned pixel PX.

In the present exemplary embodiment, one transistor 10 and one pixel electrode 20 are provided for each pixel PX. A plurality of transistors 10 and a plurality of pixel electrodes 20 may be provided for each pixel PX.

As illustrated in FIG. 3, pixel electrode 20 in each pixel PX is a comb-like electrode having a plurality of line electrodes extending in a stripe shape in the column direction. In each pixel electrode 20, all line electrodes are formed substantially in parallel, and an interval (slit width) between two adjacent line electrodes is constant. Further, the line electrode of pixel electrode 20 is inclined with respect to the row direction and the column direction in each pixel PX. In this case, in the present exemplary embodiment, the direction of the line electrode is inverted between two pixels PX adjacent in the column direction, and the line electrode is formed to have a substantially "<" shape for two pixels in the column direction. In other words, the plurality of pixel electrodes 20 arranged in the column direction are formed in a zigzag shape along the column direction. The line electrode may be formed in parallel to the column direction without being inclined.

Common electrode 30 is a counter electrode facing pixel electrode 20. As illustrated in FIG. 4, in the present exemplary embodiment, a plurality of common electrodes 30 are provided. The plurality of common electrodes 30 are arranged in each of the row direction and the column direction. That is, the plurality of common electrodes 30 are arranged in a matrix. The same common voltage (Vcom) is applied to each of the plurality of common electrodes 30.

Each of the plurality of common electrodes 30 has a rectangular shape and faces one or more pixel electrodes 20. In the present exemplary embodiment, each of the plurality of common electrodes 30 has a rectangular shape provided across the plurality of pixels PX, and faces the plurality of pixel electrodes 20 corresponding to the plurality of pixels PX present in the rectangular region. For example, the plurality of common electrodes 30 are formed in a rectangular shape with one edge made up of a plurality of pixels PX that are several to several tens of pixels PX.

Liquid crystal display device 1 according to the present exemplary embodiment is a liquid crystal display panel having a touch sensing function by a capacitance method that is one of self-capacitance methods. Hence, common electrode 30 is also a touch electrode that forms a capacitance with pixel electrode 20. That is, common electrode 30 is paired with pixel electrode 20 and is used not only at the time of image display drive but also at the time of touch position detection drive. Each of the plurality of common electrodes 30 is a unit electrode (touch electrode) for detecting a touch position.

For example, a size of one common electrode 30 is 40×40 pixels. In other words, a length in each of the row direction and the column direction of one common electrode 30 is a length of 40 pixels. In this case, there are 40 contact portions with one touch line 60 in one common electrode 30. The size of one common electrode 30 is not limited to this but may be 32×32 pixels, and the shape of one common electrode 30 is not limited to a square but may be a rectangle.

Each of the plurality of gate lines 40 extending in the row direction is a signal line that supplies a gate signal to transistor 10 in each of the plurality of pixels PX. As illustrated in FIG. 2, each of the plurality of gate lines 40 is provided at a boundary between two pixels PX adjacent in the column direction in image display region 1a. Specifically, each gate line 40 is provided between two pixel columns adjacent in the column direction. As illustrated in FIG. 3, in the present exemplary embodiment, the plurality of gate lines 40 extend linearly in the row direction.

Each gate line 40 is connected to each of transistors 10 of the plurality of pixels PX arranged in the row direction. That is, each gate line 40 is connected to one transistor 10 in each pixel PX. Specifically, as illustrated in FIG. 2, each gate line 40 is connected to gate electrode 10G of each transistor 10.

In the present exemplary embodiment, liquid crystal display device 1 has a dual-gate structure and a 2G1D wiring connection structure. Therefore, each two of the plurality of gate lines 40 are provided for each boundary between two pixels PX adjacent in the column direction. That is, two gate lines 40 are provided at each boundary between two pixel columns adjacent in the column direction.

Each of the plurality of data lines 50 extending in the column direction is a signal line that supplies a data signal (video signal) to transistor 10 in each of the plurality of pixels PX. Each of the plurality of data lines 50 is provided at a boundary between two pixels PX adjacent in the row direction in image display region 1a. Specifically, each data line 50 is provided between two pixel columns adjacent in the row direction.

As illustrated in FIG. 3, in the present exemplary embodiment, the plurality of data lines 50 extend in the column direction along the shape of the line electrode of pixel electrode 20. Specifically, each data line 50 is inverted in direction by two pixels PX adjacent in the column direction, and is formed to have a substantially "<" shape for two pixels in the column direction. That is, similarly to pixel electrode 20, each data line 50 is formed to have a zigzag shape along the column direction. The plurality of data lines 50 may extend linearly in the column direction.

Each data line 50 is connected to each of transistors 10 of the plurality of pixels PX arranged in the column direction. In other words, each data line 50 is connected to one transistor 10 in each pixel PX. Specifically, as illustrated in FIG. 2, each data line 50 is connected to drain electrode 10D of each transistor 10. That is, in the present exemplary embodiment, data line 50 is a drain line.

Each of the plurality of touch lines 60 extending in the column direction is a signal line for detecting a touch position, and similarly to data line 50, in image display region 1a, each of the plurality of touch lines 60 is provided at a boundary between two pixels PX adjacent in the row direction. Specifically, touch line 60 is provided between two pixel columns adjacent in the row direction.

As illustrated in FIG. 4, the plurality of touch lines 60 are connected one-to-one to the plurality of common electrodes 30 arranged in the column direction among the plurality of common electrodes 30. Specifically, each of the plurality of touch lines 60 (column touch line group) in each column of the plurality of common electrodes 30 arranged in the column direction is provided so as to traverse all of the plurality of common electrodes 30 included in the concerned column. However, each of the plurality of touch lines 60 is connected to only one of the plurality of common electrodes 30 included in the concerned column. Therefore, each common electrode 30 is connected to any one of the plurality of touch lines 60 traversing the concerned common electrode 30. However, each common electrode 30 is not connected to but insulated from the other remaining touch lines 60. As will be described in detail later, touch line 60 and common electrode 30 are formed via an insulating film, and touch line 60 and common electrode 30 corresponding to the concerned touch line 60 are connected through a through-hole (contact hole) formed in the insulating film.

In FIG. 3, in the present exemplary embodiment, similarly to data lines 50, the plurality of touch lines 60 extend in the column direction along the shape of the line electrode of pixel electrode 20. Specifically, each touch line 60 is inverted in direction by two pixels PX adjacent in the column direction, and is formed to have a substantially "<" shape for two pixels in the column direction. That is, each touch line 60 is formed to have a zigzag shape along the column direction. The plurality of touch lines 60 may extend linearly in the column direction.

As illustrated in FIGS. 2 and 3, the plurality of data lines 50 and the plurality of touch lines 60 are alternately and repeatedly provided one by one for each boundary of two pixels PX adjacent in the row direction. Specifically, each of data line 50 and touch lines 60 is provided by being thinned out for each pixel column, and is provided for every two pixel columns adjacent in the row direction (every two columns) so as to be arranged alternately. For example, when data line 50 is provided in an odd-numbered column of pixel PX, touch line 60 is provided in an even-numbered column of pixel PX. On the contrary, when data line 50 is provided in the even-numbered row of pixel PX, touch line 60 is provided in the odd-numbered row of pixel PX.

As illustrated in FIG. 1, liquid crystal display device 1 includes gate driver 5 and source driver 6 in order to display an image corresponding to an input video signal. Gate driver 5 and source driver 6 are driver integrated circuits (ICs) (IC packages), for example. Gate driver 5 and source driver 6 are mounted in frame region 1b of liquid crystal display device 1.

Specifically, gate driver 5 is mounted in gate terminal portion GTP provided in frame region 1b of first substrate 100. Gate terminal portion GTP is a mounting portion where gate driver 5 is mounted. Gate terminal portion GTP may be provided in one place of frame region 1b or may be provided in a plurality of places.

Gate terminal portion GTP includes a plurality of gate terminals 400 electrically connected to the plurality of gate lines 40. Each gate terminal 400 is a pad electrode having an exposed portion at least a part of which is exposed to the outside. By electrically connecting gate driver 5 to each of the exposed portions of the plurality of gate terminals 400, a gate signal from gate driver 5 is supplied to gate line 40 via gate terminal 400.

Gate driver 5 is mounted in gate terminal portion GTP of first substrate 100 by the COF method or the COG method. For example, when gate driver 5 is to be mounted in gate terminal portion GTP by the COF method, a flexible wiring board mounted with gate driver 5 that is an IC chip is connected to the plurality of gate terminals 400 by thermocompression bonding using an anisotropic conductive film (ACF). When gate driver 5 is to be mounted in gate terminal portion GTP by the COG method, the electrode terminal of gate driver 5 that is an IC chip and the plurality of gate terminals 400 are connected directly.

Source driver 6 is mounted in source terminal portion STP provided in frame region 1b of first substrate 100. Source terminal portion STP is a mounting portion where source driver 6 is mounted. Source terminal portion STP may be provided in one place of frame region 1b or may be provided in a plurality of places.

In the present exemplary embodiment, gate driver 5 is mounted, for example, at the end of liquid crystal display device 1 on the row direction side. Further, source driver 6 is mounted, for example, at the end of liquid crystal display device 1 on the column direction side. The mounting locations for gate driver 5 and source driver 6 are not limited to the above examples, but both gate driver 5 and source driver 6 may be mounted at the same end of liquid crystal display device 1 on the column direction side, or may be mounted at the same end of liquid crystal display device 1 on the row direction side.

Source terminal portion STP includes a plurality of source terminals 500 electrically connected to the plurality of data lines 50. Each source terminal 500 is a pad electrode having an exposed portion at least a part of which is exposed to the outside. By electrically connecting source driver 6 to each of the exposed portions of the plurality of source terminals 500, a data signal from source driver 6 is supplied to data line 50 via source terminal 500. Similarly to gate driver 5, source driver 6 is mounted in source terminal portion STP of first substrate 100 by the COF method or the COG method.

In the present exemplary embodiment, source terminal portion STP further includes a plurality of touch terminals 600 electrically connected to the plurality of touch lines 60. That is, source terminal portion STP includes not only source terminal 500 but also touch terminal 600. Each touch terminal 600 is a pad electrode having an exposed portion at least a part of which is exposed to the outside. In the present exemplary embodiment, a source driver with a touch function is used as source driver 6, and hence source driver 6 is electrically connected to each of the exposed portions of the plurality of touch terminals 600. The source driver with a touch function is a driver in which an image display circuit necessary at the time of performing the image display drive and a touch position detection circuit necessary at the time of performing the touch position detection drive are shared.

Touch terminal 600 may be provided in a terminal portion provided separately from source terminal portion STP. Gate terminal portion GTP and source terminal portion STP are provided on different sides of rectangular liquid crystal display device 1, but may be provided on the same side. Both gate driver 5 and source driver 6 are not limited to being mounted by the COF method or the COG method, but one of gate driver 5 and source driver 6 may be mounted by the COF method and the other may be mounted by the COG method.

As illustrated in FIG. 2, gate driver 5 is electrically connected to gate line 40 provided in image display region 1a. Gate driver 5 selects pixel PX where a data signal is written in accordance with a timing signal input from image processor 4, and supplies a voltage (gate-on voltage; Vgon) for turning on transistor 10 of the selected pixel PX to gate line 40. Thereby, a data voltage is supplied to pixel electrode 20 of the selected pixel PX via transistor 10.

Meanwhile, source driver 6 is electrically connected to data line 50 provided in image display region 1a. Source driver 6 supplies, to data line 50, a voltage (data voltage) corresponding to a video signal input from image processing unit 4, in accordance with the selection of gate line 40 by gate driver 5.

In the present exemplary embodiment, as described above, the source driver with a touch function is used as source driver 6. Therefore, not only the plurality of data lines 50 but also the plurality of touch lines 60 are electrically connected to source driver 6. Note that source driver 6 supplies a common voltage (Vcom) to common electrode 30.

As illustrated in FIG. 1, backlight 3 is disposed on the back surface side of liquid crystal display device 1 and irradiates liquid crystal display device 1 with light. In the present exemplary embodiment, backlight 3 is a light emitting diode (LED) backlight using an LED as a light source, but backlight 3 is not limited thereto. Backlight 3 is a direct-type LED backlight in which LEDs are two-dimensionally arranged on a substrate so as to face liquid crystal display device 1, but backlight 3 may be an edge-type backlight. Backlight 3 is a surface emitting unit that emits planar uniform scattered light (diffused light). Backlight 3 may have an optical member such as a diffusion plate (diffusion sheet) in order to diffuse light from the light source.

Image processor 4 is a control device provided with an arithmetic processing circuit such as a central processing unit (CPU) and memories such as a read-only memory (ROM) and a random-access memory (RAM). Video data to be displayed on liquid crystal display device 1 is input into image processor 4. In image processor 4, the CPU reads out and executes programs stored in the memory, thereby executing various types of processing. Specifically, image processor 4 includes a timing controller or the like that performs various types of image signal processing such as color adjustment on video data input from an external system (not illustrated), to generate a video signal indicating a gradation value of each pixel PX and a timing signal indicating the timing for writing the video signal into each pixel PX. Image processor 4 outputs the video signal to source driver 6 and outputs the timing signal to gate driver 5.

Liquid crystal display device 1 in the present exemplary embodiment has a display function and a touch function. That is, liquid crystal display device 1 performs the image display drive and the touch position detection drive. In this case, liquid crystal display device 1 uses touch line 60 to perform the image display drive and the touch position detection drive by time division. For example, as illustrated in FIGS. 5A and 5B, the image display drive and the touch position detection drive are alternately repeated a plurality of times within one frame period (16.6 ms). In this case, the touch position detection drive can be performed using, for example, a blanking period.

At the time when liquid crystal display device 1 performs the image display drive, a gate-on voltage is supplied from gate driver 5 to gate line 40. Thereby, transistor 10 of the selected pixel PX is turned on, and the data voltage is supplied to pixel electrode 20 from data line 50 connected to transistor 10. Then, an electric field is generated in the liquid crystal layer due to the difference between the data voltage supplied to pixel electrode 20 and the common voltage supplied to common electrode 30. With this electric field, an alignment state of liquid crystal molecules in the liquid crystal layer in each pixel PX changes to control a transmittance of light of backlight 3, which passes through liquid crystal display device 1, for each pixel PX. As a result, a desired image is displayed in image display region 1a of liquid crystal display device 1.

Further, at the time when liquid crystal display device 1 performs the touch position detection drive, source driver 6 which is the source driver with a touch function detects, as a touch detection signal, the change in capacitance of each of the plurality of common electrodes 30 via touch line 60. It is thereby possible to specify common electrode 30 at the touched position and detect the position touched by the user.

Note that the control illustrated in FIG. 5B has a long drive period per image display drive and touch position detection drive as compared to the control illustrated in FIG. 5A. In the present exemplary embodiment, either the control illustrated in FIG. 5B or the control illustrated in FIG. 5A may be used. However, in the control illustrated in FIG. 5B, as compared to the control illustrated in FIG. 5A, the amount of image data that is stored into the memory during the touch position detection drive becomes large, thus increasing the chip size of the IC driver.

Figure 6:
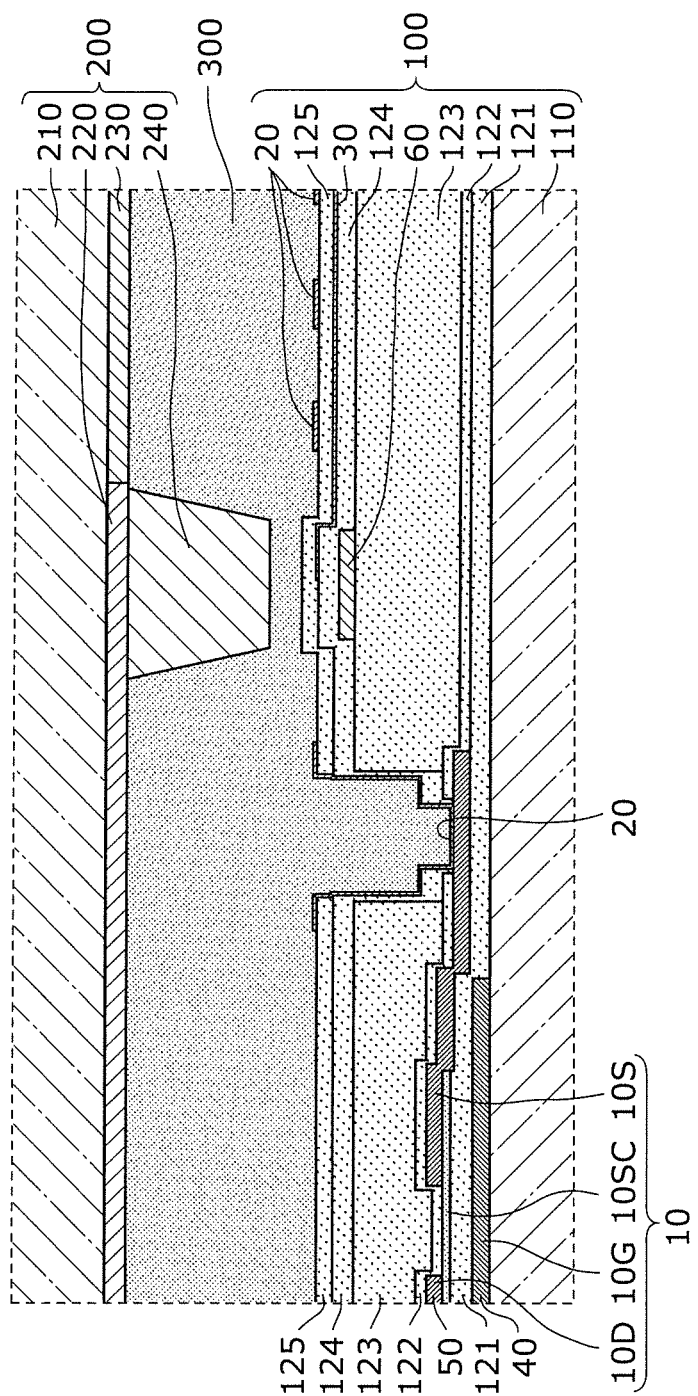
FIG. 6 is a sectional view of the liquid crystal display device according to the first exemplary embodiment taken along line VI-VI in FIG. 3.
Figure 7:
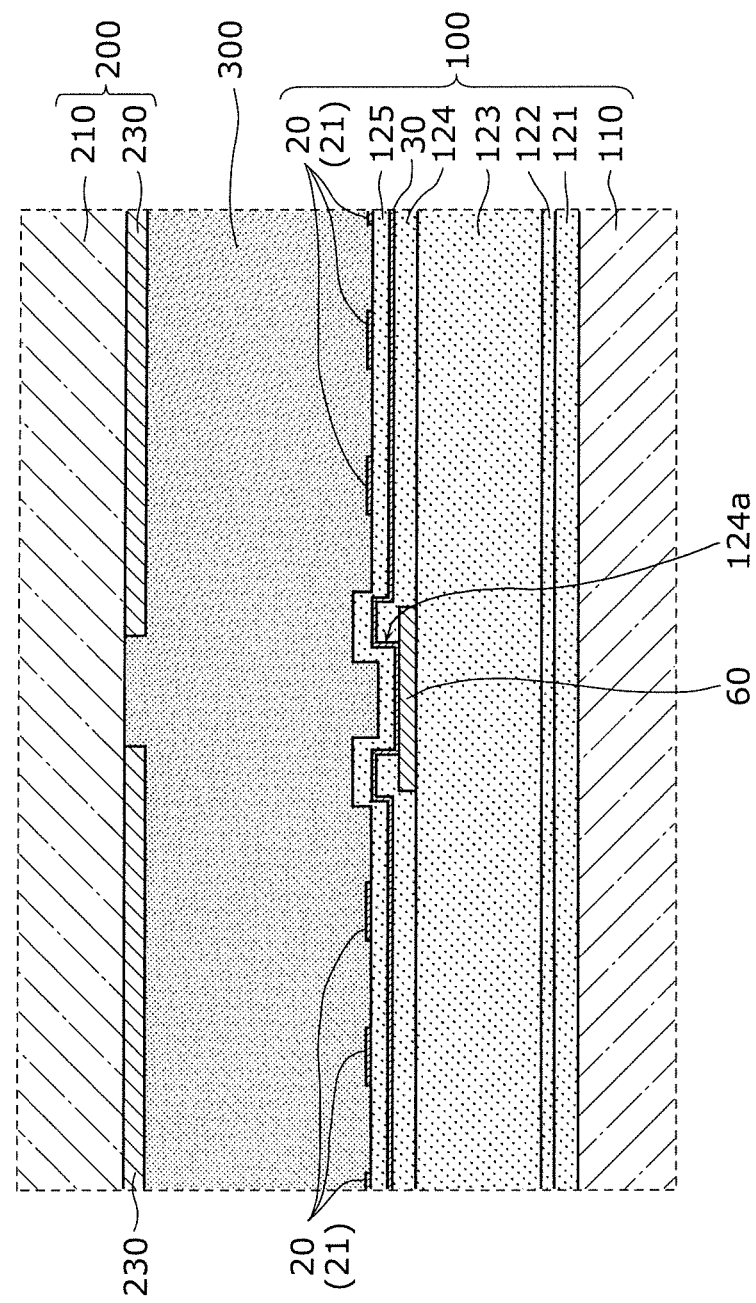
FIG. 7 is a sectional view of the liquid crystal display device according to the first exemplary embodiment taken along line VII-VII in FIG. 3.

Next, a cross-sectional structure in image display region 1a of liquid crystal display device 1 will be described with reference to FIGS. 6 and 7. FIG. 6 is a sectional view of liquid crystal display device 1 according to the first exemplary embodiment taken along line VI-VI in FIG. 3. FIG. 7 is a sectional view of liquid crystal display device 1 according to the first exemplary embodiment taken along line VII-VII in FIG. 3.

As illustrated in FIGS. 6 and 7, liquid crystal display device 1 is provided with first substrate 100, second substrate 200 facing first substrate 100, and liquid crystal layer 300 disposed between first substrate 100 and second substrate 200. Liquid crystal layer 300 is sealed between first substrate 100 and second substrate 200 by a frame-shaped sealing member.

First substrate 100 is a TFT substrate having a TFT as transistor 10. Specifically, first substrate 100 is an active matrix substrate where a plurality of transistors 10 are arranged in a matrix. First substrate 100 is provided with not only transistor 10 but also various signal lines such as gate line 40, data line 50, and touch line 60, an insulating film that insulates between the signal lines, pixel electrode 20, common electrode 30, and the like. The members are formed above first transparent substrate 110. First transparent substrate 110 is a transparent substrate such as a glass substrate, for example.

As illustrated in FIG. 6, transistor 10 formed on first transparent substrate 110 is made up of gate electrode 10G, source electrode 10S, drain electrode 10D, and semiconductor layer 10SC serving as a channel layer. In the present exemplary embodiment, transistor 10 is a TFT with a bottom gate structure and is provided with gate electrode 10G formed on first transparent substrate 110, first insulating film 121 that is a gate insulator (GI) formed on gate electrode 10G, and semiconductor layer 10SC formed above gate electrode 10G via first insulating film 121. Source electrode 10S and drain electrode 10D are formed to cover a part of semiconductor layer 10SC. First insulating film 121 is formed all over first transparent substrate 110 so as to cover gate electrode 10G.

Gate electrode 10G may, for example, be made up of a metal film having a two-layer structure of a molybdenum film and a copper film, or be made up of a single-layer metal film made of a copper film or the like. First insulating film 121 may, for example, be constituted by an insulating film having a two-layer structure of a silicon oxide film and a silicon nitride film, or be constituted by a single insulating film of a silicon oxide film or a silicon nitride film. Semiconductor layer 10SC may, for example, be constituted by a semiconductor film having a two-layer structure of an i-amorphous silicon film and an n-amorphous silicon film, or be constituted by a semiconductor film having only one layer of the i-amorphous silicon film. Source electrode 10S and drain electrode 10D may, for example, be constituted by a metal film having a two-layer structure of a molybdenum film and a copper film, or be constituted by a single-layer metal film made of a copper film or the like.

Note that the materials of gate electrode 10G, source electrode 10S, drain electrode 10D, semiconductor layer 10SC, and first insulating film 121 are not limited to the above examples. For example, as the material of semiconductor layer 10SC, an In—Ga—Zn—O-based oxide semiconductor or the like may be used.

As illustrated in FIG. 6, gate line 40 and data line 50 are formed in first substrate 100. Gate line 40 and data line 50 are formed above first transparent substrate 110.

Gate line 40 is formed in the same layer as gate electrode 10G. That is, gate line 40 and gate electrode 10G are formed by patterning the same metal film. Gate line 40 and gate electrode 10G are formed in a first wiring layer (GAL layer) that is a metal layer.

Data line 50 is formed in the same layer as source electrode 10S and drain electrode 10D. That is, data line 50, source electrode 10S, and drain electrode 10D are formed by patterning the same metal film. Data line 50, source electrode 10S, and drain electrode 10D are formed in a second wiring layer (SD layer) that is a metal layer above the first wiring layer.

First insulating film 121 is formed as a first insulating layer (GI layer) between the first wiring layer (GAL layer) and the second wiring layer (SD layer). First insulating film 121 is formed all over first transparent substrate 110 so as to cover gate line 40 and gate electrode 10G. The first wiring layer, first insulating film 121, and the second wiring layer are TFT layers where transistor 10 which is a TFT is formed.

Source electrode 10S of transistor 10 is connected to pixel electrode 20 through a through-hole (contact hole). Meanwhile, drain electrode 10D of transistor 10 is connected to data line 50. Specifically, a part of data line 50 is drain electrode 10D.

On first insulating film 121, second insulating film 122 is formed as a second insulating layer (PAS layer) so as to cover data line 50 and the source-drain electrode of transistor 10. In other words, data line 50 and the source-drain electrode of transistor 10 are formed between first insulating film 121 and second insulating film 122. Second insulating film 122 is formed all over first insulating film 121. Second insulating film 122 is constituted by an inorganic insulating film made of an inorganic material such as a silicon nitride film, for example. Second insulating film 122 which is an inorganic insulating film can be formed by chemical vapor deposition (CVD), for example.

Further, third insulating film 123 is formed on second insulating film 122 as a third insulating layer (OPAS layer). Third insulating film 123 is formed all over second insulating film 122. In the present exemplary embodiment, a thickness of third insulating film 123 is larger than a thickness of second insulating film 122. Specifically, the thickness of third insulating film 123 is 10 times or more the thickness of second insulating film 122 and is 3000 nm as an example. Thereby, the distance in the thickness direction between the wiring such as gate line 40 and data line 50 and common electrode 30 can be increased, so that a parasitic capacitance formed between the wiring such as gate line 40 and data line 50 and common electrode 30 can be reduced. In addition, by increasing the thickness of third insulating film 123, the unevenness of the TFT layer caused by the formation of transistor 10, gate line 40, and data line 50 can be reduced, and the TFT layer can be planarized. Thereby, third insulating film 123 with a planarized surface can be formed, so that common electrode 30 immediately above third insulating film 123 can be formed in a flat planar shape. That is, third insulating film 123 functions as a planarization layer.

Third insulating film 123 is constituted by an organic insulating film made of an organic material containing carbon. Third insulating film 123 which is an organic insulating film can be formed by, for example, applying and curing a liquid organic material. Thereby, third insulating film 123 can be easily increased in thickness, so that the surface of third insulating film 123 can be easily planarized all over pixels PX.

Touch line 60 is formed on third insulating film 123. Touch line 60 is made of a low resistance material such as metal. For example, touch line 60 is a metal film made of copper or the like. In the present exemplary embodiment, touch line 60 is a copper line made of a copper film. Touch line 60 is formed in a third wiring layer (CMT layer) that is a metal layer above the second wiring layer. Hence touch line 60 is provided in a different layer from gate line 40 and data line 50.

On third insulating film 123 and touch line 60, fourth insulating film 124 is formed as a fourth insulating layer (TPS layer). Fourth insulating film 124 is formed all over third insulating film 123 so as to cover touch line 60.

Accordingly, touch line 60 is formed between third insulating film 123 and fourth insulating film 124. Fourth insulating film 124 is constituted by an inorganic insulating film made of an inorganic material such as a silicon nitride film, for example.

On fourth insulating film 124, common electrode 30 is formed. Common electrode 30 is a transparent electrode made of a transparent metal oxide such as indium tin oxide (ITO), for example. In the present exemplary embodiment, common electrode 30 is an ITO film and can be formed by sputtering, for example. Common electrode 30 is formed in a fourth wiring layer (MIT layer) above the third wiring layer.

In the present exemplary embodiment, a plurality of common electrodes 30 are formed. Specifically, as illustrated in FIG. 4, common electrodes 30 are arranged in a matrix in a state of being separated from each other in the row direction and the column direction. In this case, the two common electrodes 30 adjacent in the column direction are separated from each other with a region on gate line 40 as a separation region. The two common electrodes 30 adjacent in the row direction are separated from each other with a region on data line 50 as a separation region.

Further, the plurality of common electrodes 30 are formed all over pixels PX in image display region 1*a*. As a result, the wiring such as gate line 40 and data line 50 is covered by common electrode 30, so that the electric field generated in the wiring such as gate line 40 and data line 50 can be shielded by common electrode 30. That is, the electric field generated in the TFT layer can be shielded by common electrode 30. Accordingly, the flexibility in designing the shape and size of pixel electrode 20 formed on common electrode 30 is improved, thus making it possible to easily improve the light transmittance and aperture ratio of pixel PX.

As illustrated in FIG. 7, common electrode 30 is connected to one touch line 60 through through-hole (contact hole) 124*a* formed in fourth insulating film 124. Thereby, at the time of performing the touch position detection drive, a change in capacitance of common electrode 30 at the position touched by the user can be detected via touch line 60 connected to the concerned common electrode 30. Through-hole 124*a* connecting common electrode 30 and touch line 60 can be formed by performing dry etching or wet etching on fourth insulating film 124, for example. Note that a material constituting common electrode 30 (ITO in the present exemplary embodiment) is embedded in this through-hole 124*a*.

In addition, although the ITO film has a relatively high resistance value, by connecting touch line 60 made of such a low-resistance metal film to common electrode 30, the resistance of common electrode 30 made of the ITO film can be reduced, and a time constant of common electrode 30 can be lowered. In other words, at the time of performing the image display drive, touch line 60 can be used as a common line.

Furthermore, by providing common electrode 30 on touch line 60, touch line 60 can be covered with common electrode 30. As a result, as compared to a case where touch line 60 is provided on common electrode 30, it is possible to inhibit corrosion of touch line 60 made of a metal material vulnerable to corrosion.

On fourth insulating film 124 and common electrode 30, fifth insulating film 125 is formed as a fifth insulating layer (UPS layer). Fifth insulating film 125 is formed all over fourth insulating film 124 so as to cover common electrode 30. Fifth insulating film 125 is constituted by an inorganic insulating film made of an inorganic material such as a silicon nitride film, for example.

On fifth insulating film 125, pixel electrode 20 is formed. Pixel electrode 20 faces common electrode 30 via fifth insulating film 125. Pixel electrode 20 is a transparent electrode made of a transparent metal oxide such as indium tin oxide, for example. In the present exemplary embodiment, pixel electrode 20 is an ITO film similarly to common electrode 30, and can be formed by sputtering, for example. Pixel electrode 20 is formed in a fifth wiring layer (PIT layer) above the fourth wiring layer.

Although not illustrated, an alignment film may be formed all over fifth insulating film 125 so as to cover pixel electrode 20. In order to align the initial alignment angles of the liquid crystal molecules in a certain direction, the alignment film is rubbed.

Next, second substrate 200 will be described. Second substrate 200 is a counter substrate facing first substrate 100. As illustrated in FIG. 7, second substrate 200 includes second transparent substrate 210, black matrix 220 formed on second transparent substrate 210, and color filter 230. Hence second substrate 200 is a color filter substrate (CF substrate) having color filter 230.

Similarly to first transparent substrate 110, second transparent substrate 210 is a transparent substrate such as a glass substrate, for example.

Black matrix 220 is a black light shielding layer, and is made of, for example, carbon black. Black matrix 220 is formed on a surface of second transparent substrate 210 on the liquid crystal layer 300 side. Black matrix 220 is formed to cover gate line 40. Black matrix 220 may be formed to cover not only gate lines 40 but also data lines 50 and touch lines 60. In this case, black matrix 220 is formed in a lattice shape as a whole.

Color filter 230 is formed for each plurality of pixels PX. Specifically, color filter 230 includes a red color filter, a blue color filter, and a green color filter respectively corresponding to red pixel PXR, green pixel PXG, and blue pixel PXB. Each color filter is formed in a region between black matrices 220 (i.e., an opening of black matrix 220).

Second substrate 200 includes a plurality of spacers 240. Spacer 240 is formed on second transparent substrate 210 so as to protrude toward first substrate 100. Spacer 240 is a columnar member for maintaining a constant distance (cell gap) between first substrate 100 and second substrate 200. By providing spacer 240, the thickness of liquid crystal layer 300 can be easily maintained constant. As an example, spacer 240 has a cylindrical trapezoidal shape and has a circular shape in a planar view at the upper end and the lower end. Spacer 240 is made of a resin material such as acrylic resin and can be deformed elastically. Spacer 240 can be formed in a predetermined pattern by photolithography, for example.

Figure 8:
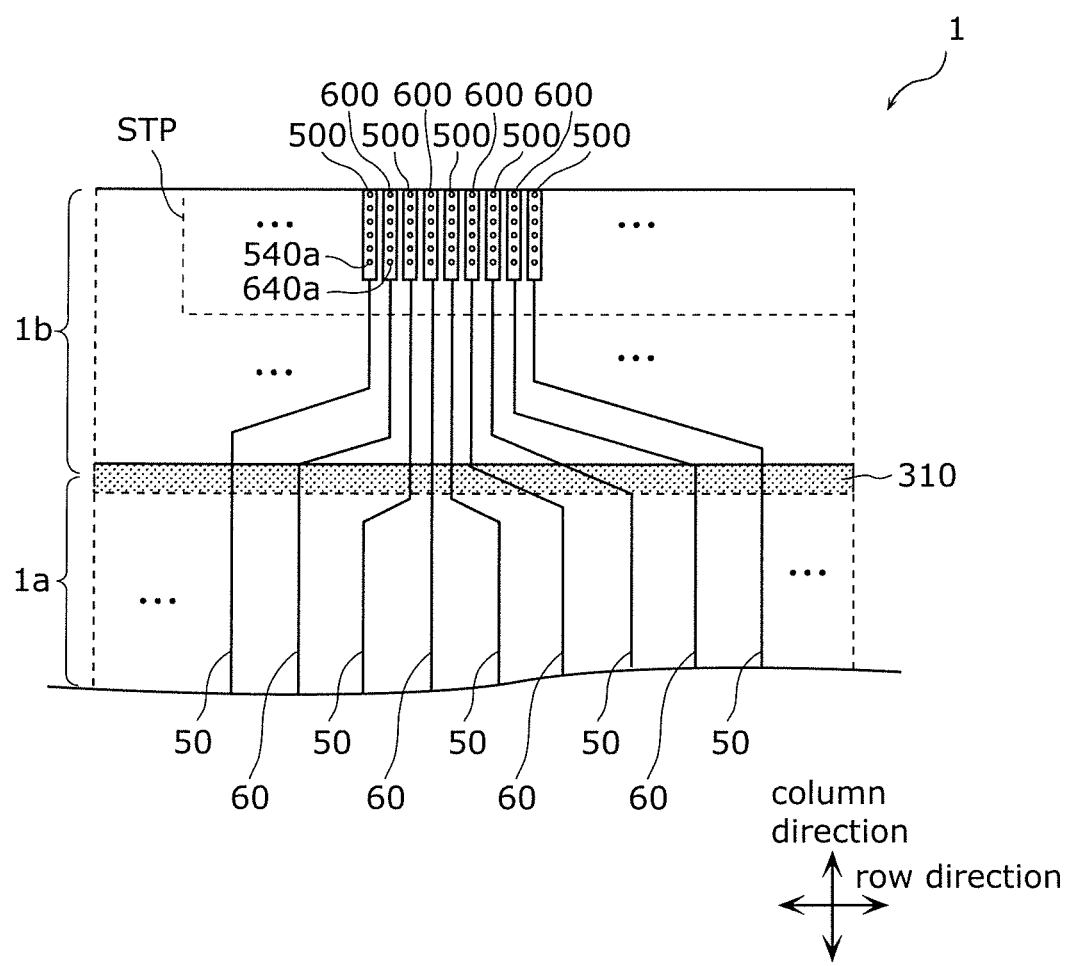
FIG. 8 is an enlarged plan view schematically illustrating a structure on a periphery of a frame region on the source terminal portion side in the liquid crystal display device according to the first exemplary embodiment.
Figure 9:
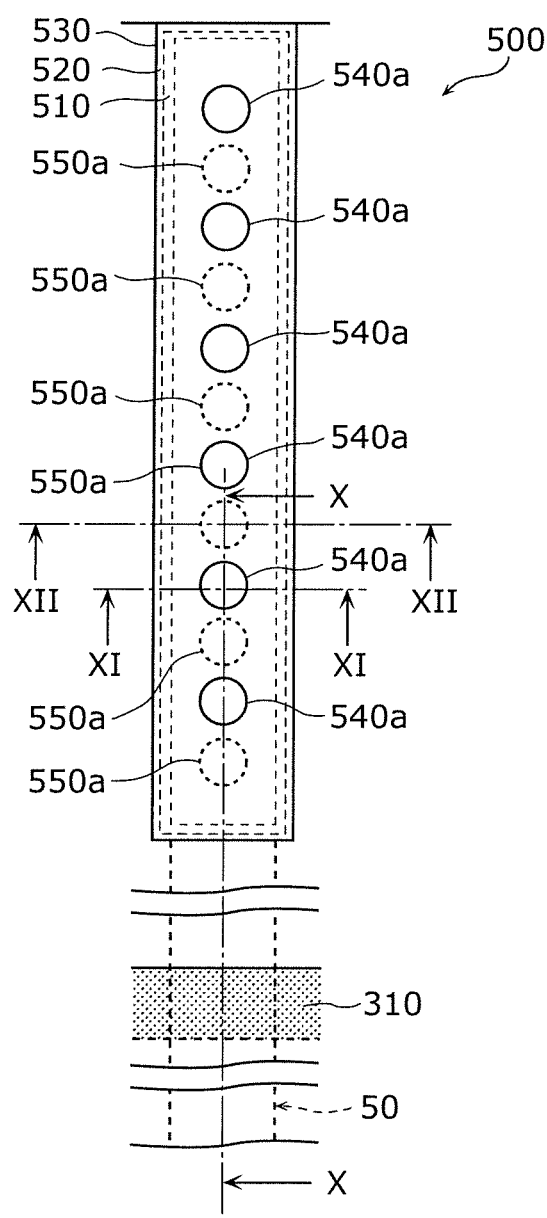
FIG. 9 is an enlarged plan view illustrating one source terminal in the source terminals of the liquid crystal display device according to the first exemplary embodiment.
Figure 10:
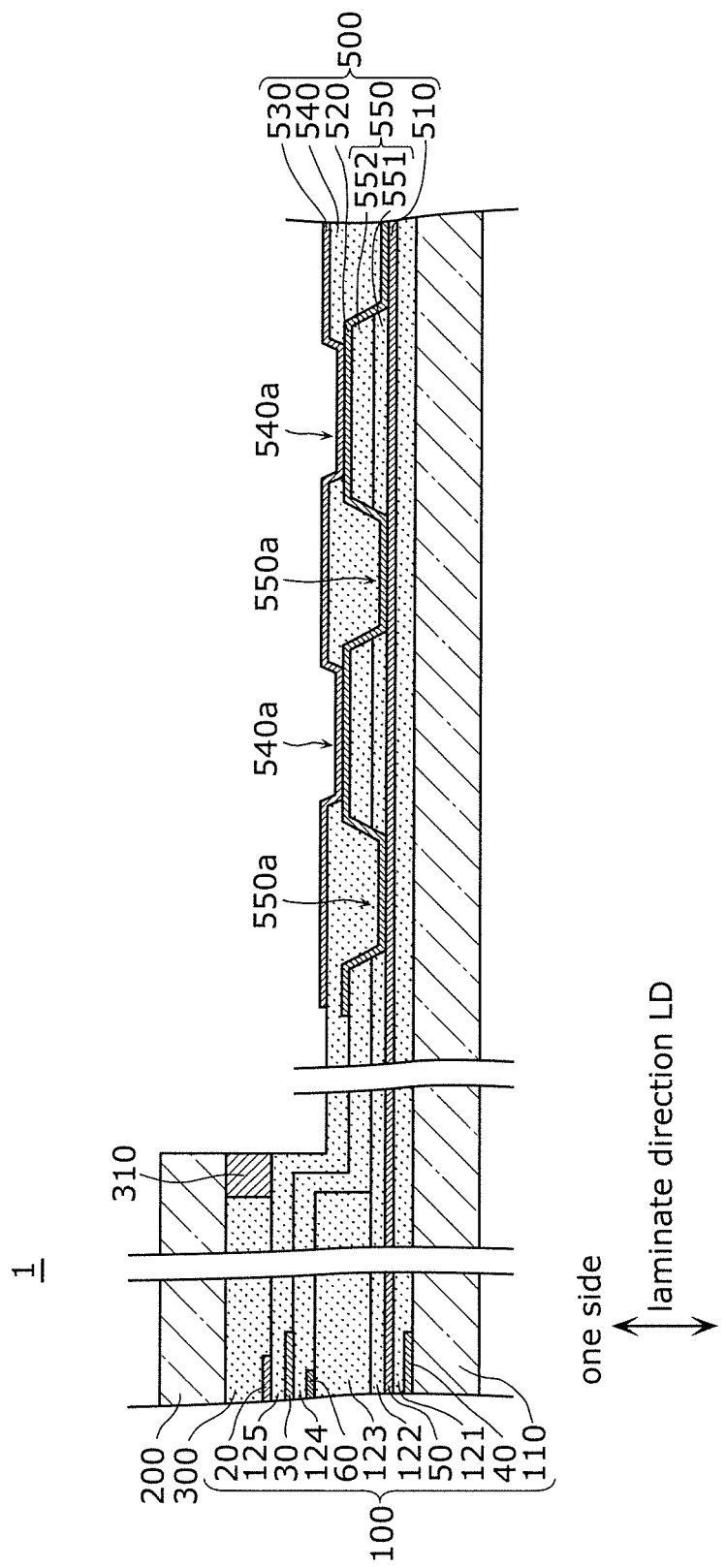
FIG. 10 is a sectional view of the liquid crystal display device according to the first exemplary embodiment taken along line X-X in FIG. 9.
Figure 11:
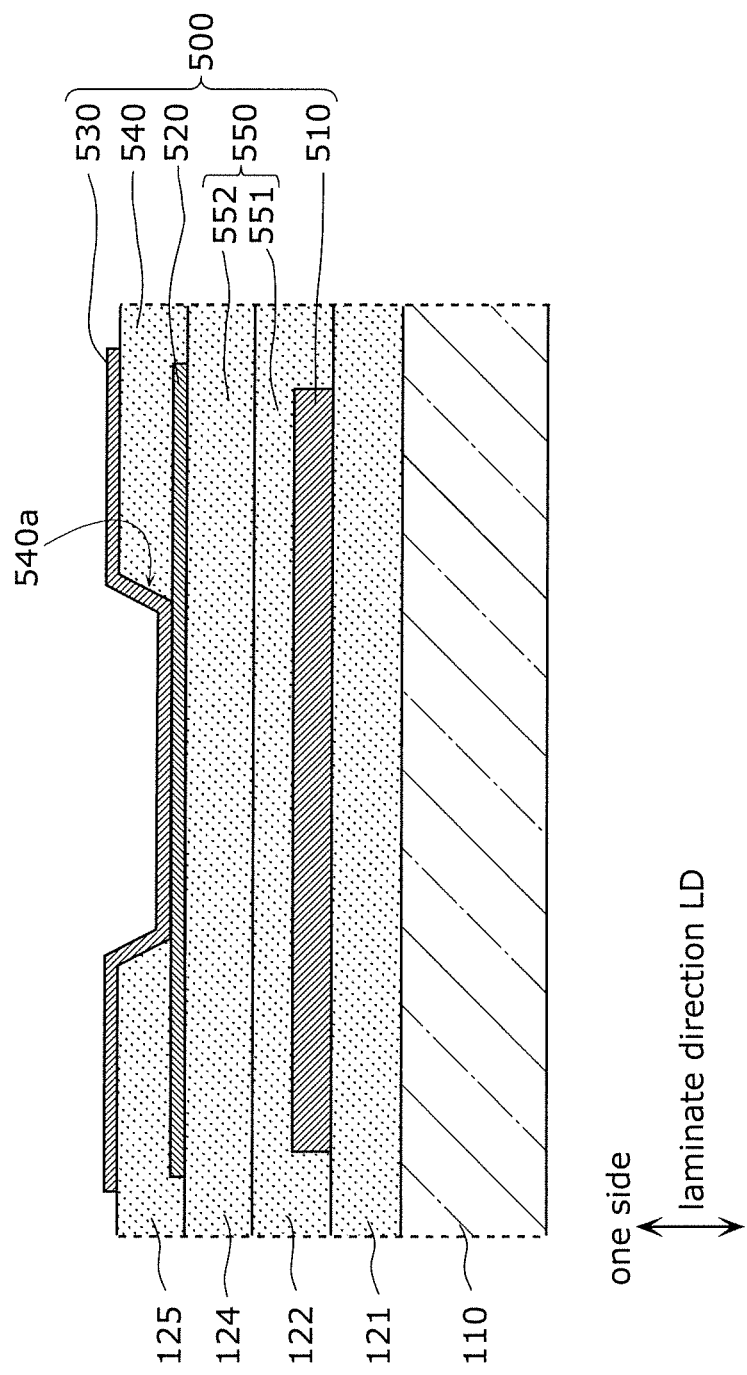
FIG. 11 is a sectional view of the liquid crystal display device according to the first exemplary embodiment taken along line XI-XI in FIG. 9.
Figure 12:
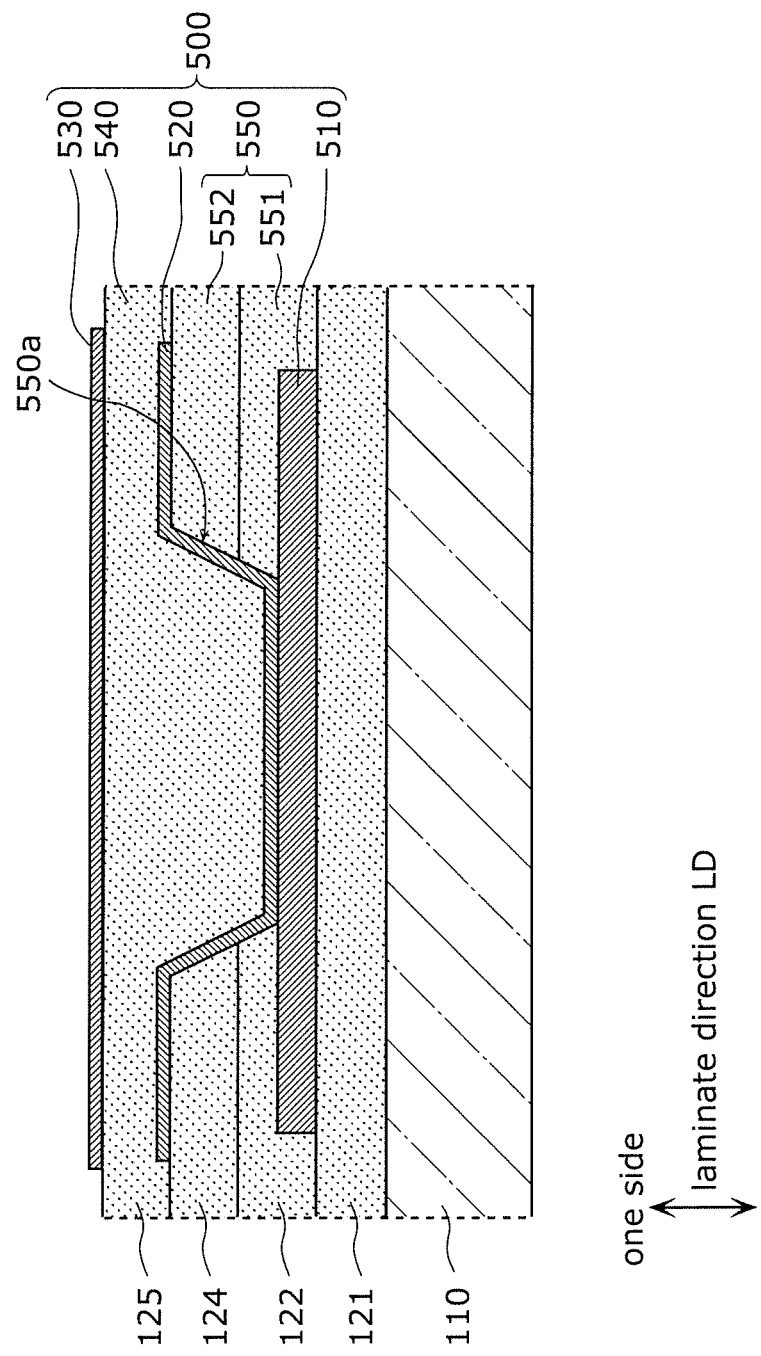
FIG. 12 is a sectional view of the liquid crystal display device according to the first exemplary embodiment taken along line XII-XII in FIG. 9.
Figure 13:
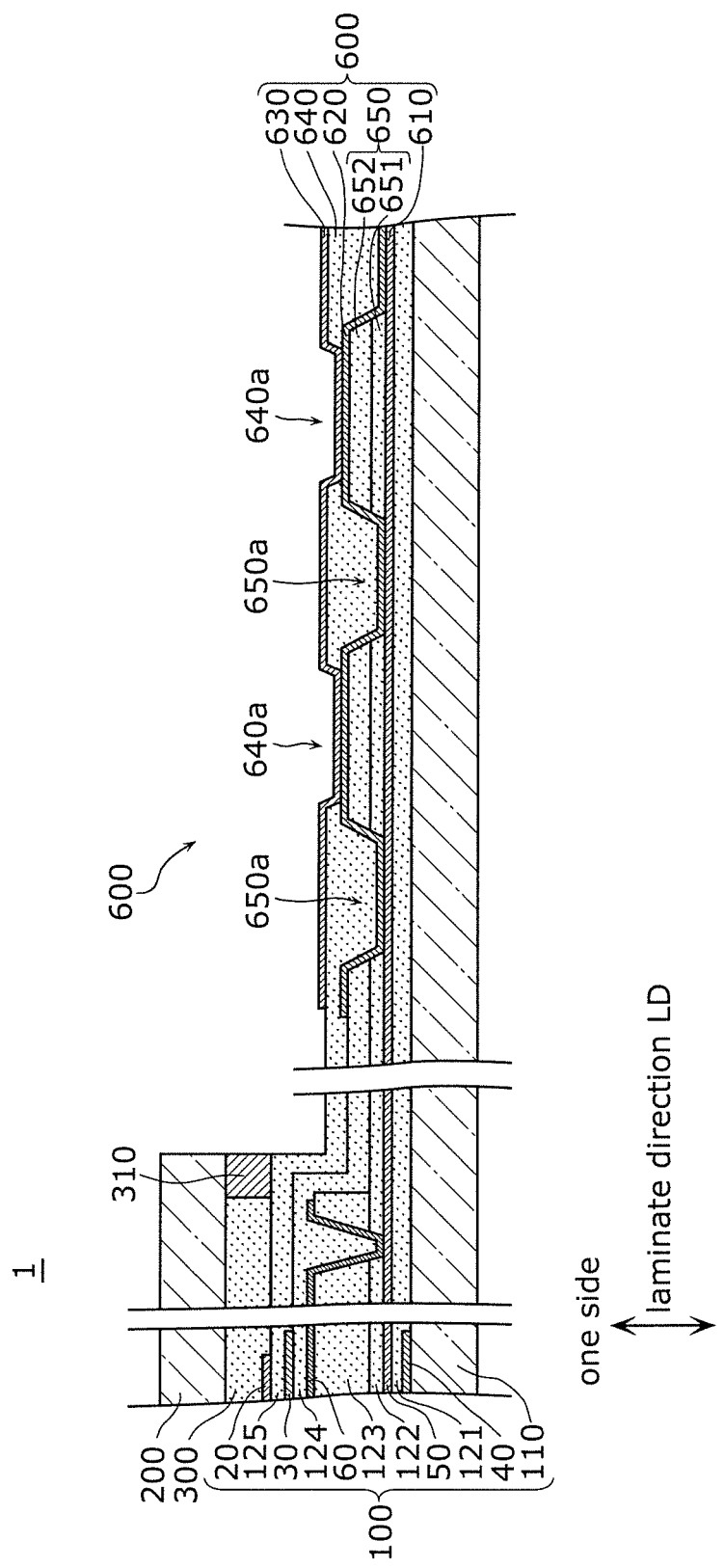
FIG. 13 is a sectional view of the periphery of the frame region in the liquid crystal display device when the periphery is cut along a cross-section passing through a touch terminal.

Next, a configuration of a peripheral portion of source terminal portion STP in frame region 1*b* of liquid crystal display device 1 will be described with reference to FIGS. 8 to 13. FIG. 8 is an enlarged plan view schematically illustrating a structure on a periphery of frame region 1*b* on the source terminal portion STP side in liquid crystal display device 1 according to the first exemplary embodiment. FIG. 9 is an enlarged plan view illustrating one source terminal 500 in source terminal portion STP in liquid crystal display device 1 according to the first exemplary embodiment. FIG. 10 is a sectional view taken along line X-X in FIG. 9, and FIG. 11 is a sectional view taken along line XI-XI in FIG. 9. FIG. 12 is a sectional view taken along line XII-XII in FIG. 9. FIG. 13 is a sectional view of a periphery of frame region 1*b* in the liquid crystal display device when the periphery is cut along a cross section passing through touch terminal 600. In FIGS. 10 to 13 and FIGS. 6 and 7, the layers with the same reference numeral are illustrated so as to have different thicknesses, but the thicknesses of the layers with the same reference numeral are actually the same.

As illustrated in FIG. 8, the plurality of data lines 50 and the plurality of touch lines 60 provided in image display region 1*a* are extended to frame region 1*b* and connected to source terminal portion STP. Due to being aggregated in source terminal portion STP, the plurality of data lines 50 and the plurality of touch lines 60 become relay wiring of oblique wiring near a seal part. As illustrated in FIG. 10, the seal part is a region where sealing member 310 for bonding first substrate 100 and second substrate 200 to seal liquid crystal layer 300 is formed.

A plurality of source terminals 500 are included in source terminal portion STP provided in frame region 1*b*. Each of the plurality of data lines 50 is connected to corresponding one of source terminals 500.

In the present exemplary embodiment, as described above, source terminal portion STP also includes a plurality of touch terminals 600. Each of the plurality of touch lines 60 is connected to corresponding one of touch terminals 600.

The exposed portion of each source terminal 500 and each touch terminal 600 is a conductive portion, and has a long shape in a planar view as illustrated in FIG. 10. In the present exemplary embodiment, the respective exposed portions of source terminals 500 and touch terminals 600 extend along the column direction of pixels PX.

As illustrated in FIGS. 9 to 12, each source terminal 500 has a layer structure made up of a plurality of layers. Specifically, source terminal 500 includes at least three conductive layers (electrode layers) of metal layer 510, first contact layer 520, and second contact layer 530, and at least one insulating layer of first interlayer insulating layer 540. Source terminal 500 in the present exemplary embodiment further includes second interlayer insulating layer 550.

Metal layer 510 is electrically connected to data line 50 provided in image display region 1*a*. As illustrated in FIG. 10, in the present exemplary embodiment, metal layer 510 is formed in the same layer as data line 50. That is, metal layer 510 is formed in the same layer as the source-drain electrode of transistor 10, and is formed in the second wiring layer (SD layer) where data line 50 and the source-drain electrode are formed. Therefore, metal layer 510, data line 50, and the source-drain electrode are formed by patterning the same metal film. Specifically, metal layer 510 is a copper wiring made of copper and is continuously formed with data line 50. As illustrated in FIG. 9, in frame region 1*b*, metal layer 510 is formed to extend along a longitudinal direction of source terminal 500.

As illustrated in FIGS. 10 to 12, first contact layer 520 is located above metal layer 510. In other words, first contact layer 520 is located closer to one side in lamination direction LD than metal layer 510. That is, first contact layer 520 is located on one side of metal layer 510 in lamination direction LD. First contact layer 520 is located between metal layer 510 and second contact layer 530. Specifically, first contact layer 520 is provided immediately above second interlayer insulating layer 550. Note that lamination direction LD is a direction in which a plurality of conductive layers such as metal layer 510 are laminated or a direction in which a plurality of interlayer insulating layers such as first interlayer insulating layer 540 are laminated. In other words, lamination direction LD is a direction perpendicular to a main surface of first transparent substrate 110.

First contact layer 520 is made of a transparent metal oxide such as ITO. In the present exemplary embodiment, first contact layer 520 is formed in the same layer as common electrode 30 made of ITO. Thus, first contact layer 520 and common electrode 30 are formed by patterning the same ITO film. As illustrated in FIG. 9, first contact layer 520 is formed in an island shape so as to extend in a rectangular band shape along the longitudinal direction of source terminal 500.

First contact layer 520 may be made of a semiconductor material doped with impurities. For example, when transistor 10 includes an $n^+$ layer made of the semiconductor material doped with impurities, by using this $n^+$ layer, first contact layer 520 can be made an $n^+$ layer. That is, first contact layer 520 and the $n^+$ layer of transistor 10 can be formed by patterning the same semiconductor film.

Second contact layer 530 is located above first contact layer 520. In other words, second contact layer 530 is located closer to one side in lamination direction LD than first contact layer 520. That is, second contact layer 530 is located on one side of first contact layer 520 in lamination direction LD. Specifically, second contact layer 530 is located above first interlayer insulating layer 540 on first contact layer 520. More specifically, second contact layer 530 is provided immediately above first interlayer insulating layer 540. In the present exemplary embodiment, second contact layer 530 is the uppermost layer of each source terminal 500 and is exposed to the outside. In other words, the surface of second contact layer 530 is an exposed portion of source terminal 500. For example, when the ACF is subjected to thermocompression bonding to first substrate 100 by COF, the ACF is connected to second contact layer 530.

Second contact layer 530 is made of a transparent metal oxide such as ITO. In the present exemplary embodiment, second contact layer 530 is formed in the same layer as pixel electrode 20 made of ITO. Hence second contact layer 530 and pixel electrode 20 are formed by patterning the same ITO film. As illustrated in FIG. 9, second contact layer 530 is formed in an island shape so as to extend in a rectangular band shape along the longitudinal direction of source terminal 500.

First interlayer insulating layer 540 is located above first contact layer 520. In other words, first interlayer insulating layer 540 is located closer to one side in lamination direction LD than first contact layer 520. That is, first interlayer insulating layer 540 is located on one side of first interlayer insulating layer 540 in lamination direction LD. Specifically, first interlayer insulating layer 540 is provided immediately above first contact layer 520 and is located between first contact layer 520 and second contact layer 530.

In the present exemplary embodiment, first interlayer insulating layer 540 is fifth insulating film 125 formed as the fifth insulating layer (UPS layer). First interlayer insulating layer 540 has a single-layer structure including one insulating film, but may have a multi-layer structure including a plurality of insulating films.

As illustrated in FIGS. 9 to 11, first interlayer insulating layer 540 has first through-hole 540*a*. First through-hole 540*a* is a contact hole for connecting first contact layer 520 and second contact layer 530. In the present exemplary embodiment, a plurality of first through-holes 540*a* are provided. Specifically, the plurality of first through-holes 540*a* are formed linearly along the longitudinal direction of the exposed portion of source terminal 500. As an example, as illustrated in FIGS. 8 and 9, one source terminal 500 has six first through-holes 540*a*.

Second interlayer insulating layer 550 is located above metal layer 510. Specifically, second interlayer insulating layer 550 is provided immediately above metal layer 510 and is located between metal layer 510 and first contact layer 520.

In the present exemplary embodiment, second interlayer insulating layer 550 is constituted by a plurality of laminated insulating films. Specifically, second interlayer insulating layer 550 has a two-layer structure, and includes lower insulating film 551 and upper insulating film 552 laminated on lower insulating film 551. In the present exemplary embodiment, lower insulating film 551 is second insulating film 122 formed as the second insulating layer (PAS), and upper insulating film 552 is fourth insulating film 124 formed as the fourth insulating layer (TPS layer). Second interlayer insulating layer 550 is constituted by a plurality of insulating films, but may have a single-layer structure including one insulating film. For example, second interlayer insulating layer 550 may be constituted by only either lower insulating film 551 or upper insulating film 552.

In addition, as illustrated in FIGS. 9, 10, and 12, second interlayer insulating layer 550 is provided with second through-hole 550a. Second through-hole 550a is a contact hole for connecting metal layer 510 and first contact layer 520. Second through-hole 550a is formed to penetrate lower insulating film 551 and upper insulating film 552. In the present exemplary embodiment, a plurality of second through-holes 550a are provided. Specifically, the plurality of second through-holes 550a are provided linearly along the longitudinal direction of the exposed portion of source terminal 500. As an example, as illustrated in FIGS. 8 and 9, one source terminal 500 is provided with six second through-holes 550a.

In the present exemplary embodiment, first through-hole 540a formed in first interlayer insulating layer 540 and second through-hole 550a formed in second interlayer insulating layer 550 have the same shape. Specifically, as illustrated in FIG. 9, in a top view of first substrate 100, each first through-hole 540a and each second through-hole 550a are circular with the same radius.

Further, first through-hole 540a and second through-hole 550a do not overlap with each other in the top view of first substrate 100. In this case, first through-hole 540a and second through-hole 550a are formed at positions separated from each other in the top view and do not partially overlap with each other. First through-holes 540a and second through-holes 550a are alternately formed one by one along the longitudinal direction of source terminal 500, but this is not restrictive. As thus described, by providing a plurality of first through-holes 540a and a plurality of second through-holes 550a, the reliability of electrical connection at source terminal 500 can be improved.

In source terminal 500 with such a lamination structure, metal layer 510, first contact layer 520, and second contact layer 530 are electrically connected to each other.

Specifically, as illustrated in FIGS. 10 and 11, metal layer 510 and first contact layer 520 are electrically connected through second through-hole 550a formed in second interlayer insulating layer 550. In the present exemplary embodiment, first contact layer 520 is in contact with metal layer 510 at least in second through-hole 550a.

Also, as illustrated in FIGS. 10 and 12, first contact layer 520 and second contact layer 530 are electrically connected through first through-hole 540a formed in first interlayer insulating layer 540. In the present exemplary embodiment, second contact layer 530 is in contact with first contact layer 520 at least in first through-hole 540a.

As illustrated in FIG. 10, first contact layer 520 is thinner than second interlayer insulating layer 550 and has a constant thickness. First contact layer 520 is formed on second interlayer insulating layer 550 and is formed along the inner side surface and the bottom surface in second through-hole 550a of second interlayer insulating layer 550. Specifically, first contact layer 520 is continuously formed along the top surface of second interlayer insulating layer 550, the side surface of second interlayer insulating layer 550 in second through-hole 550a, and metal layer 510 on the bottom surface of second through-hole 550a. First contact layer 520 is a single ITO film having a predetermined shape, and is continuously formed along the longitudinal direction of source terminal 500 so as to cover the surface of metal layer 510 exposed from each of the plurality of second through-holes 550a. As illustrated in FIGS. 9 and 11, a width of first contact layer 520 is larger than a width of metal layer 510, but the width of first contact layer 520 may be smaller than the width of metal layer 510.

As illustrated in FIG. 10, second contact layer 530 is thinner than first interlayer insulating layer 540 and has a constant thickness. Second contact layer 530 is formed on first interlayer insulating layer 540 and is formed along the inner side surface and the bottom surface in first through-hole 540a of first interlayer insulating layer 540. Specifically, second contact layer 530 is continuously formed along the top surface of first interlayer insulating layer 540, the side surface of first interlayer insulating layer 540 in first through-hole 540a, and the upper surface of first contact layer 520 on the bottom surface of first through-hole 540a. Second contact layer 530 is one ITO film having a predetermined shape, and is continuously formed along the longitudinal direction of source terminal 500 so as to cover the surface of first through-hole 540a exposed from each of the plurality of first through-holes 540a. As illustrated in FIGS. 9 and 11, a width of second contact layer 530 is larger than a width of first contact layer 520, but the width of second contact layer 530 may be smaller than the width of first contact layer 520.

Next, touch terminal 600 will be described. As illustrated in FIG. 13, similarly to source terminal 500, each touch terminal 600 has a layer structure made up of a plurality of layers. Specifically, touch terminal 600 has the same layer structure as source terminal 500. Accordingly, touch terminal 600 includes at least three conductive layers of metal layer 610, first contact layer 620, and second contact layer 630, and two insulating layers of first interlayer insulating layer 640 and second interlayer insulating layer 650. First interlayer insulating layer 640 is formed with first through-hole 640a, and second interlayer insulating layer 650 is formed with second through-hole 650a. Second interlayer insulating layer 650 has a two-layer structure of lower insulating film 651 and upper insulating film 652.

The configuration of metal layer 610, first contact layer 620, second contact layer 630, first interlayer insulating layer 640, second interlayer insulating layer 650, first through-hole 640a, and second through-hole 650a in touch terminal 600 is the same as the configuration of metal layer 510, first contact layer 520, second contact layer 530, first interlayer insulating layer 540, second interlayer insulating layer 550, first through-hole 540a, and second through-hole 550a in source terminal 500.

Each touch terminal 600 is connected to corresponding one of touch lines 60. Specifically, metal layer 610 of touch terminal 600 and touch line 60 are connected. Here, since metal layer 610 of touch terminal 600 is formed in the same layer as the wiring layer where the source-drain electrode of transistor 10 is formed, metal layer 610 is formed in a different layer from the wiring layer where touch line 60 is formed. Therefore, as illustrated in FIG. 13, touch line 60 and metal layer 610 are connected through a through-hole penetrating second insulating film 122 and third insulating film 123.

Note that the form of connection between touch line 60 and metal layer 610 of touch terminal 600 is not limited to this. For example, a first relay through-hole may be formed in fourth insulating film 124 and fifth insulating film 125 on touch line 60 to connect touch line 60 and first relay wiring formed in the same layer as pixel electrode 20, and then another second relay through-hole may be formed in second insulating film 122, third insulating film 123, fourth insulating film 124, and fifth insulating film 125 to connect the first relay wiring and metal layer 610 of touch terminal 600. The first relay through-hole and the second relay through-hole can be formed by an existing photolithography process at the time of manufacturing first substrate 100. Accordingly, the first relay through-hole and the second relay through-hole can be formed without separately adding a photolithography process only for connecting touch line 60 and metal layer 610 (i.e., without increasing the number of masks).

Figure 14:
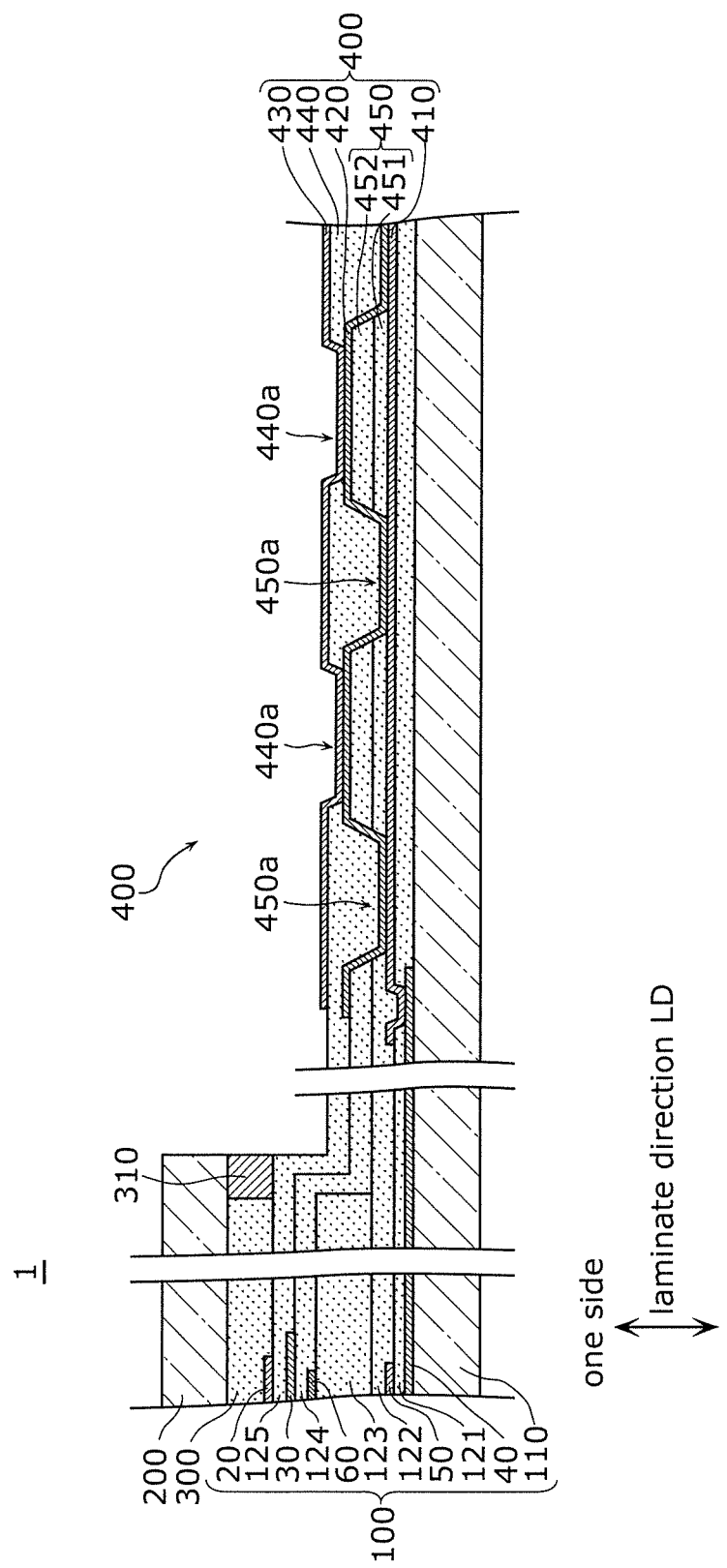
FIG. 14 is a sectional view of the periphery of the frame region in the liquid crystal display device when the periphery is cut along a cross-section passing through a gate terminal.

Next, gate terminal 400 illustrated in FIG. 2 will be described with reference to FIG. 14 FIG. 14 is a sectional view of the periphery of frame region 1b in the liquid crystal display device when the periphery is cut along a cross section passing through gate terminal 400.

As illustrated in FIG. 14, similarly to source terminal 500, each gate terminal 400 has a layer structure made up of a plurality of layers. Specifically, gate terminal 400 has the same layer structure as source terminal 500. Thus, gate terminal 400 includes at least three conductive layers of metal layer 410, first contact layer 420, and second contact layer 430, and two insulating layers of first interlayer insulating layer 440 and second interlayer insulating layer 450. First interlayer insulating layer 440 is provided with first through-hole 440a, and second interlayer insulating layer 450 is provided with second through-hole 450a. Note that second interlayer insulating layer 450 has a two-layer structure of lower insulating film 451 and upper insulating film 452.

The configuration of metal layer 410, first contact layer 420, second contact layer 430, first interlayer insulating layer 440, second interlayer insulating layer 450, first through-hole 440a, and second through-hole 450a in gate terminal 400 is the same as the configuration of metal layer 510, first contact layer 520, second contact layer 530, first interlayer insulating layer 540, second interlayer insulating layer 550, first through-hole 540a, and second through-hole 550a in source terminal 500.

Each gate terminal 400 is connected to corresponding one of gate lines 40. Specifically, metal layer 410 of gate terminal 400 and gate line 40 are connected. Here, since metal layer 410 of gate terminal 400 is formed in the same layer as the wiring layer where the source-drain electrode of transistor 10 is formed, metal layer 410 is formed in a different layer from the wiring layer where gate line 40 is formed. Therefore, as illustrated in FIG. 14, gate line 40 and metal layer 610 are connected through a through-hole penetrating first insulating film 121.

The method for connecting gate line 40 and metal layer 410 of gate terminal 400 is not limited to this, but through-holes and relay wiring formed in a different layer may be used to connect gate line 40 and metal layer 410 of gate terminal 400.

Figure 15:
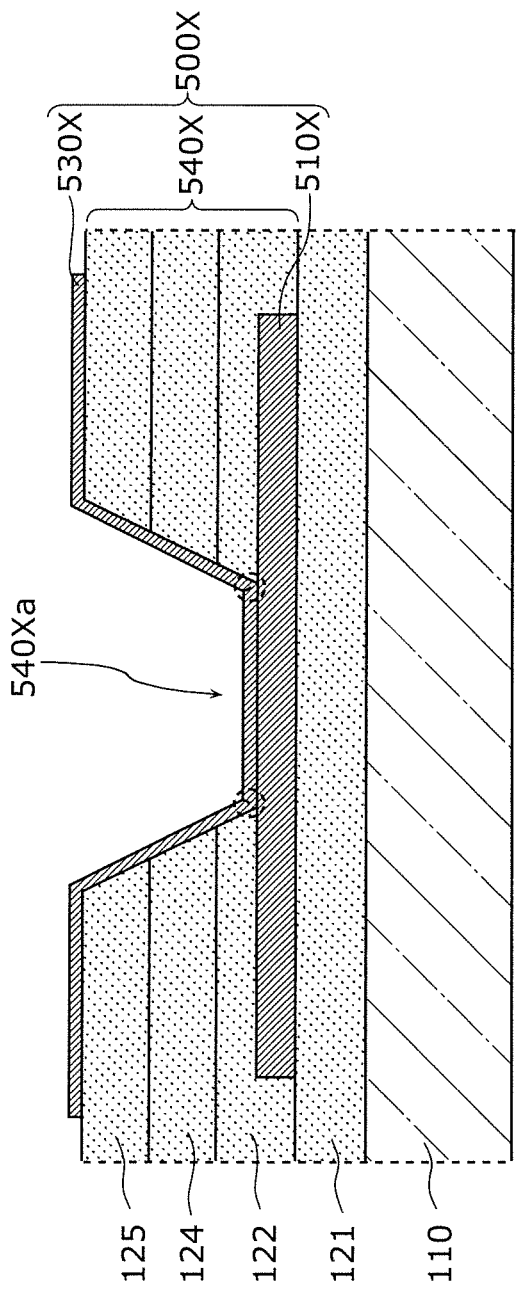
FIG. 15 is a sectional view of a source terminal in a liquid crystal display device of a comparative example.

Next, functions and effects of first substrate 100 (active matrix substrate) and liquid crystal display device 1 in the present exemplary embodiment will be described with reference to a comparative example in FIG. 15. FIG. 15 is a sectional view of source terminal 500X in a liquid crystal display device of a comparative example.

As illustrated in FIG. 15, source terminal 500X in the liquid crystal display device of the comparative example includes metal layer 510X, interlayer insulating layer 540X located on metal layer 510X, and contact layer 530X on interlayer insulating layer 540X. Metal layer 510X is formed in the same layer as the data line and is made of copper, for example. Interlayer insulating layer 540X is made up of a first insulating layer that is the same layer as second insulating film 122, a second insulating layer that is the same layer as fourth insulating film 124, and a third insulating layer that is the same layer as fifth insulating film 125. Contact layer 530X is formed in the same layer as pixel electrode 20 made of an ITO film.

In source terminal 500X illustrated in FIG. 15, for protecting metal layer 510X, through-hole 540Xa is formed in interlayer insulating layer 540X, and metal layer 510X is covered with contact layer 530X made of an ITO film. That is, contact layer 530X is formed as a cover layer on metal layer 510X. Contact layer 530X is formed on the inner side surface and the bottom surface in through-hole 540Xa. Metal layer 510X and contact layer 530X are connected through through-hole 540Xa formed in interlayer insulating layer 540X.

However, in source terminal 500X illustrated in FIG. 15, a thickness of contact layer 530X constituted by the ITO film is smaller than a thickness of interlayer insulating layer 540X, so that film stress concentrates at a corner portion (a portion surrounded by a broken-line circle in FIG. 15) which is a boundary portion between the inner side surface and the bottom surface in through-hole 540Xa, and a crack occurs in contact layer 530X. Thus, water and oxygen enter from a crack occurrence location in contact layer 530X. Copper constituting metal layer 510X does not corrode alone, but a battery reaction occurs due to contact with water and oxygen. As a result, copper corrodes. That is, when water and oxygen enter from the crack occurrence location in contact layer 530X, metal layer 510X corrodes.

As thus described, in source terminal 500X illustrated in FIG. 15, oxygen and water enter through the crack that occurs in contact layer 530X, and metal layer 510X corrodes from the crack occurrence location. This corrosion proceeds isotropically expanding to the inside of metal layer 510X with the crack occurrence location as a starting point. As a result, the reliability of the electrical connection at source terminal 500X deteriorates.

Therefore, it is conceivable to increase a thickness of contact layer 530X so as to prevent a crack from occurring in contact layer 530X. However, the thickness of contact layer 530X cannot be simply increased for the following reason. Contact layer 530X constituted by the ITO film is formed by sputtering, for example, but when the ITO film is crystallized at the time of the film formation, it becomes difficult to pattern the ITO film by wet etching. Hence the ITO film is desirably in an amorphous state after the film formation. In this case, when the ITO film is formed to have a large thickness so as to prevent a crack from occurring in contact layer 530X, the ITO film is crystallized. Thus, for forming an ITO film in an amorphous state in order to easily pattern the ITO film by wet etching, the ITO film needs to be formed to have a small thickness. For example, for forming an ITO film in an amorphous state, the thickness of the ITO film needs to be 100 nm or less. As thus described, the thickness of contact layer 530X cannot be increased, and the thickness of contact layer 530X becomes smaller than that of interlayer insulating layer 540X.

Further, it is conceivable to reduce the angle of inclination of the inner side surface in through-hole 540Xa so as to prevent a crack from occurring in contact layer 530X. In other words, it is conceivable to lessen the film stress at the boundary portion (corner portion) between the inner side surface and the bottom surface in through-hole 540Xa by reducing the angle of inclination of the inner side surface in through-hole 540Xa. However, when the angle of inclination of the inner side surface in through-hole 540Xa is reduced, an opening diameter at the upper end of through-hole 540Xa is increased, and it is thus not possible to simply reduce the angle of inclination of the inner side surface in through-hole 540Xa.

As thus described, with the structure of source terminal 500X in the comparative example, it is difficult to inhibit corrosion of metal layer 510X. The touch terminal and the gate terminal having the same configuration as source terminal 500X have the same problem.

In contrast, source terminal 500 in first substrate 100 and liquid crystal display device 1 according to the present exemplary embodiment includes metal layer 510, first contact layer 520 electrically connected to metal layer 510, first interlayer insulating layer 540 located above first contact layer 520, and second contact layer 530 electrically connected to first contact layer 520 through first through-hole 540a formed in first interlayer insulating layer 540.

That is, in source terminal 500 in the present exemplary embodiment, as compared to source terminal 500X in the comparative example, first contact layer 520 patterned separately from the second contact layer 530 is inserted between metal layer 510 and second contact layer 530.

First contact layer 520 added between metal layer 510 and second contact layer 530 is electrically connected to second contact layer 530 located on first contact layer 520 through first through-hole 540a of first interlayer insulating layer 540 located between first contact layer 520 and second contact layer 530.

With this configuration, even when film stress concentrates on second contact layer 530 at the boundary portion (corner portion) between the inner side surface and the bottom surface in first through-hole 540a, and even if a crack occurs in second contact layer 530 and water and oxygen enter the inside through the crack, the water and oxygen can be blocked by first contact layer 520 located between second contact layer 530 and metal layer 510. Thereby, water and oxygen can be prevented from reaching metal layer 510, so that corrosion of metal layer 510 can be inhibited.

In the present exemplary embodiment, source terminal 500 further includes second interlayer insulating layer 550 located between metal layer 510 and first contact layer 520. First contact layer 520 is electrically connected to metal layer 510 through second through-hole 550a formed in second interlayer insulating layer 550.

That is, first contact layer 520 located between metal layer 510 and second contact layer 530 is electrically connected to metal layer 510 located below first contact layer 520 through second through-hole 550a of second interlayer insulating layer 550 located between first contact layer 520 and metal layer 510. Specifically, first contact layer 520 is in contact with metal layer 510 at least in second through-hole 550a.

With this configuration, a portion where metal layer 510 and first contact layer 520 are connected through first through-hole 540a and a portion where first contact layer 520 and second contact layer 530 are connected through second through-hole 550a can be separated by upper and lower layers. Thereby, a location where a crack can occur in first contact layer 520 (a corner portion of first through-hole 540a) and a location where a crack can occur in second contact layer 530 (a corner portion of second through-hole 550a) can be made different by the upper and lower layers. Hence water and oxygen can further be prevented from reaching metal layer 510, so that the occurrence of corrosion of metal layer 510 can further be retarded. It is thus possible to effectively inhibit the corrosion of metal layer 510.

In the present exemplary embodiment, second interlayer insulating layer 550 is made up of a plurality of laminated insulating films.

With this configuration, even when water and oxygen enter the inside, it is possible to further prevent the water and oxygen from reaching metal layer 510. Hence it is possible to further inhibit the corrosion of metal layer 510.

In the present exemplary embodiment, first through-hole 540a and second through-hole 550a do not overlap with each other in the top view of first substrate 100.

With this configuration, the portion where metal layer 510 and first contact layer 520 are connected through first through-hole 540a and the portion where first contact layer 520 and second contact layer 530 are connected through second through-hole 550a can be separated in the horizontal plane of first substrate 100. Thereby, the location where a crack can occur in first contact layer 520 (a corner portion of first through-hole 540a) and the location where a crack can occur in second contact layer 530 (a corner portion of second through-hole 550a) can be disposed at different positions in the horizontal plane. It is thus possible to further prevent water and oxygen from reaching metal layer 510 and further effectively inhibit the corrosion of metal layer 510.

In particular, in the horizontal direction of first substrate 100, the distance can be easily obtained as compared to the thickness direction of first substrate 100, so that the portion where metal layer 510 and first contact layer 520 are connected and the portion where first contact layer 520 and second contact layer 530 are connected can be further separated as compared to the case where the portions are separated by the upper and lower layers. In other words, the distance between the location where a crack can occur in first contact layer 520 and the location where a crack can occur in second contact layer 530 can be further increased. Hence the occurrence of corrosion of metal layer 510 can be greatly retarded, so that the corrosion of metal layer 510 can be inhibited effectively.

Moreover, in the present exemplary embodiment, as described above, the portion where metal layer 510 and first contact layer 520 are connected through first through-hole 540a and the portion where first contact layer 520 and second contact layer 530 are connected through second through-hole 550a are separated by the upper and lower layers. Therefore, by first through-hole 540a and second through-hole 550a being configured not to overlap with each other in the top view of first substrate 100, a depth of first through-hole 540a and a depth of second through-hole 550a can be made small as compared to that of through-hole 540Xa of source terminal 500X illustrated in FIG. 15. It is thereby possible to easily lessen the film stress at the boundary portion (corner portion) between the inner side surface and the bottom surface in each of first through-hole 540a and second through-hole 550a. Accordingly, the occurrence of a crack in first contact layer 520 and second contact layer 530 itself can be prevented, so that the corrosion of metal layer 510 can be inhibited significantly.

Figure 16:
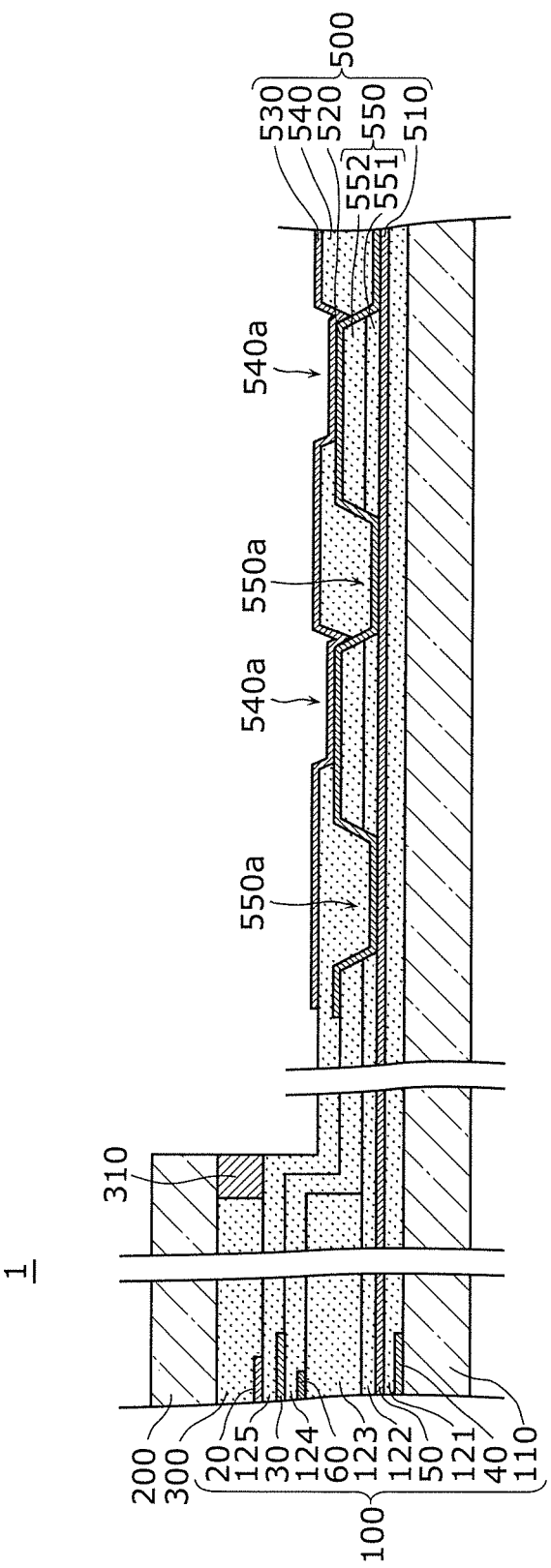
FIG. 16 is a sectional view illustrating another configuration of the liquid crystal display device according to the first exemplary embodiment.

In the present exemplary embodiment, as illustrated in FIG. 10, first through-hole 540a and second through-hole 550a are further separated from each other so that first through-hole 540a and second through-hole 550a do not interfere with each other. However, as illustrated in FIG. 16, first through-hole 540a and second through-hole 550a may interfere with each other to a certain degree unless an edge of first through-hole 540a and an edge of second through-hole 550a overlap with each other.

As described above, according to first substrate 100 and liquid crystal display device 1 in the present exemplary embodiment, it is possible to inhibit the corrosion of metal layer 510 of source terminal 500 electrically connected to data line 50 in image display region 1a.

Note that touch terminal 600 and gate terminal 400 having the same structure as source terminal 500 also have the same effect as source terminal 500.

(Modification of First Exemplary Embodiment)

Figure 17:
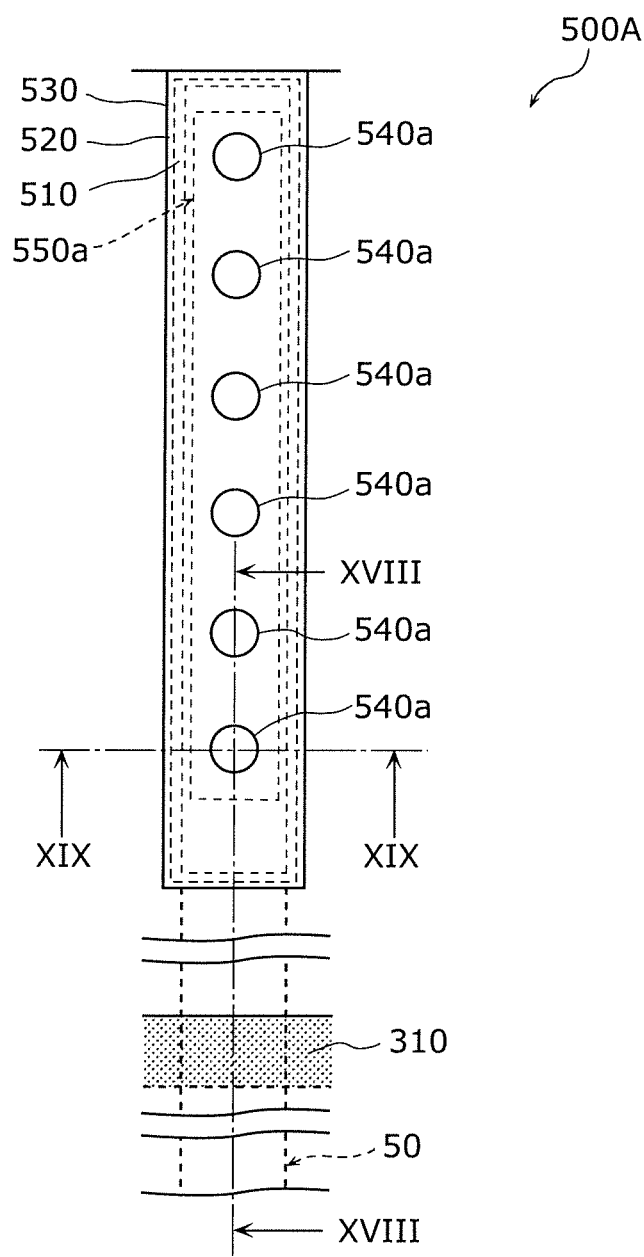
FIG. 17 is an enlarged plan view illustrating one source terminal in a liquid crystal display device according to a modification of the first exemplary embodiment.
Figure 18:
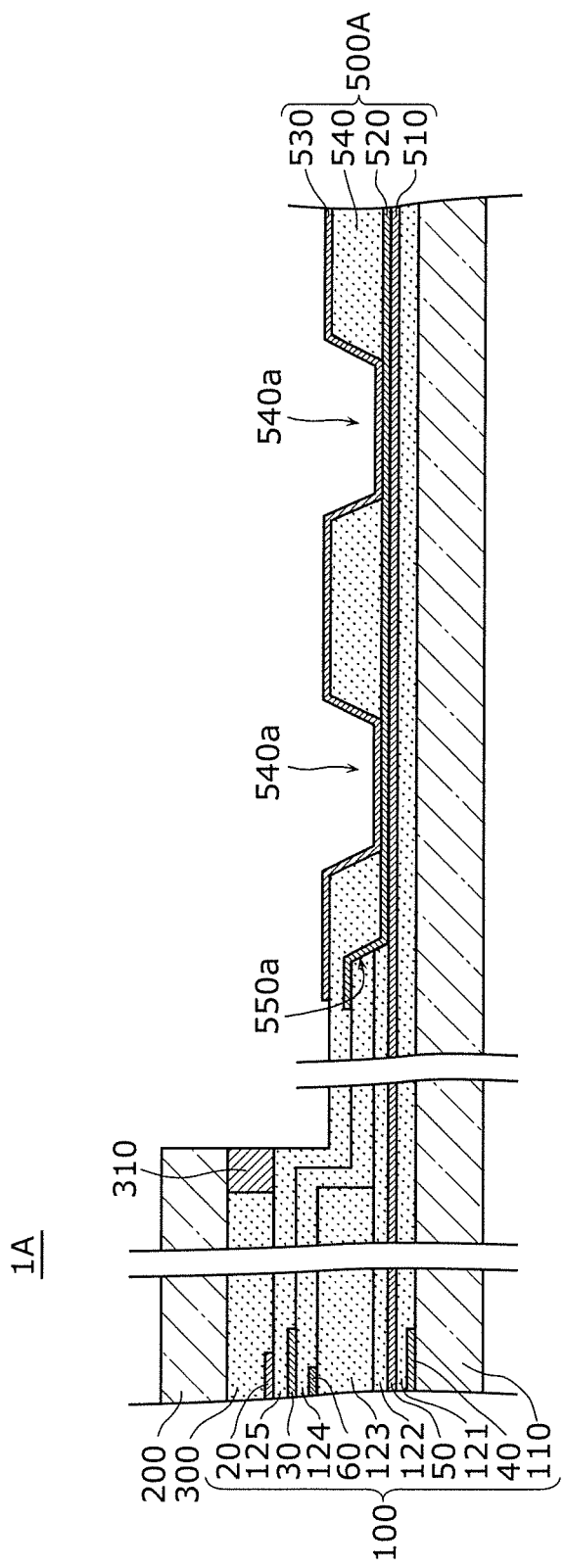
FIG. 18 is a sectional view of the liquid crystal display device according to the modification of the first exemplary embodiment taken along line XVIII-XVIII in FIG. 17.
Figure 19:
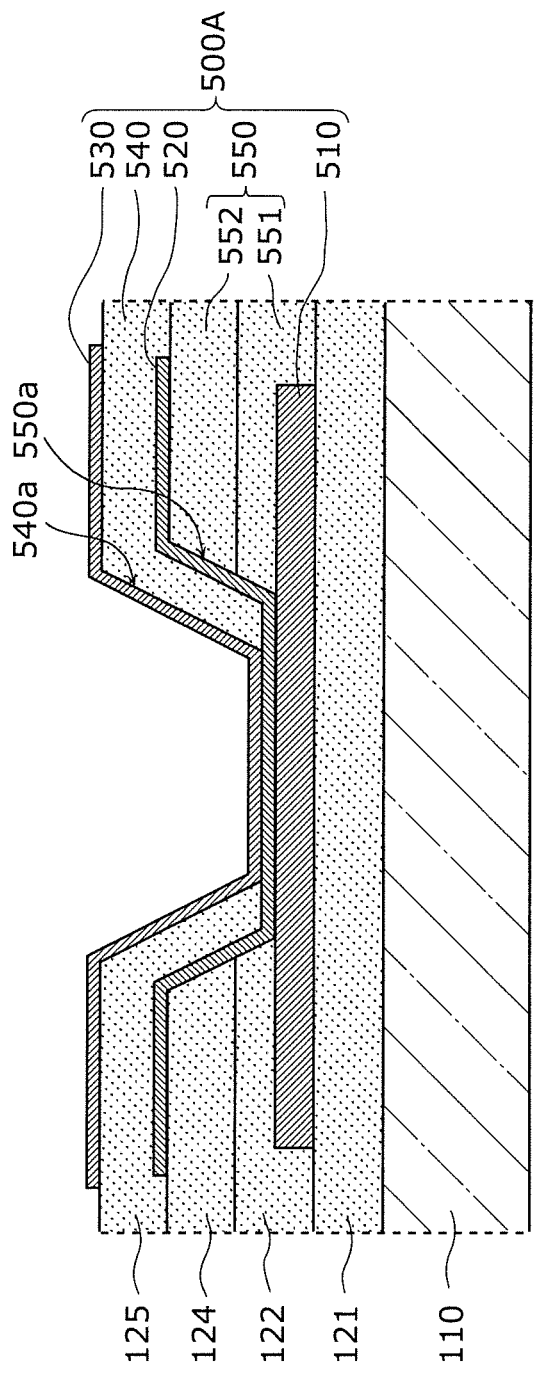
FIG. 19 is a sectional view of the liquid crystal display device according to the modification of the first exemplary embodiment taken along line XIX-XIX in FIG. 17.

Next, a modification of the first exemplary embodiment will be described with reference to FIGS. 17 to 19. FIG. 17 is an enlarged plan view illustrating one source terminal 500A in liquid crystal display device 1A according to the modification of the first exemplary embodiment. FIG. 18 is a sectional view taken along line XVIII-XVIII in FIG. 17, and FIG. 19 is a sectional view taken along line XIX-XIX in FIG. 17.

Liquid crystal display device 1A according to the present modification and liquid crystal display device 1 according to the first exemplary embodiment are different in layout of first through-hole 540a and second through-hole 550a in source terminal 500A. Specifically, in liquid crystal display device 1 according to the first exemplary embodiment, first through-hole 540a and second through-hole 550a in source terminal 500 do not overlap with each other in the top view of first substrate 100, whereas in liquid crystal display device 1A according to the present modification, as illustrated in FIGS. 17 to 19, first through-hole 540a and second through-hole 550a in source terminal 500A overlap with each other in the top view of first substrate 100.

Specifically, as illustrated in FIG. 17, source terminal 500A in the present modification includes a plurality of first through-holes 540a in one second through-hole 550a in the top view of first substrate 100. The plurality of first through-holes 540a located in one second through-hole 550a are arranged in a longitudinal direction of source terminal 500A. In the present modification, each source terminal 500A has only one second through-hole 550a, and is formed in a rectangular band shape along the longitudinal direction of source terminal 500A in the top view of first substrate 100.

In the present modification, in the sectional view of first substrate 100, a width of second through-hole 550a is larger than a width of first through-hole 540a. In other words, a dimension of second through-hole 550a in a direction orthogonal to the longitudinal direction of source terminal 500A is larger than a dimension of first through-hole 540a in the direction orthogonal to the longitudinal direction of source terminal 500A. Therefore, as illustrated in FIG. 19, first interlayer insulating layer 540 is embedded between first contact layer 520 formed on the inner side surface of second through-hole 550a and second contact layer 530 formed on the inner side surface of first through-hole 540a.

Further, in the present modification, it is structured such that metal layer 510, first contact layer 520, and second contact layer 530 are laminated in contact with each other in a portion where first through-hole 540a and second through-hole 550a overlap with each other.

As described above, source terminal 500A according to liquid crystal display device 1 in the present modification has the same configuration as that of source terminal 500 in the first exemplary embodiment, and thus has the same effects as those in the first exemplary embodiment.

In particular, in the present exemplary embodiment, even when first through-hole 540a and second through-hole 550a overlap with each other in the top view of first substrate 100, the width of second through-hole 550a is larger than the width of first through-hole 540a.

With this configuration, a portion where metal layer 510 and first contact layer 520 are connected through first through-hole 540a and a portion where first contact layer 520 and second contact layer 530 are connected through second through-hole 550a can be separated by upper and lower layers. Thereby, even when first through-hole 540a and second through-hole 550a overlap with each other, the location where a crack can occur in first contact layer 520 (a corner portion of first through-hole 540a) and the location where a crack can occur in second contact layer 530 (a corner portion of second through-hole 550a) can be made different by the upper and lower layers. Hence it is possible to prevent water and oxygen from reaching metal layer 510. Hence the occurrence of corrosion of metal layer 510 can be retarded, so that the corrosion of metal layer 510 can be inhibited.

Note that the present modification can also be applied to the touch terminal and the gate terminal.

Second Exemplary Embodiment

Figure 20:
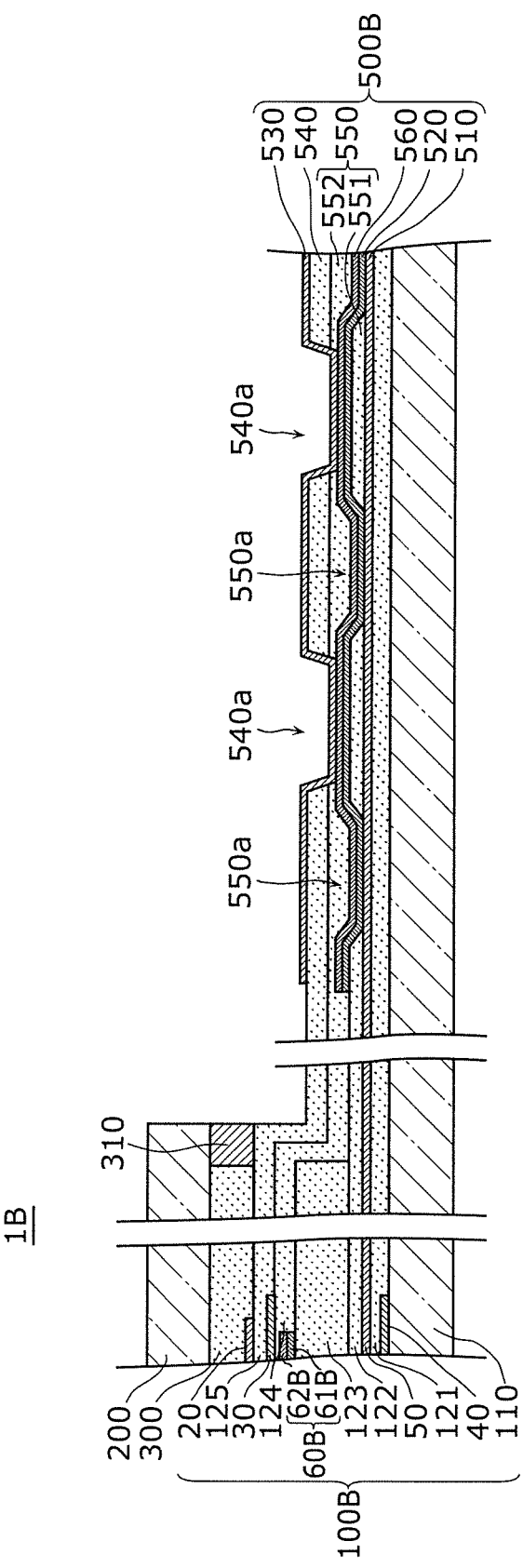
FIG. 20 is a sectional view illustrating a configuration of a liquid crystal display device according to a second exemplary embodiment.

Next, the second exemplary embodiment will be described with reference to FIG. 20. FIG. 20 is a sectional view illustrating a configuration of liquid crystal display device 1B according to the second exemplary embodiment. FIG. 20 illustrates a cross section of a portion corresponding to FIG. 10 of the first exemplary embodiment.

As illustrated in FIG. 20, liquid crystal display device 1B according to the present exemplary embodiment is different from liquid crystal display device 1 according to the first exemplary embodiment in a configuration of touch line 60B. Specifically, in liquid crystal display device 1B according to the present exemplary embodiment, touch line 60B has a two-layer structure and includes first conductive film 61 and second conductive film 62 laminated on first conductive film 61. First conductive film 61 is made of a transparent metal oxide such as ITO, and second conductive film 62 is made of a metal material such as copper. In the present exemplary embodiment, first conductive film 61 is an ITO film, and second conductive film 62 is a copper film. First conductive film 61 and second conductive film 62 have the same shape and are patterned simultaneously.

Further, liquid crystal display device 1B according to the present exemplary embodiment is also different from liquid crystal display device 1 according to the first exemplary embodiment in a configuration of source terminal 500B. Specifically, source terminal 500B in liquid crystal display device 1B according to the present exemplary embodiment is configured to have second metal layer 560 between first contact layer 520 and second contact layer 530 while metal layer 510 is the first metal layer in source terminal 500 in liquid crystal display device 1 according to the first exemplary embodiment.

Second metal layer 560 is in contact with second contact layer 530 at least in first through-hole 540a. In the present exemplary embodiment, second metal layer 560 is in contact with not only second contact layer 530 but also first contact layer 520 in first through-hole 540a. Specifically, in first through-hole 540a, first contact layer 520, second metal layer 560, and second contact layer 530 have a three-layer structure where the layers are in contact with each other.

Second metal layer 560 is in contact with first contact layer 520 at least in second through-hole 550a. Specifically, in second through-hole 550a, metal layer 510, first contact layer 520, and second metal layer 560 have a three-layer structure where the layers are in contact with each other. In the present exemplary embodiment, second through-hole 550a is formed only in lower insulating film 551 out of lower insulating film 551 and upper insulating film 552 in second interlayer insulating layer 550. First contact layer 520 and second metal layer 560 are located between lower insulating film 551 that is second insulating film 122 and upper insulating film 552 that is fourth insulating film 124.

In source terminal 500B, first contact layer 520 is formed in the same layer as first conductive film 61 of touch line 60B, and second metal layer 560 is formed in the same layer as second conductive film 62 of touch line 60B. Hence first contact layer 520 and second metal layer 560 are patterned simultaneously with first conductive film 61 and second conductive film 62, so that first contact layer 520 and second metal layer 560 have the same shape. In the present exemplary embodiment, since first conductive film 61 is an ITO film and second conductive film 62 is a copper film, first contact layer 520 is an ITO film and second metal layer 560 is a copper film.

As described above, similarly to source terminal 500 according to the first exemplary embodiment, source terminal 500B in liquid crystal display device 1B according to the present exemplary embodiment includes metal layer 510, first contact layer 520 electrically connected to metal layer 510, first interlayer insulating layer 540 located above first contact layer 520, and second contact layer 530 electrically connected to first contact layer 520 through first through-hole 540a formed in first interlayer insulating layer 540.

With this configuration, even when film stress concentrates, a crack occurs in second contact layer 530, and water and oxygen enter, first contact layer 520 can block water and oxygen. Thereby, water and oxygen can be prevented from reaching metal layer 510, so that the corrosion of metal layer 510 can be inhibited.

Furthermore, source terminal 500B in the present exemplary embodiment includes second metal layer 560 located between first contact layer 520 and second contact layer 530. Second metal layer 560 is in contact with second contact layer 530 at least in first through-hole 540a, and is in contact with first contact layer 520 at least in second through-hole 550a. Specifically, source terminal 500B in the present exemplary embodiment has a lamination structure of first contact layer 520 and second metal layer 560 between metal layer 510 (first metal layer) and second contact layer 530.

By providing second metal layer 560 as thus described, source terminal 500B can be reduced in resistance, so that signal delay can be prevented. Moreover, the provision of second metal layer 560 may cause corrosion of metal layer 510 due to corrosion of second metal layer 560, but with second contact layer 530 being present, the corrosion of metal layer 510 can be inhibited. That is, even when a crack occurs in second contact layer 530 and corrosion occurs in second metal layer 560, the progress of corrosion can be inhibited by first contact layer 520 below second metal layer 560. This can inhibit the corrosion of metal layer 510. That is, the expansion of corrosion of second metal layer 560 can be blocked by first contact layer 520, so that the occurrence of corrosion of metal layer 510 can be retarded.

Figure 21:
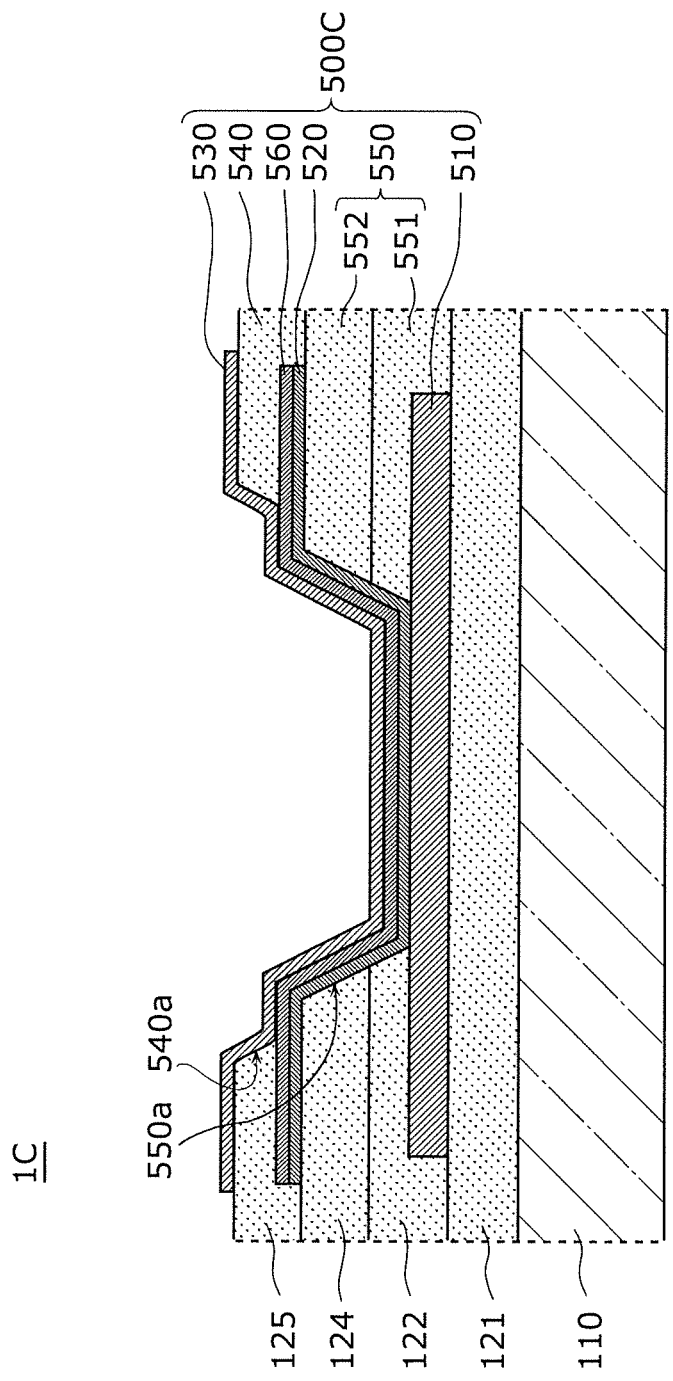
FIG. 21 is a sectional view illustrating a configuration of a liquid crystal display device according to Modification 1 of the second exemplary embodiment.

In the present exemplary embodiment, first through-hole 540a and second through-hole 550a do not overlap with each other in the top view of first substrate 100B, but as in the modification of the first exemplary embodiment, first through-hole 540a and second through-hole 550a may overlap with each other. Specifically, as in liquid crystal display device 1C illustrated in FIG. 21, first through-hole 540a may be in second through-hole 550a. In this case, as in the modification of the first exemplary embodiment, a plurality of first through-holes 540a may be in one second through-hole 550a. As thus described, even the configuration of liquid crystal display device 1C illustrated in FIG. 21 has the same effects as liquid crystal display device 1B according to the second exemplary embodiment. FIG. 21 illustrates a cross section of a portion corresponding to FIGS. 11 and 12 of the first exemplary embodiment.

In the present exemplary embodiment, first conductive film 61 of touch line 60B is used as the ITO film of first contact layer 520, but the present disclosure is not limited to this. For example, as in the first exemplary embodiment, common electrode 30 may be used as the ITO film of first contact layer 520. That is, first contact layer 520 may be formed in the same layer as common electrode 30. However, by forming first contact layer 520 and second metal layer 560 in the same layers as first conductive film 61 and second conductive film 62 of touch line 60 as in the present exemplary embodiment, it is possible to add the lamination structure of first contact layer 520 and second metal layer 560 to source terminal 500C without adding a photolithography process (i.e., without increasing the number of masks)

Figure 22:
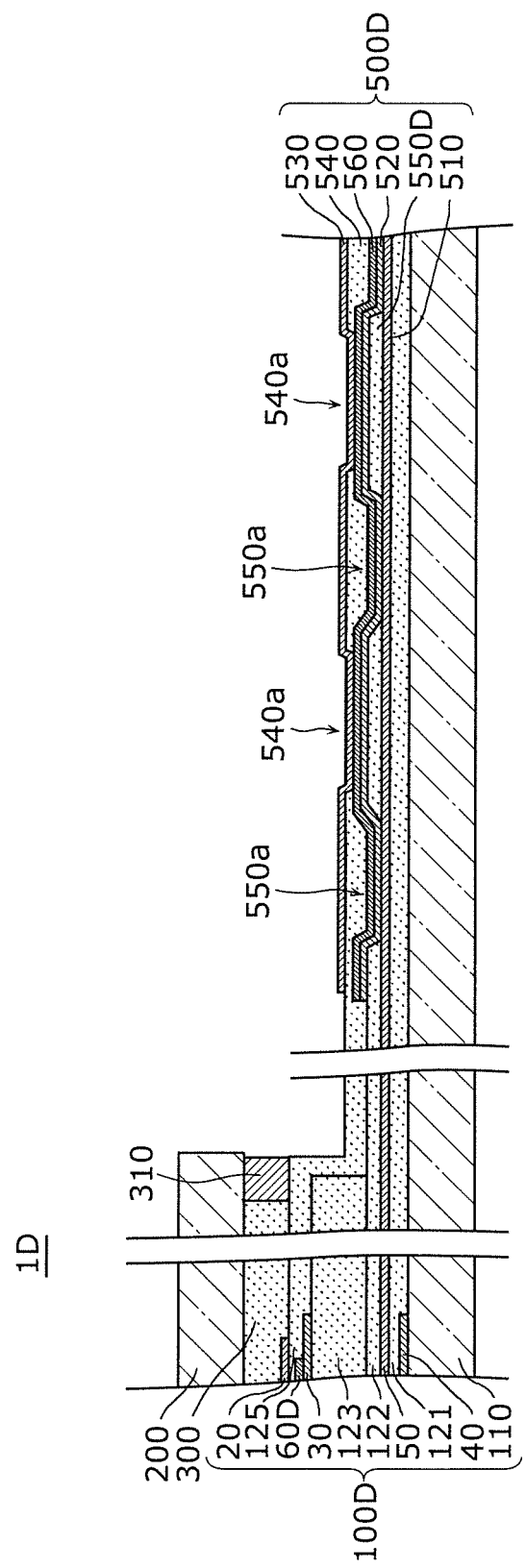
FIG. 22 is a sectional view illustrating a configuration of a liquid crystal display device according to Modification 2 of the second exemplary embodiment.

In the present exemplary embodiment, the in-cell touch panel having touch line 60B is used, but the present disclosure is not limited to this. Specifically, as illustrated in FIG. 22, liquid crystal display device 1D not including touch line 60B and fourth insulating film 124 may be used. FIG. 22 illustrates a cross section of a portion corresponding to FIG. 20 of the second exemplary embodiment.

In liquid crystal display device 1D illustrated in FIG. 22, common electrode 30 is not divided into a plurality of sections, and common electrode 30 is a solid electrode formed over a plurality of pixels PX. Common line 60D to which a common potential is applied is provided immediately above common electrode 30 in order to reduce the resistance of common electrode 30. A plurality of common lines 60D are formed all over the image display region in the row direction or the column direction. In source terminal 500D, first contact layer 520 is formed in the same layer as common electrode 30, and second metal layer 560 is formed in the same layer as common line 60D.

With this configuration, even in a liquid crystal display device having no touch line, it is possible to add the lamination structure of first contact layer 520 and second metal layer 560 to source terminal 500D without adding a photolithography process. As thus described, even the configuration of liquid crystal display device 1D illustrated in FIG. 22 has the same effects as liquid crystal display device 1B according to the second exemplary embodiment. In FIG. 22, since fourth insulating film 124 is not provided, only second insulating film 122 constitutes second interlayer insulating layer 550D of source terminal 500D.

In FIG. 22, first through-hole 540a and second through-hole 550a do not overlap with each other in the top view of first substrate 100D. However, as in the modification of the first exemplary embodiment, first through-hole 540a and second through-hole 550a may overlap with each other.

Figure 23:
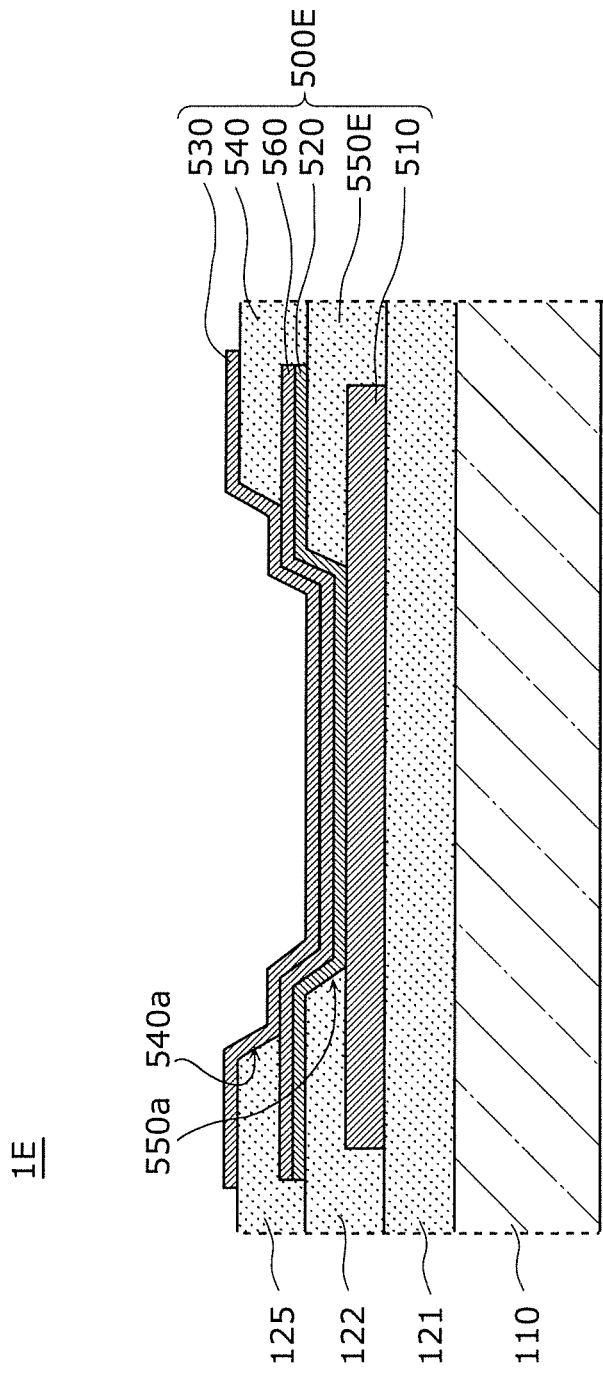
FIG. 23 is a sectional view illustrating a configuration of a liquid crystal display device according to Modification 3 of the second exemplary embodiment.

Specifically, as in source terminal 500E of liquid crystal display device 1E illustrated in FIG. 23, first through-hole 540*a* may be included in second through-hole 550*a*. In this case, as in the modification of the first exemplary embodiment, a plurality of first through-holes 540*a* may be included in one second through-hole 550*a*. As thus described, even the configuration of liquid crystal display device 1E illustrated in FIG. 23 has the same effects as liquid crystal display device 1B according to the second exemplary embodiment. FIG. 23 illustrates a cross section of a portion corresponding to FIG. 21 of Modification 1 of the second exemplary embodiment.

Further, the present exemplary embodiment and the modification can also be applied to the touch terminal and the gate terminal.

(Modifications of First and Second Exemplary Embodiments)

The first mode of the present disclosure has been described above based on the first and second exemplary embodiments and the modifications of those exemplary embodiments. However, the first mode of the present disclosure is not limited to the first and second exemplary embodiments and the modifications of those exemplary embodiments.

Figure 24:
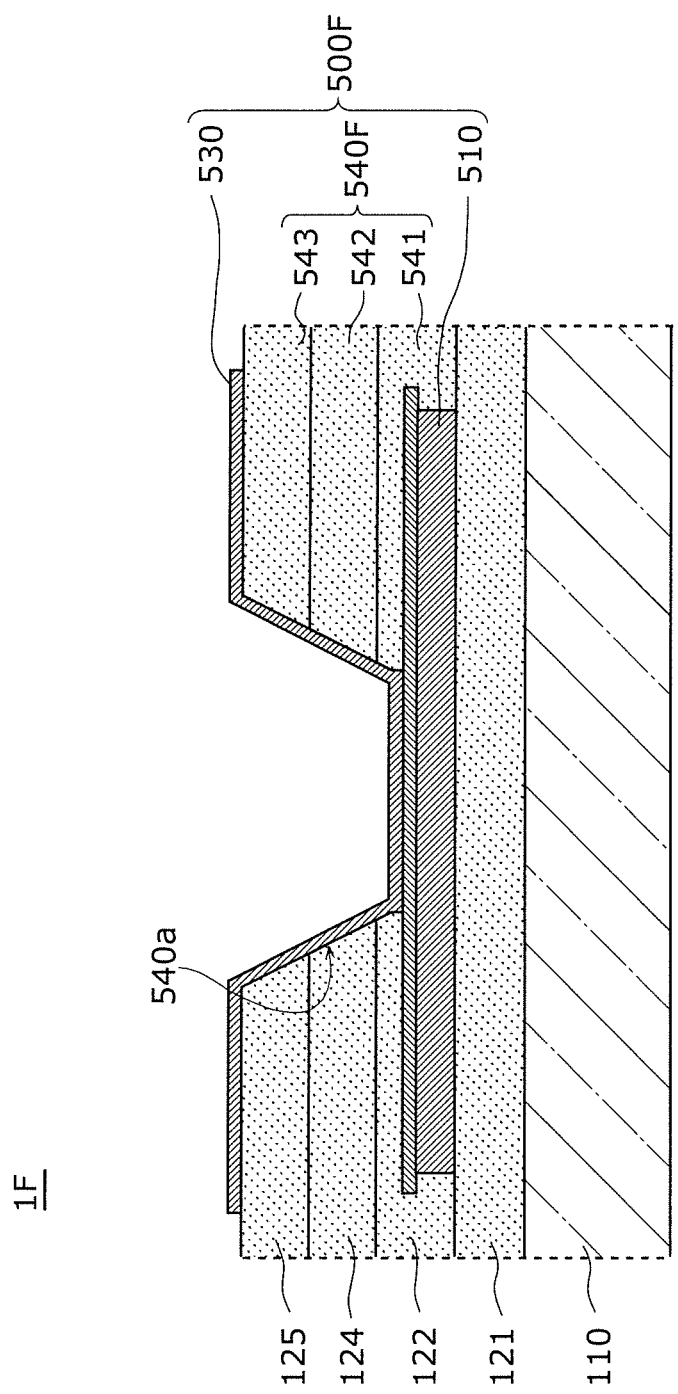
FIG. 24 is a sectional view illustrating a configuration of a liquid crystal display device according to a modification of the first and second exemplary embodiments.

For example, the source terminal in the liquid crystal display device in each of the first and second exemplary embodiments includes second interlayer insulating layer 550, but the present disclosure is not limited to this. Specifically, second interlayer insulating layer 550 may not be included as is source terminal 500F in liquid crystal display device 1F illustrated in FIG. 24. FIG. 24 illustrates a cross section of a portion corresponding to FIG. 11 of the first exemplary embodiment. In source terminal 500F illustrated in FIG. 24, first interlayer insulating layer 540F is constituted by a plurality of laminated insulating films. Specifically, first interlayer insulating layer 540F has a three-layer structure of lower insulating film 541, middle insulating film 542 laminated on lower insulating film 541, and upper insulating film 543 laminated on middle insulating film 542. As an example, lower insulating film 541 is second insulating film 122 formed as the second insulating layer (PAS), middle insulating film 542 is fourth insulating film 124 formed as the fourth insulating layer (TPS layer), and upper insulating film 543 is fifth insulating film 125 formed as a fifth insulating layer (UPS layer). First interlayer insulating layer 540F is not limited to being constituted by three insulating films, but may be constituted by one or two insulating films. For example, first interlayer insulating layer 540F may be constituted by at least one of lower insulating film 541, middle insulating film 542, and upper insulating film 543.

Also, similarly to source terminal 500 according to the first exemplary embodiment, source terminal 500F of liquid crystal display device 1F illustrated in FIG. 24 also includes metal layer 510, first contact layer 520 electrically connected to metal layer 510, first interlayer insulating layer 540F located above first contact layer 520, and second contact layer 530 electrically connected to first contact layer 520 through first through-hole 540*a* formed in first interlayer insulating layer 540F.

With this configuration, even when film stress concentrates on second contact layer 530 to cause a crack to occur and water and oxygen then enter, first contact layer 520 can block the water and oxygen. Thereby, water and oxygen can be prevented from reaching metal layer 510, so that the corrosion of metal layer 510 can be inhibited. Note that the present modification can also be applied to the touch terminal and the gate terminal.

Third Exemplary Embodiment

Next, a third exemplary embodiment will be described as a specific example of a second mode of the present disclosure.

First, prior to a description of a third exemplary embodiment of the present disclosure, the background of obtaining the third exemplary embodiment of the present disclosure will be described below.

In recent years, a liquid crystal display device having both a touch function and a display function has been developed. In a liquid crystal display device having a touch function, for example, touch sensing is performed using a capacitance method. In this case, a position touched by the user is detected by detecting with a touch electrode a change in capacitance that occurs when a pointer such as a user's finger or pen touches or approaches a display screen.

As the touch sensing by the capacitance method, there are known a self-capacitive method that detects a change in capacitance between a touch object such as the finger or pen and a touch electrode (Rx electrode) when the touch object touches the liquid crystal display device, and a mutual capacitive method that detects a change in capacitance between two touch electrodes (Rx electrode, Tx electrode).

As a structure of a liquid crystal display device having a touch function, there are known an out-cell method in which a touch panel having a touch function is attached to the surface of the liquid crystal display panel and an in-cell method in which the liquid crystal display device itself has a touch function.

For example, International Publication No. 2017/213173 discloses an in-cell type liquid crystal display device having a touch function. The liquid crystal display device disclosed in International Publication No. 2017/213173 includes a plurality of gate lines extending in the row direction, a plurality of data lines extending in the column direction, a pixel electrode provided in each of the plurality of pixels, a plurality of common electrodes (counter electrodes) provided facing the plurality of pixel electrodes, and signal lines connected to the common electrodes as touch lines. In the liquid crystal display device disclosed in International Publication No. 2017/213173, a touch drive signal for detecting a touch position is supplied to the counter electrode, so that a touch detection signal is received via the signal line, and a change in capacitance at the position of the counter electrode is detected to sense the touch position.

However, the in-cell touch panel that is the in-cell type liquid crystal display device having a touch function includes a plurality of touch lines connected to the plurality of common electrodes in addition to the plurality of gate lines and the plurality of data lines. The plurality of gate lines, the plurality of data lines, and the plurality of touch lines need to be connected to terminal electrodes in the frame region of the in-cell touch panel. For this reason, in the in-cell touch panel, it is necessary not only to aggregate the plurality of gate lines and the plurality of data lines at the end of the frame region, but also to aggregate the plurality of touch lines at the end of the frame region. In this case, the wiring of the lines is formed obliquely toward the terminal portion when drawn out from the image display region to the frame region. Further, the wiring of the lines needs to be routed so as not to be short-circuited while being aggregated and crowded in the frame region. As a result, the likelihood to design the wiring layout is lowered, thus increasing the frame region.

In particular, it is conceivable to form the touch line connected to the common electrode along the same direction as the data line. For example, it is conceivable to extend the data line and the touch line in the column direction. It is thereby possible to easily connect the data line and the touch line to the source driver with a touch function mounted at the end of the frame region on the column direction side.

In this case, the plurality of data lines and the plurality of touch lines are aggregated in the frame region and connected to one terminal portion where the source driver with a touch function is mounted. For this reason, when the routing is intended so that the wiring of the plurality of data lines and the wiring of the plurality of touch lines are not short-circuited, the frame region increases.

Accordingly, as a result of intensive studies on measures to solve this problem, the inventors of the present disclosure have found an in-cell touch panel that can easily connect a plurality of touch lines to a terminal portion without expanding the frame region.

Hereinafter, the third exemplary embodiment will be described as a specific example of liquid crystal display device 1G that is the in-cell touch panel as thus described.

An image display device including liquid crystal display device 1G according to the present exemplary embodiment has the same configuration as image display device 2 in the first and second exemplary embodiments.

Further, liquid crystal display device 1G according to the present exemplary embodiment is an in-cell touch panel as in the first and second exemplary embodiments, and includes image display region 1a and frame region 1b. Liquid crystal display device 1G includes transistor 10 and pixel electrode 20 provided in each of a plurality of pixels PX, common electrode 30 facing pixel electrode 20, a plurality of gate lines 40 (scanning lines) extending in a row direction that is a first direction, a plurality of data lines 50 (video signal lines) extending in a column direction that is a second direction orthogonal to the first direction, and a plurality of touch lines 60 extending in the column direction that is the second direction. A configuration of pixel PX and a cross-sectional structure in image display region 1a in liquid crystal display device 1G in the present exemplary embodiment are the same as those in the first and second exemplary embodiments.

Figure 25:
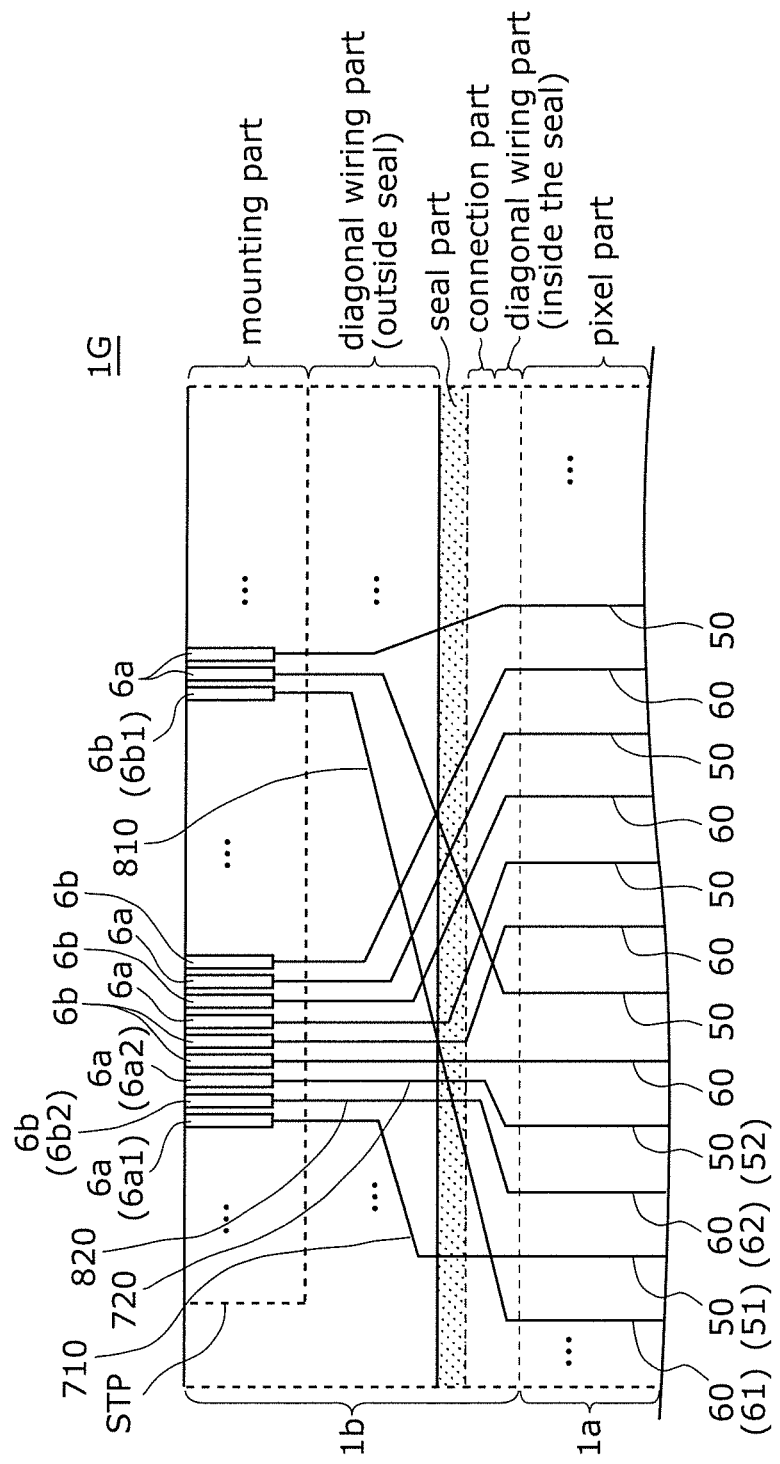
FIG. 25 is an enlarged plan view schematically illustrating a structure on a periphery of a frame region on the source terminal portion side in a liquid crystal display device according to a third exemplary embodiment.
Figure 26:
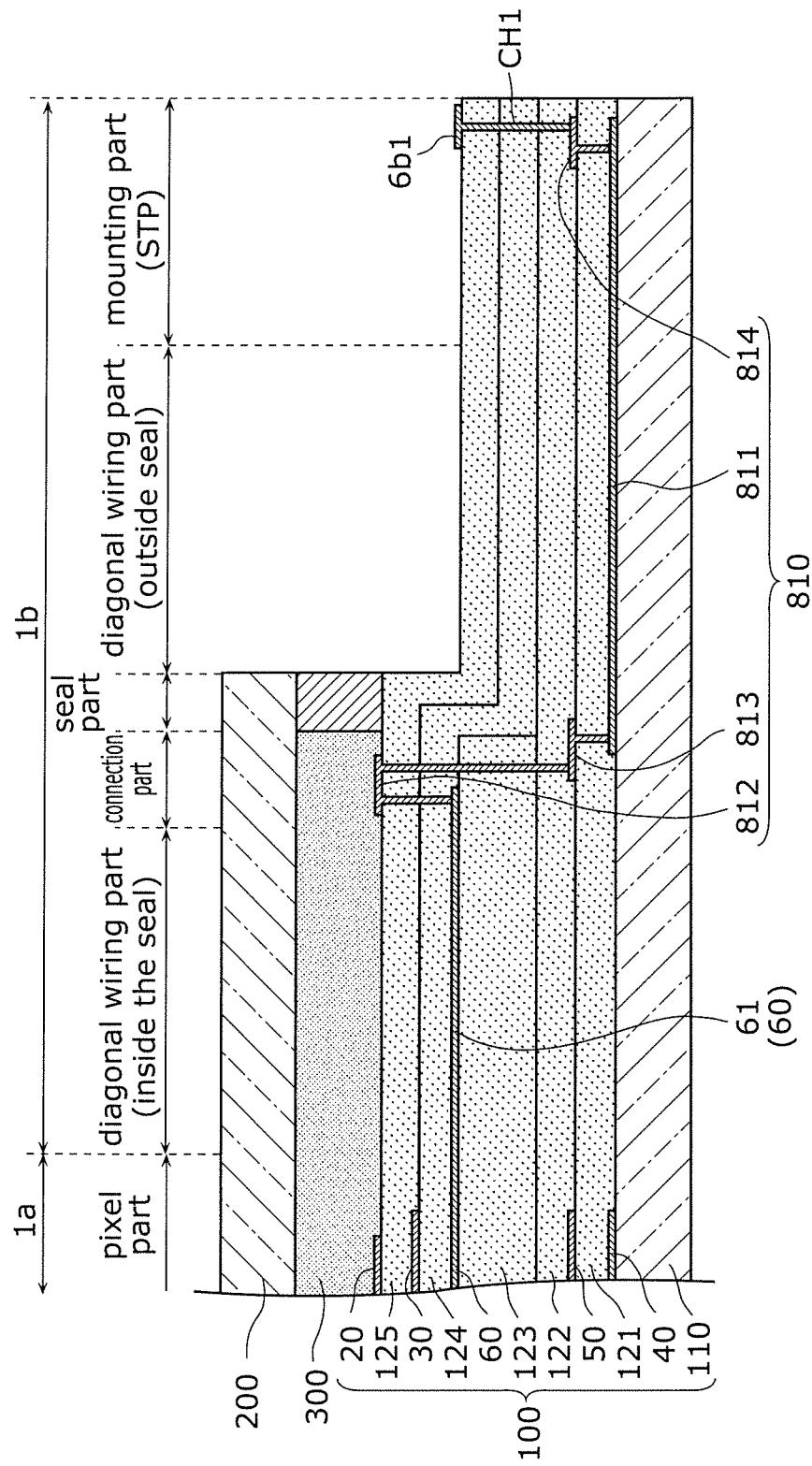
FIG. 26 is a sectional view of the periphery of the frame region on the source terminal portion side in the liquid crystal display device according to the third exemplary embodiment (a sectional view through first touch relay wiring)
Figure 27:
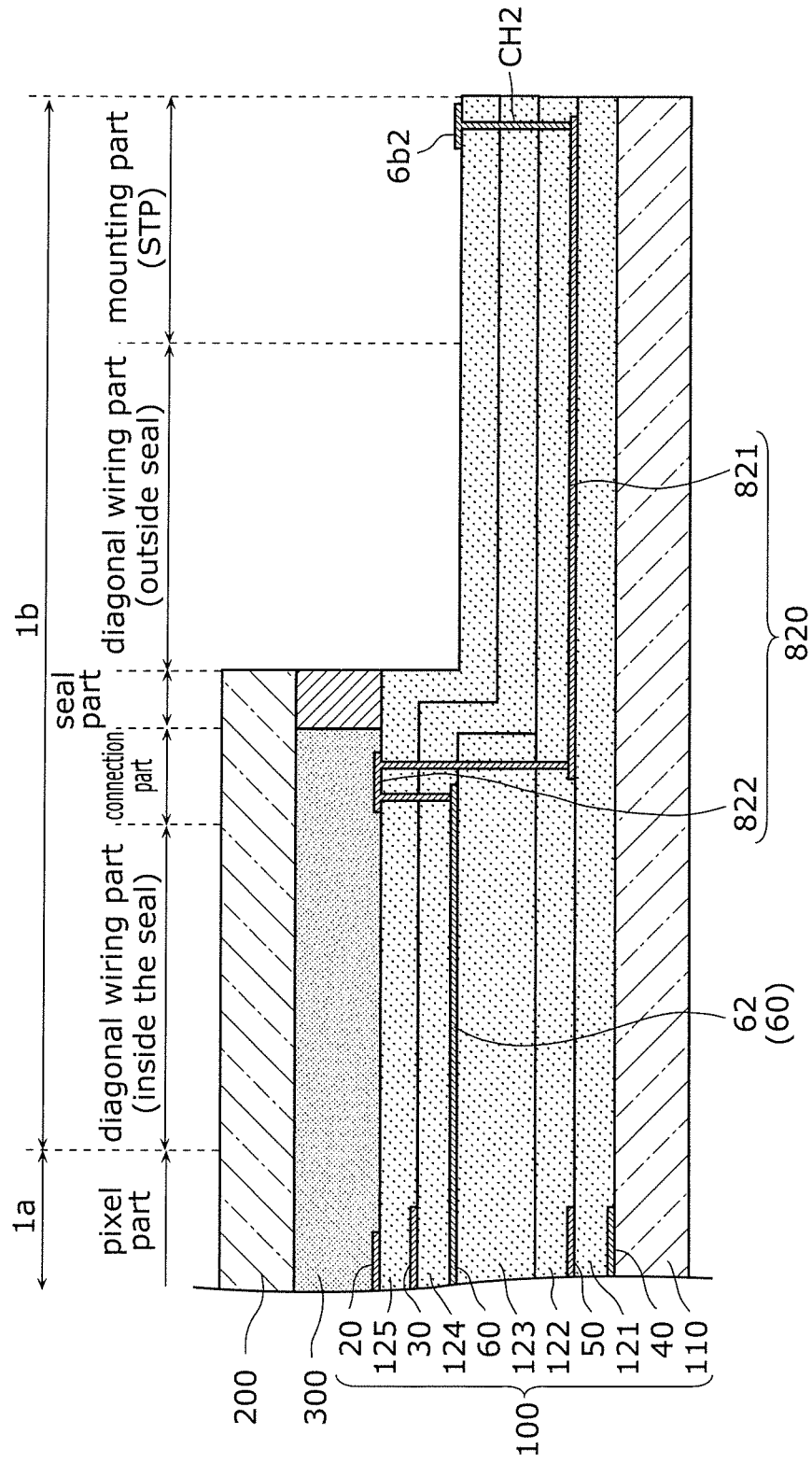
FIG. 27 is a sectional view of the periphery of the frame region on the source terminal portion side in the liquid crystal display device according to the third exemplary embodiment (a sectional view through second touch relay wiring)
Figure 28:
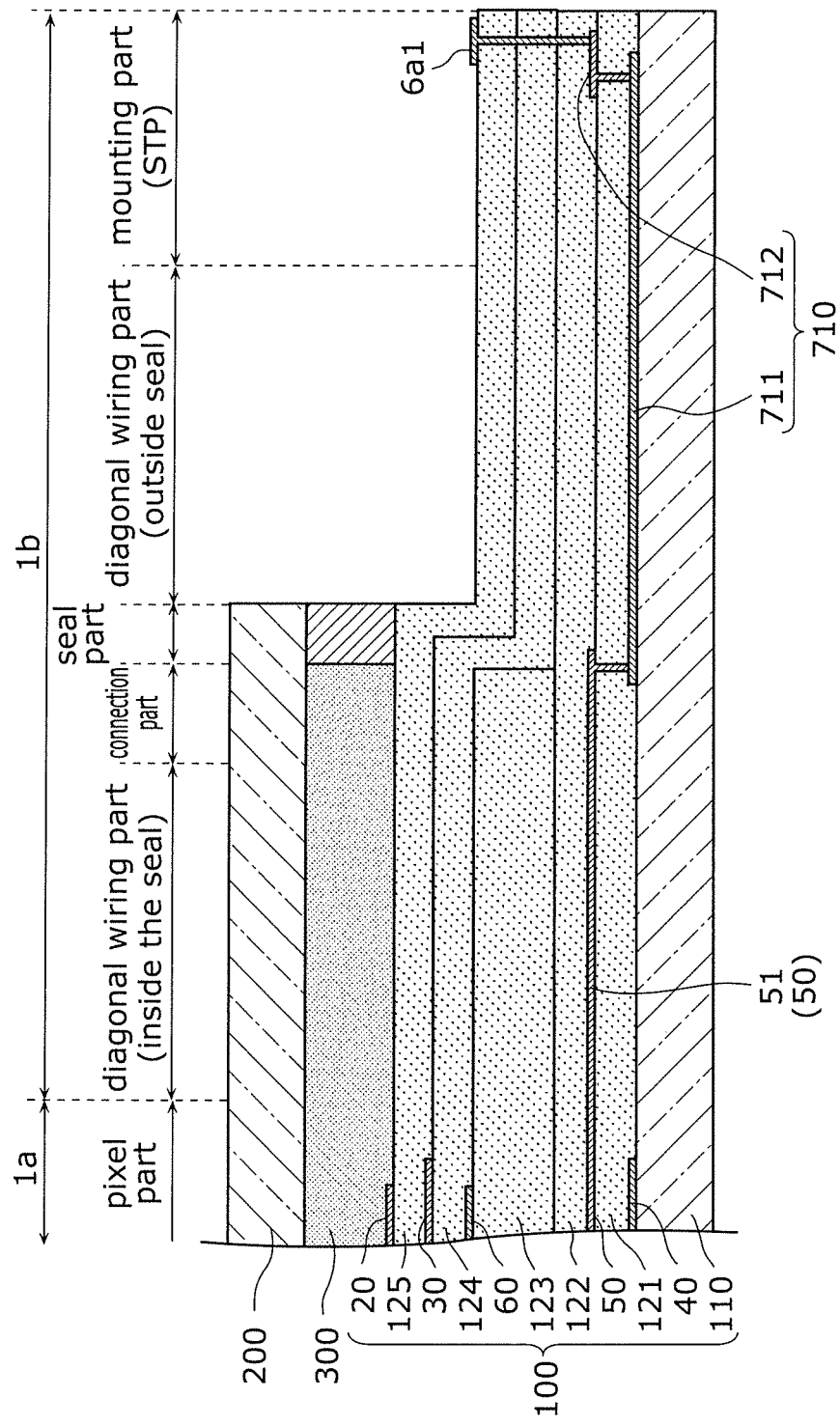
FIG. 28 is a sectional view of the periphery of the frame region on the source terminal portion side in the liquid crystal display device according to the third exemplary embodiment (a sectional view through first source relay wiring)
Figure 29:
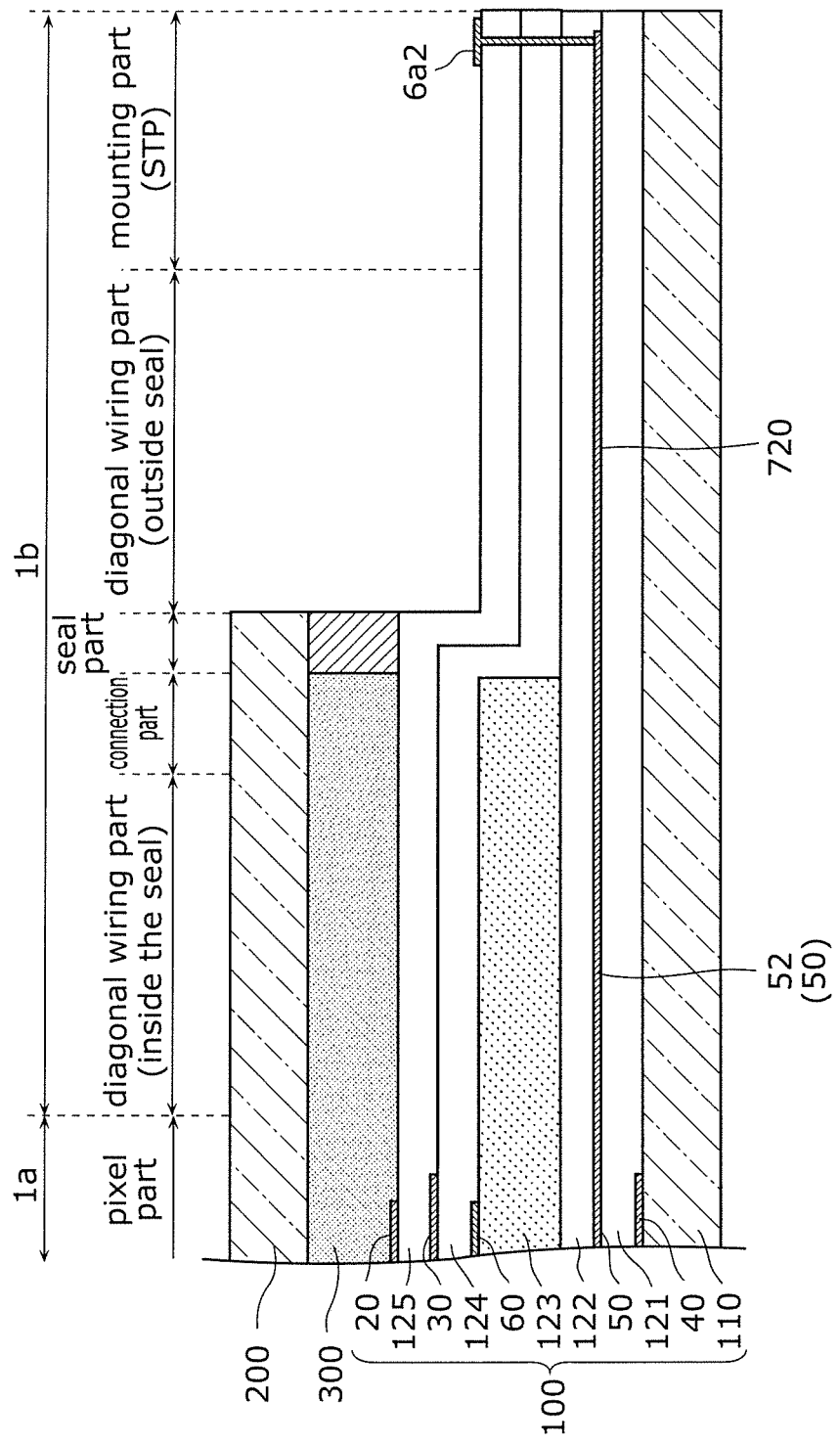
FIG. 29 is a sectional view of the periphery of the frame region on the source terminal portion side in the liquid crystal display device according to the third exemplary embodiment (a sectional view through second source relay wiring)
Figure 30:
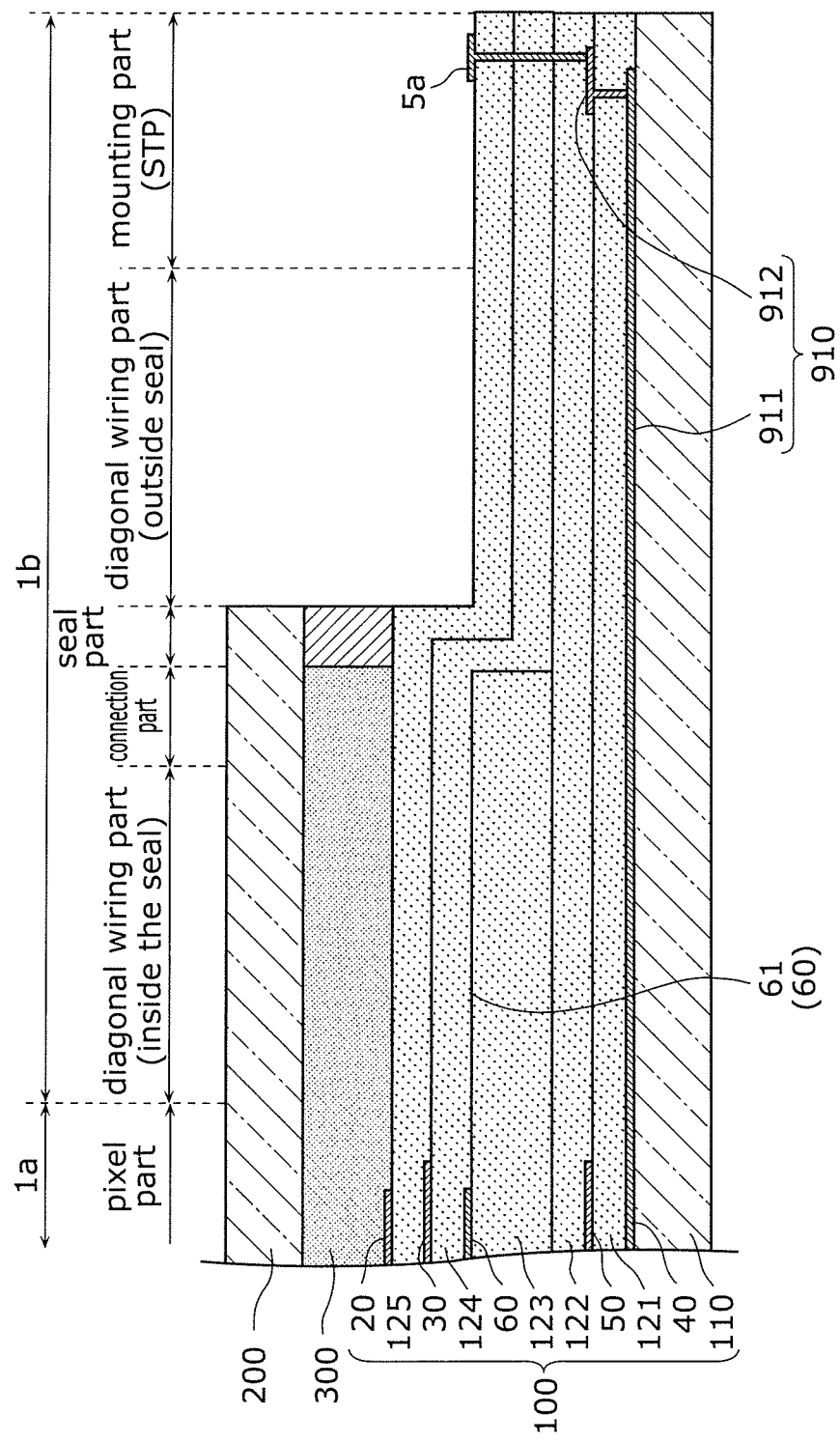
FIG. 30 is a sectional view of the periphery of the frame region on the gate terminal portion side in the liquid crystal display device according to the third exemplary embodiment (a sectional view through gate relay wiring)

Here, a configuration of a peripheral portion of each of source terminal portion STP and gate terminal portion GTP in frame region 1b of liquid crystal display device 1G according to the present exemplary embodiment will be described with reference to FIGS. 25 to 30. FIG. 25 is an enlarged plan view schematically illustrating a structure on a periphery of frame region 1b on the source terminal portion STP side in liquid crystal display device 1G according to the third exemplary embodiment. FIGS. 26 to 30 are sectional views on the periphery of frame region 1b on the source terminal portion STP side in liquid crystal display device 1G according to the third exemplary embodiment. FIG. 26 is a sectional view passing through first touch relay wiring 810, and FIG. 27 is a sectional view passing through second touch relay wiring 820. FIG. 28 is a sectional view passing through first source relay wiring 710, FIG. 29 is a sectional view passing through second source relay wiring 720, and FIG. 30 is a sectional view passing through gate relay wiring 910. FIGS. 26 to 30 and FIGS. 6 and 7 illustrate each layer to be different in thickness, but each layer is the same in thickness in FIGS. 26 to 30 and FIGS. 6 and 7. Further, each of FIG. 26 to FIG. 30 schematically illustrates a cross section when a cutting is made across each wiring.

As illustrated in FIG. 25, the plurality of data lines 50 and the plurality of touch lines 60 provided in image display region 1a are extended to frame region 1b and connected to source terminal portion STP as in the first and second exemplary embodiments.

In source terminal portion STP, each of the plurality of touch lines 60 is connected to touch terminal electrode 6b corresponding to the concerned touch line 60.

In the present exemplary embodiment, the plurality of touch lines 60 include first touch line 61 and second touch line 62 that passes through different wiring layers. Therefore, the plurality of touch terminal electrodes 6b include first touch terminal electrode 6b1 connected to first touch line 61 and second touch terminal electrode 6b2 connected to second touch line 62.

As illustrated in FIGS. 25 and 26, first touch line 61 is connected to first touch terminal electrode 6b1 via first touch relay wiring 810 formed in the diagonal wiring portion. That is, first touch line 61 and first touch terminal electrode 6b1 are electrically connected via first touch relay wiring 810.

As illustrated in FIG. 26, first touch relay wiring 810 includes first relay wiring portion 811 formed in a different layer from first touch line 61 and first touch terminal electrode 6b1. In the present exemplary embodiment, first touch line 61 is formed in the CMT layer, and first touch terminal electrode 6b1 is formed in the same layer as pixel electrode 20 formed in the PIT layer. Thus, first relay wiring portion 811 is formed in a different layer from first touch line 61 formed in the CMT layer and a different layer from first touch terminal electrode 6b1 formed in the PIT layer.

In the present exemplary embodiment, first relay wiring portion 811 of first touch relay wiring 810 is formed in the same layer as gate line 40 formed in the GAL layer. Hence first touch relay wiring 810 is routed so that first touch line 61 is connected to first touch terminal electrode 6b1 after passing through the GAL layer below the CMT layer.

First touch relay wiring 810 further includes second relay wiring portion 812 provided in a wiring path between first touch line 61 and first relay wiring portion 811 in the concerned first touch relay wiring 810.

In the present exemplary embodiment, second relay wiring portion 812 of first touch relay wiring 810 is formed in the same layer as pixel electrode 20 formed in the PIT layer. Thus, first touch relay wiring 810 is routed so that first touch line 61 is connected to first touch terminal electrode 6b1 after passing through the PIT layer above the CMT layer.

First touch relay wiring 810 further includes third relay wiring portion 813 provided in a wiring path between second relay wiring portion 812 and first relay wiring portion 811 in the concerned first touch relay wiring 810, and fourth relay wiring portion 814 provided in a wiring path between first relay wiring portion 811 in the concerned first touch relay wiring 810 and first touch terminal electrode 6b1.

In the present exemplary embodiment, third relay wiring portion 813 and fourth relay wiring portion 814 are formed in the same layer as data line 50 formed in the SD layer. Hence first touch relay wiring 810 is routed so that first touch line 61 is connected to the GAL layer after passing through the SD layer between the CMT layer and the GAL layer rather than being directly connected to the lowermost GAL layer. Further, first touch relay wiring 810 is not routed so that the first touch line 61 routed to the lowermost GAL layer is directly connected to first touch terminal electrode 6b1 in the PIT layer, but first touch relay wiring 810 is routed so that first touch line 61 routed to the lowermost GAL layer is connected to first touch terminal electrode 6*b*1 in the PIT layer after passing through the SD layer between the CMT layer and the GAL layer.

As thus described, first touch line 61 formed in the CMT layer in image display region 1*a* is formed in the CMT layer in the pixel portion and the diagonal wiring portion inside the connection portion, but outside the connection portion, the first touch line switches to a wiring layer above and below the CMT layer and is connected to first touch terminal electrode 6*b*1. Specifically, first touch line 61 switches the wiring layers in the pixel portion and the diagonal wiring portion inside the seal part in the order of CMT layer→PIT layer (second relay wiring portion)→SD layer (third relay wiring portion)→GAL layer (first relay wiring portion) →SD layer (fourth relay wiring portion)→PIT layer (first touch terminal electrode 6*b*1).

On the other hand, as illustrated in FIGS. 25 and 27, second touch line 62 is connected to second touch terminal electrode 6*b*2 via second touch relay wiring 820 formed in the diagonal wiring portion. That is, second touch line 62 and second touch terminal electrode 6*b*2 are electrically connected via second touch relay wiring 820.

As illustrated in FIG. 27, second touch relay wiring 820 includes first relay wiring portion 821 formed in a different layer from second touch line 62 and second touch terminal electrode 6*b*2. In the present exemplary embodiment, second touch line 62 is formed in the CMT layer, and second touch terminal electrode 6*b*2 is formed in the same layer as pixel electrode 20 formed in the PIT layer. Thus, first relay wiring portion 821 is formed in a different layer from second touch line 62 formed in the CMT layer and is formed in a different layer from second touch terminal electrode 6*b*2 formed in the PIT layer. First relay wiring portion 821 of second touch relay wiring 820 is further formed in a different layer from first relay wiring portion 811 of first touch relay wiring 810.

In the present exemplary embodiment, first relay wiring portion 821 of second touch relay wiring 820 is formed in the same layer as data line 50 formed in the SD layer. Therefore, second touch relay wiring 820 is routed so that second touch line 62 is connected to second touch terminal electrode 6*b*2 after passing through the SD layer below the CMT layer.

Second touch relay wiring 820 further includes second relay wiring portion 822 provided in a wiring path between second touch line 62 and first relay wiring portion 821 in the concerned second touch relay wiring 820.

In the present exemplary embodiment, second relay wiring portion 822 of second touch relay wiring 820 is formed in the same layer as pixel electrode 20 formed in the PIT layer. Hence second touch relay wiring 820 is routed so that second touch line 62 is connected to second touch terminal electrode 6*b*2 after passing through the PIT layer above the CMT layer.

As thus described, second touch line 62 formed in the CMT layer is formed in the CMT layer in the pixel portion and the diagonal wiring portion inside the connection portion similarly to first touch line 61, but outside the connection portion, second touch line switches to a wiring layer above and below the CMT layer and is connected to second touch terminal electrode 6*b*2. However, second touch line 62 has a different wiring path from first touch line 61. Specifically, second touch line 62 switches the wiring layers in the order of CMT layer→PIT layer (second relay wiring portion)→SD layer (first relay wiring portion)→PIT layer (second touch terminal electrode 6*b*2).

In the portion where first touch line 61 and second touch line 62 switch between the wiring layers (connection portion and mounting portion), one or more interlayer insulating films (first insulating film 121, second insulating film 122, third insulating film 123, fourth insulating film 124, and fifth insulating film 125) existing between the upper and lower wiring layers are formed with contact holes. By forming the contact hole, the upper and lower wiring layers can be connected to each other. Hence a conductive material of the upper wiring layer is buried into the contact hole. The same applies to first data line 51 and second data line 52 to be described later.

Further, in the present exemplary embodiment, both first touch relay wiring 810 that connects first touch line 61 and first touch terminal electrode 6*b*1 and second touch relay wiring 820 that connects second touch line 62 and second touch terminal electrode 6*b*2 are extended to source terminal portion STP (mounting portion). Specifically, the outer end of first touch relay wiring 810 and the outer end of second touch relay wiring 820 are located below source terminal portion STP. The outer end of first touch relay wiring 810 and first touch terminal electrode 6*b*1 are connected through first contact hole CH1, and the outer end of second touch relay wiring 820 and second touch terminal electrode 6*b*2 are connected through second contact hole CH2.

Further, in the present exemplary embodiment, the wiring layer for both first touch line 61 and second touch line 62 immediately before being connected to touch terminal electrode 6*b* is the SD layer. That is, the outer end of first touch relay wiring 810 connected to first touch terminal electrode 6*b*1 through first contact hole CH1 is located in the SD layer. The outer end of second touch relay wiring 820 connected to second touch terminal electrode 6*b*2 through second contact hole CH2 is also located in the SD layer.

As described above, according to liquid crystal display device 1G in the present exemplary embodiment, the plurality of touch terminal electrodes 6*b* include first touch terminal electrode 6*b*1 electrically connected to first touch line 61 via first touch relay wiring 810, and second touch terminal electrode 6*b*2 electrically connected to second touch line 62 via second touch relay wiring 820. First touch relay wiring 810 includes first relay wiring portion 811 formed in a different layer from first touch line 61 and first touch terminal electrode 6*b*1, and second touch relay wiring 820 includes first relay wiring portion 821 formed in a different layer from second touch line 62 and second touch terminal electrode 6*b*2 and formed in a different layer from first relay wiring portion 811 of first touch relay wiring 810.

In other words, first touch line 61 and second touch line 62 are connected to touch terminal electrode 6*b* via different wiring layers. Thereby, first touch line 61 and second touch line 62 can be grade-separated on the way, so that the likelihood to design the wiring layout of first touch line 61 and second touch line 62 in frame region 1*b* can be enhanced. Thus, even when touch line 60 is formed in addition to gate line 40 and data line 50, a plurality of touch lines 60 can be aggregated in frame region 1*b* and easily connected to touch terminal electrode 6*b* without enlarging frame region 1*b*.

As described above, not only the plurality of touch lines 60 but also a plurality of data lines 50 are connected to source terminal portion STP. Each of the plurality of data lines 50 is connected to each source terminal electrode 6*a* corresponding to the concerned data line 50.

In the present exemplary embodiment, the plurality of data lines 50 include first data line 51 and second data line 52 that pass through different wiring layers. Thus, the plurality of source terminal electrodes 6a include first source terminal electrode 6a1 connected to first data line 51 and second source terminal electrode 6a2 connected to second data line 52.

As illustrated in FIGS. 27 and 28, first data line 51 is connected to first source terminal electrode 6a1 via first source relay wiring 710 formed in the diagonal wiring portion. That is, first data line 51 and first source terminal electrode Ga1 are electrically connected via first source relay wiring 710.

As illustrated in FIG. 28, first source relay wiring 710 includes first relay wiring portion 711 formed in a different layer from first data line 51 and first source terminal electrode 6a1. In the present exemplary embodiment, first data line 51 is formed in the SD layer, and first source terminal electrode 6a1 is formed in the same layer as pixel electrode 20 formed in the PIT layer. Thus, first relay wiring portion 711 is formed in a different layer from first data line 51 formed in the SD layer and is formed in a different layer from first source terminal electrode 6a1 formed in the PIT layer.

In the present exemplary embodiment, first relay wiring portion 711 of first source relay wiring 710 is formed in the same layer as gate line 40 formed in the GAL layer. Hence first source relay wiring 710 is routed so that first data line 51 is connected to first source terminal electrode Ga1 after passing through the GAL layer below the SD layer.

First source relay wiring 710 further includes second relay wiring portion 712 provided in a wiring path between first data line 51 and first relay wiring portion 711 in the concerned first source relay wiring 710.

In the present exemplary embodiment, second relay wiring portion 712 of first source relay wiring 710 is formed in the SD layer. Hence first source relay wiring 710 is routed so that first data line 51 passes through the GAL layer below the SD layer and then returns to the SD layer to be connected to first source terminal electrode 6a1.

As thus described, first data line 51 formed in the SD layer is formed in the SD layer in the pixel portion and the diagonal wiring portion inside the connection portion, but outside the connection portion, first data line 51 switches to a wiring layer below the SD layer and is connected to first source terminal electrode 6a1. Specifically, first data line 51 switches the wiring layers in the order of SD layer→GAL layer (first relay wiring portion)→SD layer (second relay wiring portion)→PIT layer (first source terminal electrode 6a1).

Meanwhile, as illustrated in FIGS. 25 and 29, second data line 52 is connected to second source terminal electrode 6a2 via second source relay wiring 720 formed in the diagonal wiring portion. That is, second data line 52 and second source terminal electrode 6a2 are electrically connected via second source relay wiring 720.

As illustrated in FIG. 29, second source relay wiring 720 is formed in the same layer as second data line 52. Second source relay wiring 720 is connected to second source terminal electrode 6a2 formed in the PIT layer. That is, second source relay wiring 720 is extended to the lower side of source terminal portion STP without switching to the upper and lower wiring layers.

As thus described, similarly to first data line 51, second data line 52 formed in the SD layer is formed in the SD layer in the pixel portion and the diagonal wiring portion inside the connection portion, but unlike first data line 51, second data line 52 is connected to second source terminal electrode 6a2 without switching to the upper and lower wiring layers. Specifically, second data line 52 switches the wiring layers in the order of SD layer→SD layer (second source relay wiring)→PIT layer (second source terminal electrode 6a2).

Similarly to first touch line 61 and second touch line 62, the wiring layer for both first data line 51 and second data line 52 immediately before being connected to the source terminal electrode 6a is the SD layer.

As thus described, first data line 51 and second data line 52 are connected to the source terminal electrode 6a via different wiring layers. Thereby, first data line 51 and second data line 52 can be grade-separated on the way, so that the likelihood to design the wiring layout of first data line 51 and second data line 52 in frame region 1b can be enhanced. Thus, the plurality of data lines 50 can be aggregated in frame region 1b and easily connected to source terminal electrode 6a without enlarging frame region 1b.

In the present exemplary embodiment, since the source driver with a touch function is connected to source terminal portion STP, the plurality of data lines 50 and the plurality of touch lines 60 are aggregated in the same source terminal portion STP, and first touch line 61, second touch line 62, first data line 51, and second data line 52 are aggregated in one source terminal portion 6STP via different wiring layers. As a result, first touch line 61, second touch line 62, first data line 51, and second data line 52 can be grade-separated on the way, so that the likelihood to design the wiring layout of first touch line 61, second touch line 62, first data line 51, and second data line 52 can be enhanced. Thus, the plurality of data lines 50 and the plurality of touch lines 60 can be easily connected to one terminal portion without expanding frame region 1b.

Gate line 40 is connected to gate terminal electrode 5a of gate terminal portion GTP in a wiring path illustrated in FIG. 30. Specifically, gate line 40 is connected to gate terminal electrode 5a via gate relay wiring 910. In other words, gate line 40 and gate terminal electrode 5a are electrically connected via gate relay wiring 910.

As illustrated in FIG. 30, gate relay wiring 910 includes first relay wiring portion 911 formed in the GAL layer being the same layer as gate line 40, and second relay wiring portion 912 formed in the SD layer. Specifically, first relay wiring portion 911 is extended below gate terminal portion GTP and is connected to second relay wiring portion 912. Second relay wiring portion 912 is formed below gate terminal portion GTP and is connected to gate terminal electrode 5a. Similarly to first touch line 61 and second touch line 62, the wiring layer for gate line 40 immediately before being connected to gate terminal electrode 5a is the SD layer.

Modification of Third Exemplary Embodiment)

The second mode of the present disclosure has been described above based on the third exemplary embodiment and the modification of this exemplary embodiment. However, the second mode of the present disclosure is not limited to the third exemplary embodiment and the modification of this exemplary embodiment.

Figure 31:
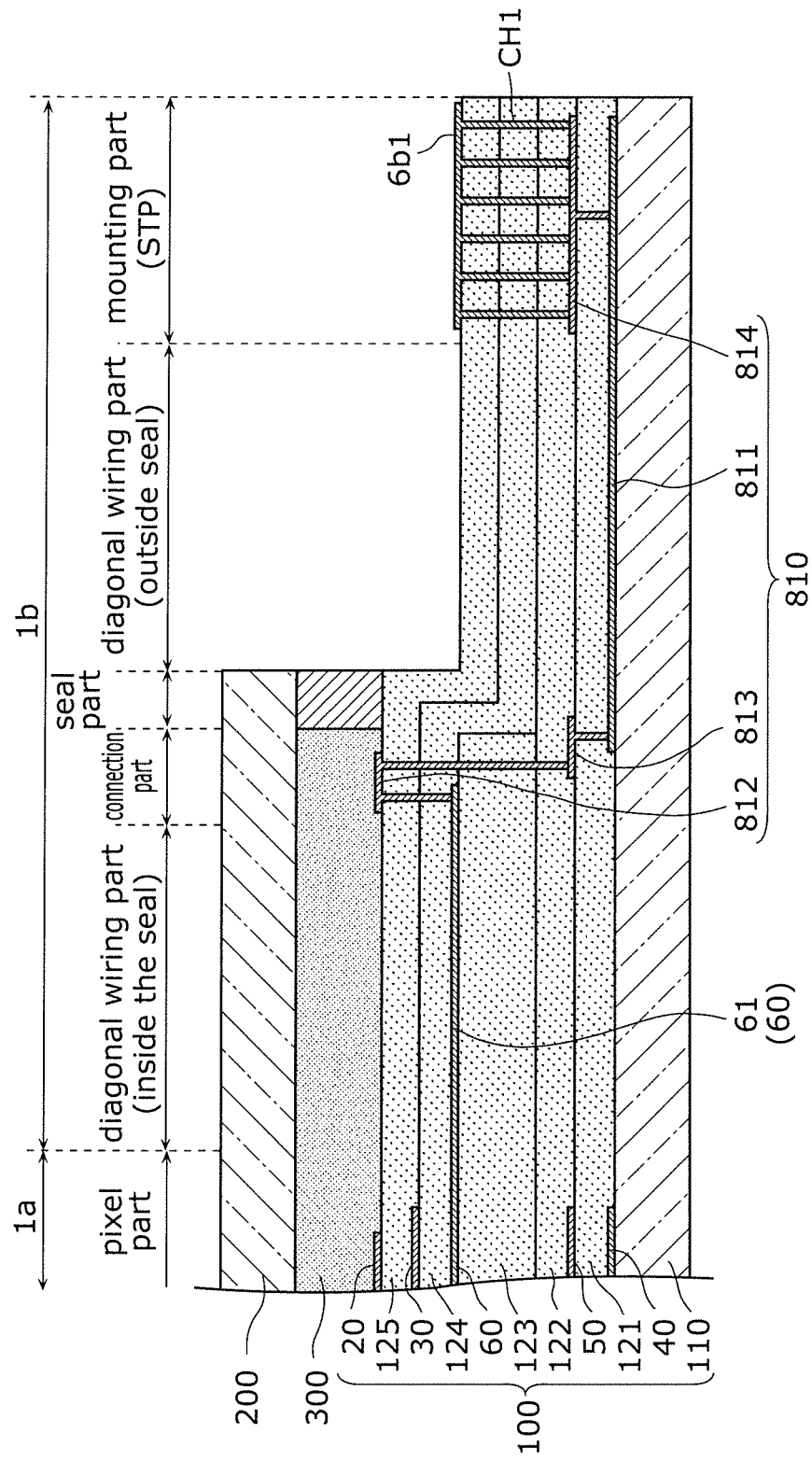
FIG. 31 is a sectional view of a periphery of a frame region on the source terminal portion side in a liquid crystal display device according to Modification 1 of the third exemplary embodiment.

For example, as illustrated in FIG. 26, in the third exemplary embodiment, the end of first touch relay wiring 810 and first touch terminal electrode 6b1 are connected through one first contact hole CH1, but the present disclosure is not limited to this. Specifically, as illustrated in FIG. 31, the end of first touch relay wiring 810 and first touch terminal electrode 6b1 may be connected through a plurality of first contact holes CH1. That is, the number of first contact holes CH1 for connecting the end of first touch relay wiring 810 and first touch terminal electrode 6b1 may be more than one. Similarly, the number of second contact holes CH2 illustrated in FIG. 27 may not be one but more than one. That is, the number of contact portions between touch line 60 and touch terminal electrode 6*b* may be more than one.

By connecting touch line 60 and touch terminal electrode 6*b* with a plurality of contact holes in source terminal portion STP as thus described, it is possible to inhibit disconnection due to corrosion or the like. The formation of a plurality of contact holes in the terminal portion can also be applied to data line 50 and gate line 40.

Figure 32:
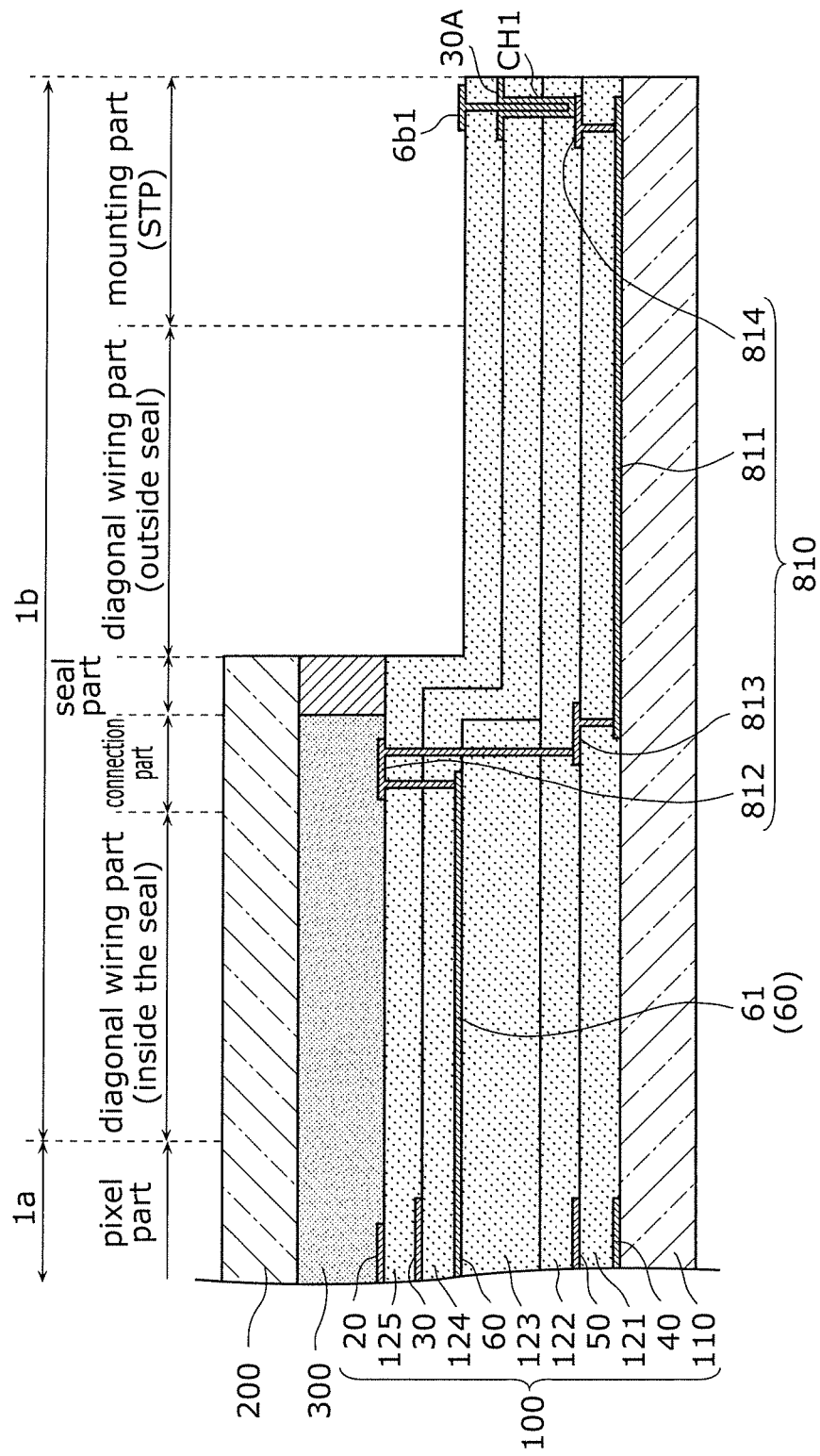
FIG. 32 is a sectional view of a periphery of a frame region on the source terminal portion side in a liquid crystal display device according to Modification 2 of the third exemplary embodiment.

As illustrated in FIG. 26, in the third exemplary embodiment, the end of first touch relay wiring 810 in first touch line 61 and first touch terminal electrode 6*b*1 in the PIT layer are directly connected, but the present disclosure is not limited to this. Specifically, as illustrated in FIG. 32, the end of first touch relay wiring 810 and first touch terminal electrode 6*b*1 may be connected via first relay electrode 30A formed in first contact hole CH1. First relay electrode 30A is formed in the same layer as common electrode 30 in the MIT layer located below pixel electrode 20 in the PIT layer. Although not illustrated, in FIG. 27 as well, the end of second touch relay wiring 820 in second touch line 62 and second touch terminal electrode 6*b*2 in the PIT layer may be connected via a second relay electrode formed in second contact hole CH2. In this case as well, the second relay electrode may be formed in the same layer as common electrode 30 in the MIT layer located below pixel electrode 20 in the PIT layer.

The formation of the relay electrode in the contact hole for connecting touch line 60 and touch terminal electrode 6*b* as thus described can improve corrosion resistance. This point will be described below.

In liquid crystal display device 1G that is the in-cell touch panel in the third exemplary embodiment, due to the need for insulating the plurality of common electrodes 30 and touch lines 60 so as to obtain a touch function, fourth insulating film 124 (TPS layer) is added between the plurality of common electrodes 30 and touch lines 60, as compared to a liquid crystal display device having no touch function. For this reason, the number of insulating films on the metal layer (SD layer) in the terminal portion increases. Therefore, the time for exposure to the atmosphere on the surface of the metal layer in etching of the insulating film increases, which tends to be a starting point for corrosion of the metal layer. Therefore, as illustrated in FIG. 32, by using photolithography and etching at the time of forming a contact hole in fourth insulating film 124 (TPS layer), the relay wiring in the MIT layer is formed to connect the SD layer in the terminal portion and the MIT layer, and the MIT layer and the PIT layer are connected by photolithography and etching of fifth insulating film 125 (UPS layer). The insertion of the relay electrode in the MIT layer as thus described can improve the corrosion resistance. Further, since the number of insulating films in the terminal portion can be reduced from three to two, damage due to etching is reduced. This also improves the corrosion resistance.

Figure 33:
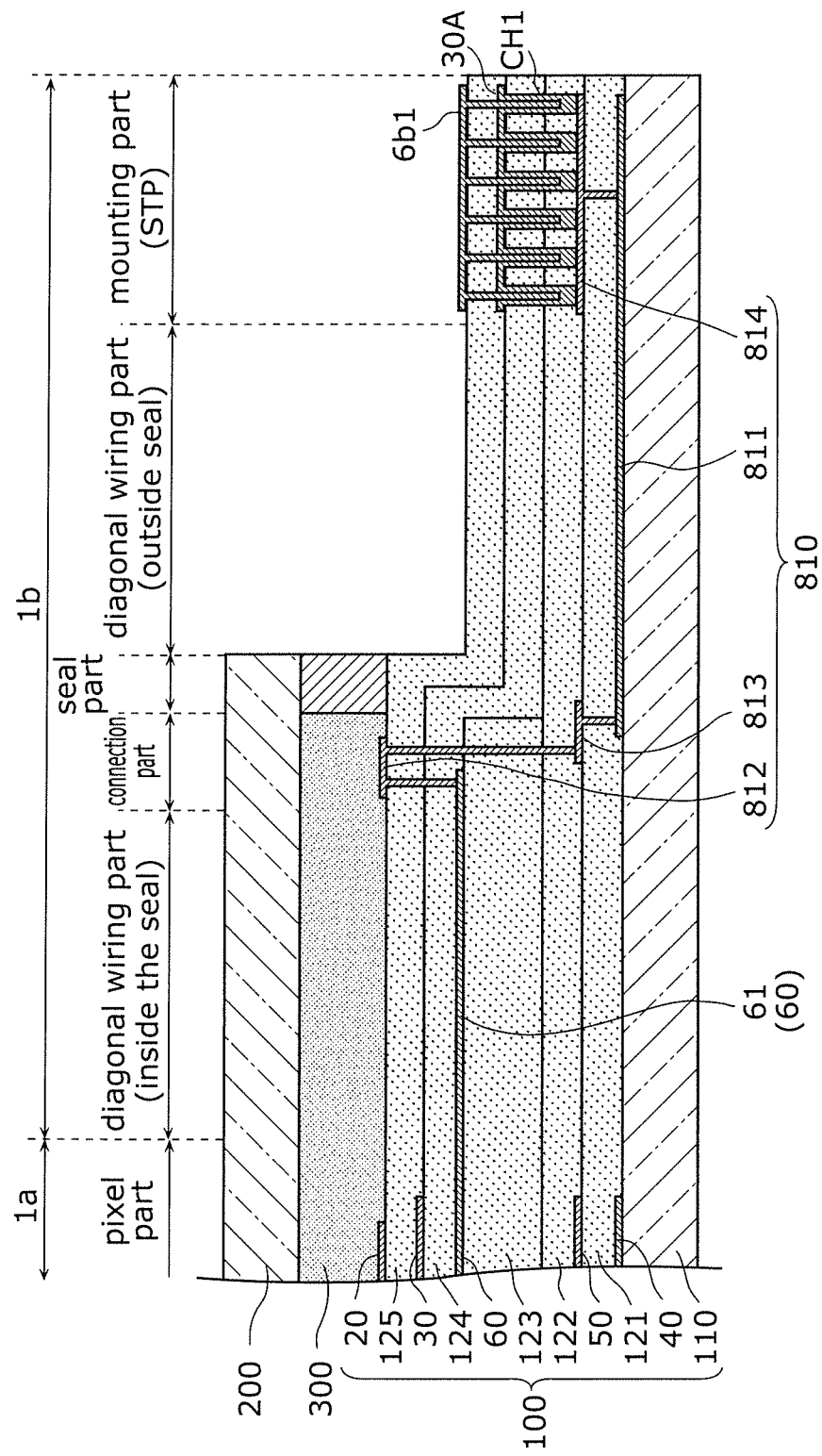
FIG. 33 is a sectional view of a periphery of a frame region on the source terminal portion side in a liquid crystal display device according to Modification 3 of the third exemplary embodiment.

Also, as illustrated in FIG. 33, after formation of a plurality of first contact holes CH1 configured to connect the end of first touch relay wiring 810 in first touch line 61 and first touch terminal electrode 6*b*1, first relay electrode 30A of the MIT layer may be formed in first contact hole CH1. It is thereby possible to further improve the corrosion resistance. Although not illustrated, similarly for second contact hole CH2 configured to connect the end of second touch relay wiring 820 and second touch terminal electrode 6*b*2, after formation of a plurality of second contact holes CH2, a second relay electrode of the MIT layer may be formed in second contact hole CH2.

(Other Various Modifications)

As described above, the liquid crystal display device and the like according to the present disclosure have been described based on the first to third exemplary embodiments and the modifications of those exemplary embodiments. However, the present disclosure is not limited to the first to third exemplary embodiments and the modifications of those exemplary embodiments.

For example, in the first to third exemplary embodiments, first interlayer insulating layer 540 and second interlayer insulating layer 550 are constituted only by the inorganic film made of the inorganic materials of first insulating film 121, second insulating film 122, fourth insulating film 124, and fifth insulating film 125. However, the present disclosure is not limited to this. For example, first interlayer insulating layer 540 and second interlayer insulating layer 550 may include third insulating film 123 that is an organic film made of an organic material. Also, first interlayer insulating layer 540 and second interlayer insulating layer 550 may include another insulating film other than first insulating film 121 to fifth insulating film 125. In the first to third exemplary embodiments, third insulating film 123 is formed up to the seal part where sealing member 310 is provided, and has not been formed in frame region 1*b*.

In the first to third exemplary embodiments, data line 50 and drain electrode 10D of transistor 10 are connected, and pixel electrode 20 and source electrode 10S of transistor 10 are connected, but the present disclosure is not limited to this. For example, data line 50 and source electrode 10S of transistor 10 may be connected, and pixel electrode 20 and drain electrode 10D of transistor 10 may be connected.

In the first to third exemplary embodiments, gate line 40 is extended in the row direction and data line 50 and touch line 60 are extended in the column direction, but the present disclosure is not limited to this. Gate line 40 may extend in the column direction, and data line 50 and touch line 60 may extend in the row direction. In other words, the first direction may be the column direction and the direction orthogonal to the first direction may be the row direction. In this case, the three types of pixels of red pixel PXR, green pixel PXG, and blue pixel PXB only need to be periodically arranged in the column direction in a predetermined arrangement.

The liquid crystal display device in each of the first to third exemplary embodiments is the in-cell touch panel having both a touch function and a display function. However, the present disclosure is not limited to this, and the in-cell touch panel may have only the display function out of the touch function and the display function. In this case, the liquid crystal display device having no touch function does not have touch line 60, and touch line 60 can be used as a common line. In this case, common electrode 30 may be a single solid electrode formed all over image display region 1*a* without being divided into a plurality of sections.

In the first to third exemplary embodiments, the dual-gate structure is formed where two gate lines 40 are provided for each boundary between two pixels PX adjacent in the column direction, but the present disclosure is not limited to this. For example, a single-gate structure may be formed where one gate line 40 is provided for each boundary between two pixels PX adjacent in the column direction.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. An active matrix substrate having an image display region made up of pixels, and a frame region surrounding the image display region, the active matrix substrate comprising:
pixel electrodes respectively provided in the pixels;
a common electrode facing one or more of the pixel electrodes;
a signal line provided in the image display region; and
a terminal provided in the frame region and electrically connected to the signal line,
wherein the terminal includes:
a metal layer,
a first contact layer located closer to one side in a lamination direction than the metal layer, and electrically connected to the metal layer,
a first interlayer insulating layer located closer to the one side in the lamination direction than the first contact layer,
a second contact layer located closer to the one side in the lamination direction than the first interlayer insulating layer, and electrically connected to the first contact layer through a first through-hole formed in the first interlayer insulating layer, and
a second interlayer insulating layer located between the metal layer and the first contact layer,
wherein further
the first contact layer is made of a transparent metal oxide or a semiconductor material doped with impurities,
the first contact layer is electrically connected to the metal layer through a second through-hole formed in the second interlayer insulating layer, and
in a top view of the active matrix substrate, the first through-hole and the second through-hole do not overlap with each other.

2. The active matrix substrate according to claim 1, wherein the first contact layer is in contact with the metal layer at least in the second through-hole.

3. The active matrix substrate according to claim 1, wherein the terminal further includes a second metal layer located between the first contact layer and the second contact layer, and wherein further
the second metal layer is in contact with the second contact layer at least in the first through-hole, and
the second metal layer is in contact with the first contact layer at least in the second through-hole.

4. The active matrix substrate according to claim 1, wherein
the first interlayer insulating layer is made up of a plurality of laminated insulating films, and
the second interlayer insulating layer is made up of a plurality of laminated insulating films.

5. The active matrix substrate according to claim 1, wherein
the first contact layer is formed in the same layer as the common electrode,
the second contact layer is formed in the same layer as the pixel electrode, and
the metal layer is formed in the same layer as the signal line.

6. The active matrix substrate according to claim 1, further comprising transistors respectively provided in the pixels,
wherein the metal layer is formed in the same layer as a source electrode and a drain electrode of the transistor.

7. The active matrix substrate according to claim 1, wherein
the active matrix substrate has a data line as one of the signal lines, and
the terminal is a source terminal.

8. The active matrix substrate according to claim 1, wherein
the active matrix substrate has a gate line as one of the signal lines, and
the terminal is a gate terminal.

9. The active matrix substrate according to claim 1, wherein
a plurality of the common electrodes are provided,
the plurality of the common electrodes respectively face one or more of the pixel electrodes,
the active matrix substrate has, as the signal line, a touch line connected to a corresponding one of the plurality of the common electrodes, and
the terminal is a touch terminal for supplying a signal to the touch line.

10. The active matrix substrate according to claim 3, wherein
a plurality of the common electrodes respectively face one or more of the pixel electrodes,
the active matrix substrate has, as the signal line, a touch line connected to a corresponding one of the plurality of the common electrodes, and
the second metal layer is formed in the same layer as the touch line.

11. The active matrix substrate according to claim 3, wherein
the common electrode is formed across the plurality of pixels,
the active matrix substrate further comprises a common line that is provided above the common electrode and to which a common potential is applied,
the first contact layer is formed in the same layer as the common electrode, and
the second metal layer is formed in the same layer as the common line.

12. A liquid crystal display device comprising the active matrix substrate according to claim 1.

13. The liquid crystal display device according to claim 12, wherein
the liquid crystal display device is an in-cell touch panel in which the pixels are arranged in a first direction and a second direction orthogonal to the first direction, the liquid crystal display device comprising:
transistors and pixel electrodes respectively provided in the pixels;
gate lines, data lines, and touch lines provided as the signal line; and
a terminal portion provided in the frame region,
the common electrodes are arranged in the first direction and the second direction, respectively face one or more of the pixel electrodes, and are provided separately from each other,
the gate lines extend along the first direction and supply gate signals to the transistors respectively,
the data lines extend along the second direction and supply data signals to the transistors respectively,
the touch lines extend along the second direction and are each connected to a corresponding one of the common electrodes,
the terminal portion includes, as the terminal, touch terminal electrodes electrically connected to the touch lines respectively, the touch lines include a first touch line and a second touch line, the touch terminal electrodes include a first touch terminal electrode electrically connected to the first touch line via a first touch relay wiring, and a second touch terminal electrode electrically connected to the second touch line via a second touch relay wiring, the first touch relay wiring includes a first relay wiring portion formed in a different layer from the first touch line and the first touch terminal electrode, and the second touch relay wiring includes a first relay wiring portion formed in a different layer from the second touch line and the second touch terminal electrode and formed in a different layer from the first relay wiring portion of the first touch relay wiring.

14. The liquid crystal display device according to claim 13, wherein the first relay wiring portion of the first touch relay wiring is formed in the same layer as the gate lines, and the first relay wiring portion of the second touch relay wiring is formed in the same layer as the data lines.

15. The liquid crystal display device according to claim 14, wherein the first touch relay wiring includes a second relay wiring portion provided in a wiring path between the first touch line and the first relay wiring portion of the first touch relay wiring, the second touch relay wiring includes a second relay wiring portion provided in a wiring path between the second touch line and the first relay wiring portion of the second touch relay wiring, the second relay wiring portion of the first touch relay wiring and the second relay wiring portion of the second touch relay wiring are formed in the same layer as the pixel electrodes, the first touch relay wiring includes a third relay wiring portion provided in a wiring path between the second relay wiring portion and the first relay wiring portion of the first touch relay wiring, and a fourth relay wiring portion provided in a wiring path between the first relay wiring portion of the first touch relay wiring and the first touch terminal electrode, and the third relay wiring portion and the fourth relay wiring portion are formed in the same layer as the data lines.

16. An active matrix substrate having an image display region made up of pixels, and a frame region surrounding the image display region, the active matrix substrate comprising:

pixel electrodes respectively provided in the pixels;

a common electrode facing one or more of the pixel electrodes;

a signal line provided in the image display region; and a terminal provided in the frame region and electrically connected to the signal line, wherein the terminal includes:

a metal layer, a first contact layer located closer to one side in a lamination direction than the metal layer, and electrically connected to the metal layer, a first interlayer insulating layer located closer to the one side in the lamination direction than the first contact layer, a second contact layer located closer to the one side in the lamination direction than the first interlayer insulating layer, and electrically connected to the first contact layer through a first through-hole formed in the first interlayer insulating layer, a second interlayer insulating layer located between the metal layer and the first contact layer, and a second metal layer located between the first contact layer and the second contact layer, the first contact layer is electrically connected to the metal layer through a second through-hole formed in the second interlayer insulating layer, the first contact layer is made of a transparent metal oxide or a semiconductor material doped with impurities, the second metal layer is in contact with the second contact layer at least in the first through-hole, and the second metal layer is in contact with the first contact layer at least in the second through-hole.

17. The active matrix substrate according to claim 16, wherein the common electrode is formed across the plurality of pixels, the active matrix substrate further comprises a common line that is provided above the common electrode and to which a common potential is applied, the first contact layer is formed in the same layer as the common electrode, and the second metal layer is formed in the same layer as the common line.

* * * * *